United States Patent [19]
Endo

[11] Patent Number: 5,828,101
[45] Date of Patent: Oct. 27, 1998

[54] THREE-TERMINAL SEMICONDUCTOR DEVICE AND RELATED SEMICONDUCTOR DEVICES

[75] Inventor: Koichi Endo, Tokyo, Japan

[73] Assignee: Kabushiki Kaisha Toshiba, Kawasaki, Japan

[21] Appl. No.: 622,287

[22] Filed: Mar. 25, 1996

[30] Foreign Application Priority Data

Mar. 30, 1995 [JP] Japan ................................. 7-073354

[51] Int. Cl.$^6$ .................... H01L 29/792; H01L 29/94
[52] U.S. Cl. .................... 257/330; 257/332; 257/333; 257/334
[58] Field of Search ................... 257/330, 331, 257/332, 333, 334, 335

[56] References Cited

U.S. PATENT DOCUMENTS

| | | |
|---|---|---|
| 4,393,391 | 7/1983 | Blanchard . |
| 4,796,070 | 1/1989 | Black . |
| 4,910,564 | 3/1990 | Inoue . |
| 4,996,574 | 2/1991 | Shirasaki . |
| 5,016,067 | 5/1991 | Mori ........................................ 257/330 |
| 5,640,034 | 6/1997 | Malhi ..................................... 257/341 |

FOREIGN PATENT DOCUMENTS

| | | |
|---|---|---|
| 2 561 822 | 10/1985 | France . |
| 2 646 963 | 11/1990 | France . |
| 33 45 189 | 6/1984 | Germany . |
| 2 222 306 | 2/1990 | United Kingdom . |

OTHER PUBLICATIONS

Patent Abstracts of Japan, vol. 015, No. 367, (E–1112), Sep. 17, 1991, JP 03 145165, Jun. 20, 1991.
Patent Abstracts of Japan, vol. 010, No. 125, (E–402), May 10, 1986, JP 60 257577, Dec. 19, 1985.
Patent Abstracts of Japan, vol. 013, No. 453, (E–831), Oct. 11, 1989, JP 01 175267, Jul. 11, 1989.
Patent Abstracts of Japan, vol. 014, No. 496, (E–0996), Oct. 29, 1990, JP 02 206173, Aug. 15, 1990.
Patent Abstracts of Japan, vol. 010, No. 376, (E–464), Dec. 13, 1986, JP 61 168968, Jul. 30, 1986.
Patent Abstracts of Japan, vol. 017, No. 583, (E–1452), Oct. 22, 1993, JP 05 175498, Jul. 13, 1993.
Patent Abstracts of Japan, vol. 013, No. 002, (E–700), Jan. 6, 1989, JP 63 215073, Sep. 7, 1988.
Patent Abstracts of Japan, vol. 013, No. 321, (E–790), Jul. 20, 1989, JP 01 089366, Apr. 3, 1989.
Extended Abstracts of the 20$^{th}$ (1988 International) Conference on Solid State Devices and Materials, pp. 33–36, Aug. 24–26, 1988, Akio Nakagawa, et al., "500V Lateral Double Gate Bipolar–Mode MOSFET(DGIGBT) Dielectrically Isolated by Silicon Wafer Direct–Bonding(DISDB)".
IEEE Transactions on Electron Devices, vol. 38, NR 7, pp. 1650–1654, Jul. 1, 1991, Akio Nakagawa, et al., "Breakdown Voltage Enhancement for Devices on Thin Silicon Layer/Silicon Dioxide Film".

*Primary Examiner*—Carl W. Whitehead
*Attorney, Agent, or Firm*—Oblon, Spivak, McClelland, Maier & Neustadt, P.C.

[57] ABSTRACT

A semiconductor device has trenches formed on the surface of a semiconductor. The device passes a main current through a channel formed between the trenches and controls the main current with the use of gate electrodes buried in the trenches. The main current directly controlled by the gate electrodes flows in parallel with the surface of the semiconductor and is distributed vertically to the surface of the semiconductor. The width W of the channel is freely increased without regard to the surface area of the semiconductor.

169 Claims, 64 Drawing Sheets

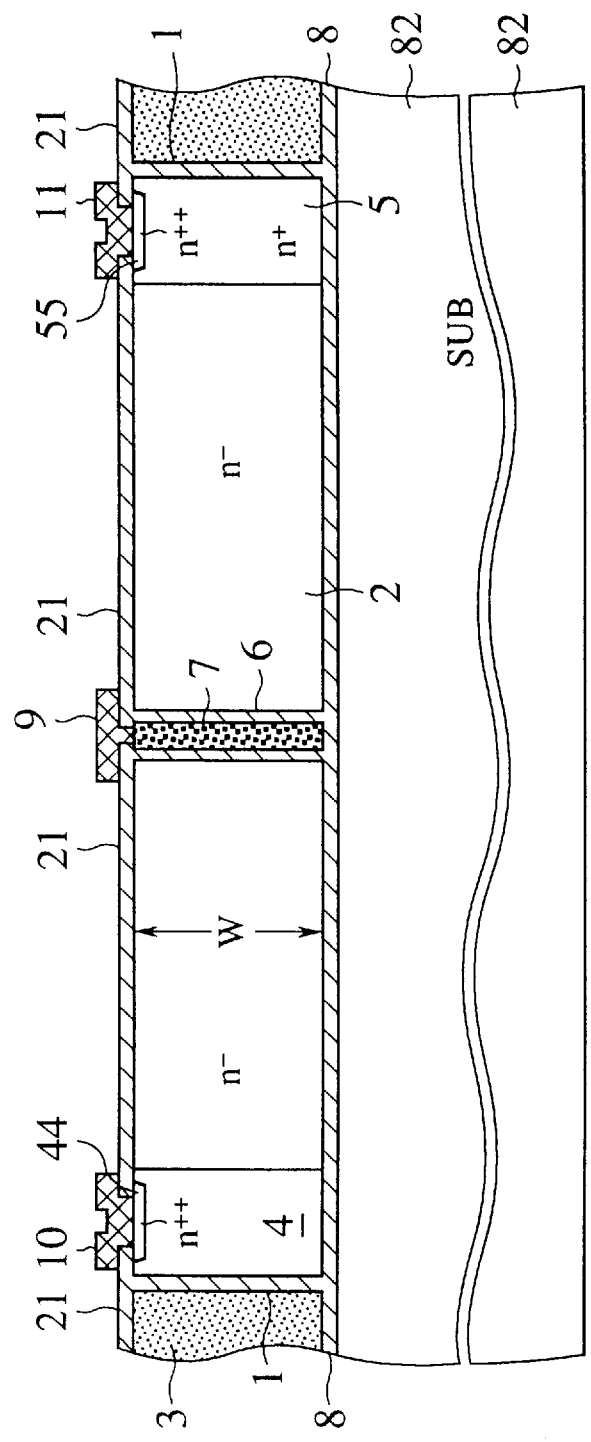

$S = 2S_s$ $S < 2S_s$ $S > 2S_s$

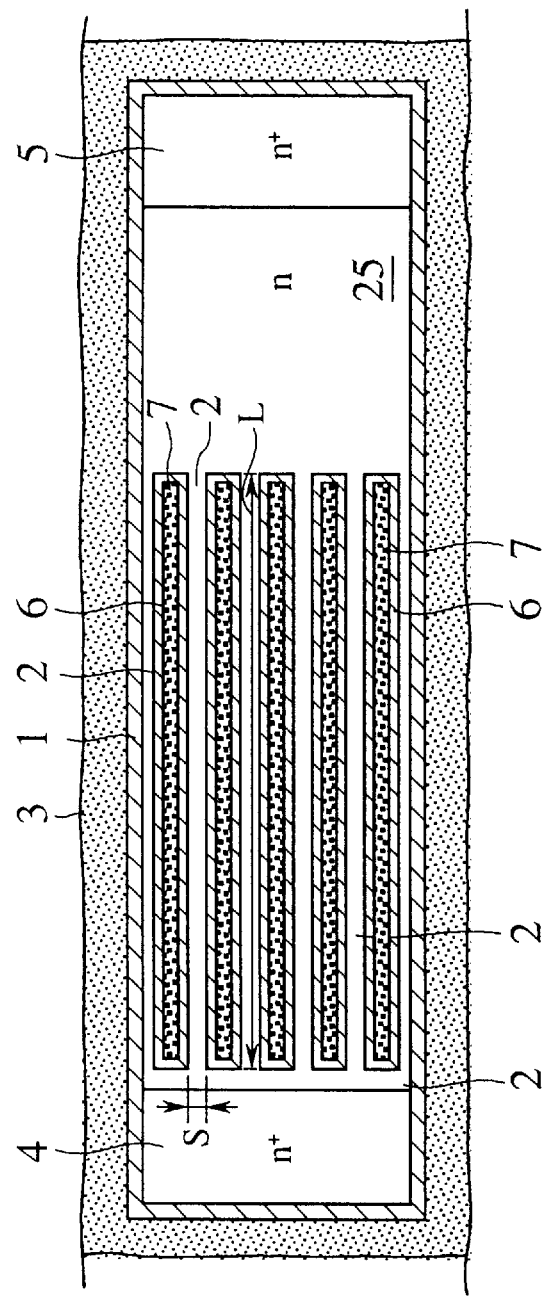

THREE-TERMINAL SEMICONDUCTOR DEVICE AND RELATED SEMICONDUCTOR DEVICES

BACKGROUND OF THE INVENTION

1. Field of the Invention

The present invention relates to semiconductor devices such as insulated-gate transistors that control a main current by capacitive coupling caused by a gate voltage, and particularly, to insulated-gate power devices and monolithic power ICs having insulated-gate structures.

2. Description of the Prior Art

Active semiconductor devices include bipolar junction transistors (BJTs), junction field-effect transistors (JFETs), static induction transistors (SITs), MOS field-effect transistors (MOSFETs), insulated-gate bipolar transistors (IGBTs), and single gate static induction thyristors (SGSITHs). Any one of them is a 3-terminal device having two main terminals (an emitter and a collector, or a source and a drain, or a cathode and an anode) and a control terminal (a base, or a gate). The bipolar devices have pn junctions between the main terminals. The pn junctions form potential barriers over which two types of carriers flow to pass a current. The FETs are a unipolar device that employs a semiconductor of one conductivity type between the main terminals, so that there is no pn junctions in a main channel that passes one type of carriers. Recent requirements for low power dissipation have developed voltage-controlled bipolar power devices such as insulated-gate bipolar transistors (IGBTs), MOS-controlled thyristors (MCTs), MOS-assisted gate-triggered thyristors (MAGTs), and emitter-switched thyristors (ESTs). These MOS composite semiconductor devices are voltage-driven power devices that handle a large current and are rapidly being developed in power industry because they are easy to use. The power devices must operate at high speed, handle large power, and involve low on-resistance. It is important to decrease the on-resistance of a device, to reduce the power dissipation of the device and improve the efficiency thereof.

The conventional unipolar semiconductor devices such as FETs and SITs employ a single type of carriers and involve high on-resistance because the conductivity thereof is restricted by resistance determined by the concentration of carriers in a semiconductor layer. FIG. 1 shows a JFET as an example of the unipolar semiconductor devices. The JFET has an n-type layer 2 that forms a channel. To reduce the resistance of the layer 2, the layer 2 must contain a high concentration of impurities as a body material. FIG. 2 shows a MOSFET as another example of the unipolar semiconductor devices. The MOSFET forms an inversion layer (or channel) to pass carriers. Since the inversion layer is thin, a gate width W must be wide, i.e., a channel area must be large to decrease the on-resistance of the device. It is impossible, however, to limitlessly increase the channel area because the surface area of a chip on which the device is formed is limited. FIG. 3 shows a high-voltage double-diffused MOSFET (DMOS). The device is also difficult to expand its channel area, and in addition, the resistance of an $n^-$-type drift region 22 increases on-resistance. The resistance of the region 22 may decrease if a gate width W is increased.

FIGS. 4 and 5 show an example of the bipolar devices that pass a large current. The bipolar device has pn junctions that form potential barriers. Minority carriers are injected over one of the potential barriers into a region. If the concentration of the minority carriers is equal to or greater than the concentration of majority carriers in the region, a conductivity modulation effect works to decrease apparent resistance. In the IGBT of FIG. 5, minority carriers are injected from a $p^+$-type collector layer 29 into an $n^-$-type drift region 22. Namely, holes are injected into the region 22, which causes a conductivity modulation. The IGBT has pn junctions in a main channel because the IGBT is a bipolar device. The pn junctions involve built-in potential that causes an offset voltage. On the other hand, the unipolar devices involve no offset voltage because they have no pn junctions in a main channel. The unipolar devices, however, are incapable of increasing a carrier concentration above the impurity concentration of a semiconductor layer that serves as a channel region. FIG. 6 shows a double gate static induction thyristor (DGSITH). This device provides the conductivity modulation effect due to the injected holes from $p^+$ anode 95, but has a pn junction only at $p^+$ anode 95. When the device is turned off, electrons accumulated in front of the $p^+$ anode 95 are drawn through an $n^-$-type second gate 93 (G2), to cause no tail current and realize high-speed switching. Since the number of pn junctions in a main channel of the DGSITH is smaller than that of the IGBT, the DGSITH involves a smaller offset voltage. A 1800-V, 100-A DGSITH provides a forward voltage drop of 1.2 V. The DGSITH of FIG. 6 has a first gate 91 (G1) and the second gate 93 (G2), and therefore, must have a complicated gate drive circuit and complicated manufacturing processes involving a mask aligning process of both surfaces. In particular, a hierarchical structure of FIG. 6 vertical to a substrate requires an advanced epitaxial growth technique that increases the cost of the device.

A power device must have low on-resistance. The on-resistance and blocking voltage (or the breakdown voltage) of the power device are trade-offs. If a channel length L of FIG. 2 is shortened, the on-resistance of the device will drop. This, however, decreases the blocking voltage of the device. In the IGBT of FIG. 5, the blocking voltage of the device will increase if the length Ld of the drift region 22 is extended. This, however, increases the on-resistance of the device.

FIG. 7 shows a vertical IGBT according to a prior art. This prior art forms an $n^+$-type buffer layer 229 in front of a $p^+$-type collector layer 29, to achieve a high blocking voltage and low on-resistance. This technique minimizes the thickness of an $n^-$-type drift layer 22 and employs the buffer layer 229 to prevent a punch-through phenomenon between the collector layer 29 and a p-type base layer 23. It is very difficult to design the thickness and impurity concentration of the buffer layer 229. When mass-producing the device, a designed blocking voltage is not easily attained. In this case, the buffer layer 229 must be designed again, and the thickness of a semiconductor substrate must be changed. To realize low on-resistance, the thickness of the drift layer 22 must be 100 $\mu$m to 50 $\mu$m or thinner, and therefore, the layer 22 must epitaxially be grown. In this case, the buffer layer 229 must also epitaxially be grown, and an advanced epitaxial growth technique must be employed to avoid an auto-doping or out-diffusion phenomenon from the buffer layer 229. If the design of the blocking voltage of the device is changed, or if a designed blocking voltage is not attained, the epitaxial growth conditions of the device must be changed, to deteriorate the productivity of the device. The buffer layer 229 and collector layer 29 may be formed by diffusion through the bottom surface of the substrate 22. This, however, is possible only theoretically because the thickness of the substrate 22 must be 50 $\mu$m or thinner to realize low on-resistance. If the substrate 22 is thinned less than 100 μm, the mechanical strength thereof deteriorates, and no semiconductor wafer manufacturer markets such a thin semiconductor substrate. In this way, there is no prior art that realizes a semiconductor device having a high breakdown voltage (or high blocking voltage) and low on-resistance.

SUMMARY OF THE INVENTION

An object of the present invention is to provide a power device or a monolithic power IC that realizes a high breakdown voltage, a large current, and low on-resistance.

Another object of the present invention is to provide a semiconductor device, in particular, a voltage-driven semiconductor device such as an insulated-gate semiconductor device, capable of reducing on-resistance per chip area.

In order to accomplish the objects, the present invention provides a semiconductor device employing a novel design principle. Conventional semiconductor devices are classified into lateral devices shown in FIGS. 2, 3, and 5, and vertical devices shown in FIGS. 6 and 7. The lateral devices pass a main current in parallel with a main surface of a semiconductor substrate as shown in FIGS. 2, 3, and 5. At this time, the main current is localized in thin surface layer in the vicinity of the main surface, and distributed in parallel with the main surface. Here, the main current is a current that flows between a first main electrode (source, emitter, or cathode) region and a second main electrode (drain, collector, or anode) region and is controlled by a voltage applied to a control electrode (gate electrode) or by a current passing through the control electrode (base electrode). The lateral devices distribute the main current in a thin surface layer along the width W of the gate orthogonal to the flowing direction of the main current in parallel with the main surface. On the other hand, the vertical devices pass the main current vertical to the main surface of a substrate as shown in FIGS. 6 and 7. At this time, the vertical devices distribute the main current in parallel with the main surface along the width W of the gate. Some of the vertical devices have a buried collector or drain region and form a collector or drain electrode contact region on the same surface as that of a source region. In this case, part of a current flowing through a channel has a component that is in parallel with the main surface. The main current directly controlled by the control electrode, however, is mostly vertical to the main surface.

An important feature of the present invention is realted to "the direction of the main current directly controlled by the control electrode". Namely, the semiconductor devices according to the present invention have completely different structures from the conventional lateral and vertical semiconductor devices. As shown in, for example, FIGS. 8B, 21B, and 30B, the devices of the present invention pass the main current in parallel with a main surface, and a gate width W (or a channel width W) of the devices is vertical to the main surface, to distributes the main current vertically to the main surface. There are no conventional semiconductor devices that distribute the main current vertically to a main surface. In this regard, the semiconductor structure of the present invention is quite novel and enables the gate width (channel width) W to be freely extended without regard to the surface area of a chip.

Referring to, for example, FIGS. 8B, 21B, 30B, 40B, and 45B, the present invention forms a bottom insulation film 8 on a semiconductor substrate 82, and a first semiconductor layer 2 (22) on the bottom insulation film 8. The first semiconductor layer 2 (22) has a top, a bottom and four side surfaces. The bottom surface contacts to the bottom insulation film 8. Alternatively, the present invention forms the semiconductor layer 2 (22) on a semiconductor substrate 83 of opposite conductivity type as shown in, for example, FIG. 26B. The semiconductor layer 2 (22) serves as a current path for passing a main current in parallel with the surface of the semiconductor layer 2 (22). The semiconductor layer 2 (22) is an island-like part having side-surfaces (side-walls) that are substantially vertical and covered with a device isolating insulation film 1. A second semiconductor region 4 (24, 241, 287) serving as a first main electrode region is formed from the top surface of the semiconductor layer 2 (22) up to the bottom insulation film 8. A third semiconductor region 5 (29, 293) serves as a second main electrode region. Between the second and third semiconductor regions 4 and 5, gate trenches are formed from the top surface of the semiconductor layer 2 (22) to the bottom insulation film 8 or to the substrate 83 of opposite conductivity type. Each of the gate trenches has side-walls that are substantially vertical to the top surface and are covered with a gate insulation film 6. A space defined by the film 6 in each gate trench is filled with a buried gate electrode 7 (37). The first main electrode region 4 is connected to a metal electrode 10 (34, 341) formed on the top surface of the first semiconductor region. The second main electrode region 5 is connected to a metal electrode 11 (39, 342) formed on the top surface of the first semiconductor region.

In this way, the present invention employs a dielectric isolation (DI) substrate, a junction isolation (JI) substrate, or another type of isolation substrate having the first semiconductor layer 2 (22). The gate trenches are formed through the semiconductor layer 2 (22) up to the bottom insulation film 8 or to the substrate 83 of opposite conductivity type. When the device is reverse biased, depletion layers 12 extend from the gate insulation films 6 and get in touch with each other to "pinch-off" the channel, as shown in FIG. 9A. When the device is forward biased, an accumulation layer 13 is formed around each gate insulation film 6, to increase a concentration of carriers and decrease on-resistance, as shown in FIG. 9B. Unlike the conventional planar MOSFETs that employ only the localized thin layer in the vicinity of the top surface of a semiconductor layer (corresponding to the first semiconductor region 2 (22) of the present invention) as a channel, the present invention employs the wide region extending from the top surface to the bottom surface of the first semiconductor region 2 (22) as a channel with the same metal electrode structure as that of the conventional planar MOSFETs. The metal electrodes for the first and second main electrode regions are formed on the top surface of the first semiconductor region 2 (22). The present invention thereby increases an effective channel width $W_{eff}$ of the device. Namely, the present invention enables the channel width W to be greater than a spacing S between the adjacent gate trenches. The effective channel width $W_{eff}$ of the device of the present invention is determined by the number of the gate trenches and the thickness W of the first semiconductor layer 2 (22), so that the effective channel width $W_{eff}$ of the present invention is quite larger than that of the conventional planar MOSFETs. The prior arts employ only a part of an active layer of a semiconductor device as a channel. On the other hand, the present invention employs a large part of the active layer as a channel. The devices of the present invention have the same metal electrode structure as that of the planar MOSFETs. Namely, the metal electrodes on the main electrode regions of the present invention are on a single plane, so that it is easy to separate devices on a chip from one another and lay surface wiring. The present invention is useful to integrate various semiconductor devices on one chip providing, for example, a motor driving "smart power IC".

According to the present invention, the mobility of carriers is high because the carriers travel through the bulk of the first semiconductor region 2 (22), to easily increase a transconductance ($g_m$). Unlike the vertical devices, carriers in the device of the present invention travel in parallel with a substrate. Accordingly, it is easy to crystallographically select a direction in which the mobility $\mu_{FE}$ or carrier velocity is maximized as shown in FIG. 57, to thereby improve an operation speed.

The present invention easily fabricates a complicated structure such as a double gate structure (double gate IGBT or DGSITH) that is difficult to fabricate on the basis of the conventional vertical structure. The geometry of the present invention makes it easy to form a localized semiconductor region in the middle point between the first and second main electrode regions, which is very difficult to be formed in the conventional vertical structure.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIGS. 8A and 8B are plan and sectional views showing an IGT according to a first embodiment of the present invention;

FIG. 19 is a plan view showing an IGT according to a third modification of the first embodiment;

FIGS. 21A to 21C are plan, sectional, and perspective views showing an IGT according to a second embodiment of the present invention;

DETAILED DESCRIPTION OF THE EMBODIMENTS

Figure 1:
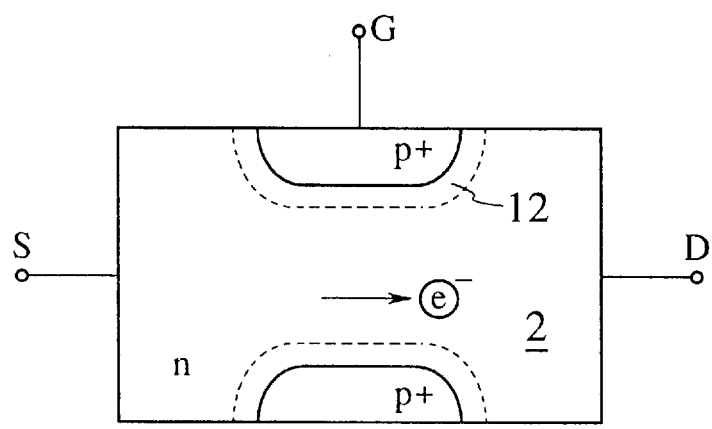
FIG. 1 shows a junction FET according to a prior art.
Figure 2:
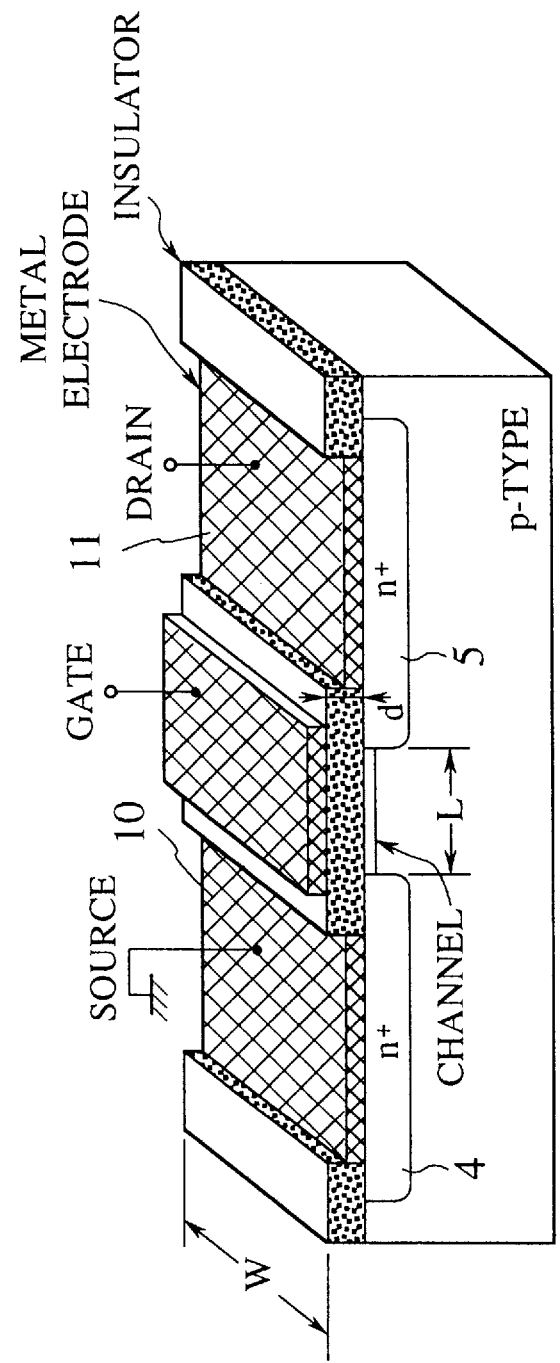
FIG. 2 shows a MOSFET according to a prior art.
Figure 3:
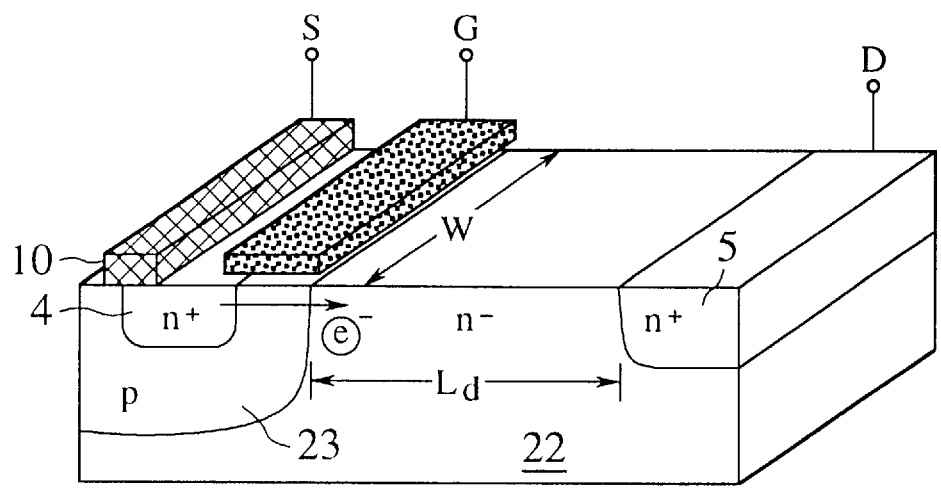
FIG. 3 shows a lateral DMOS according to a prior art.
Figure 4:
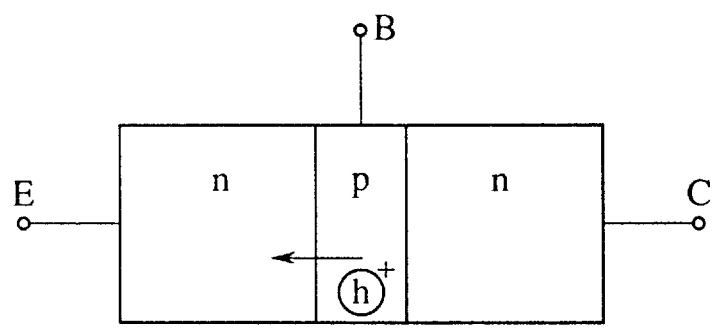
FIG. 4 shows a bipolar transistor according to a prior art.
Figure 5:
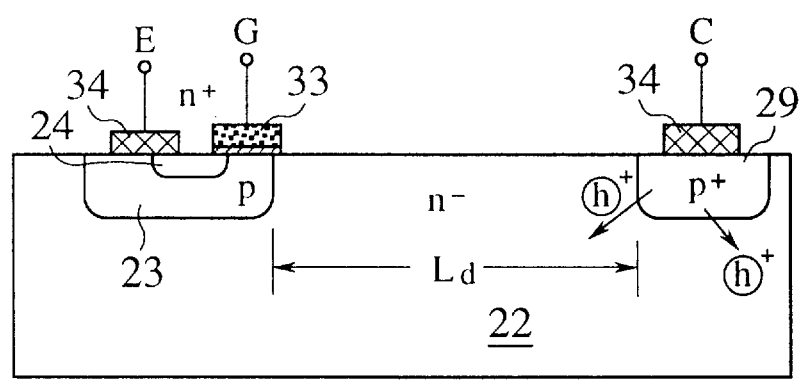
FIG. 5 shows a lateral IGBT according to a prior art.
Figure 6:
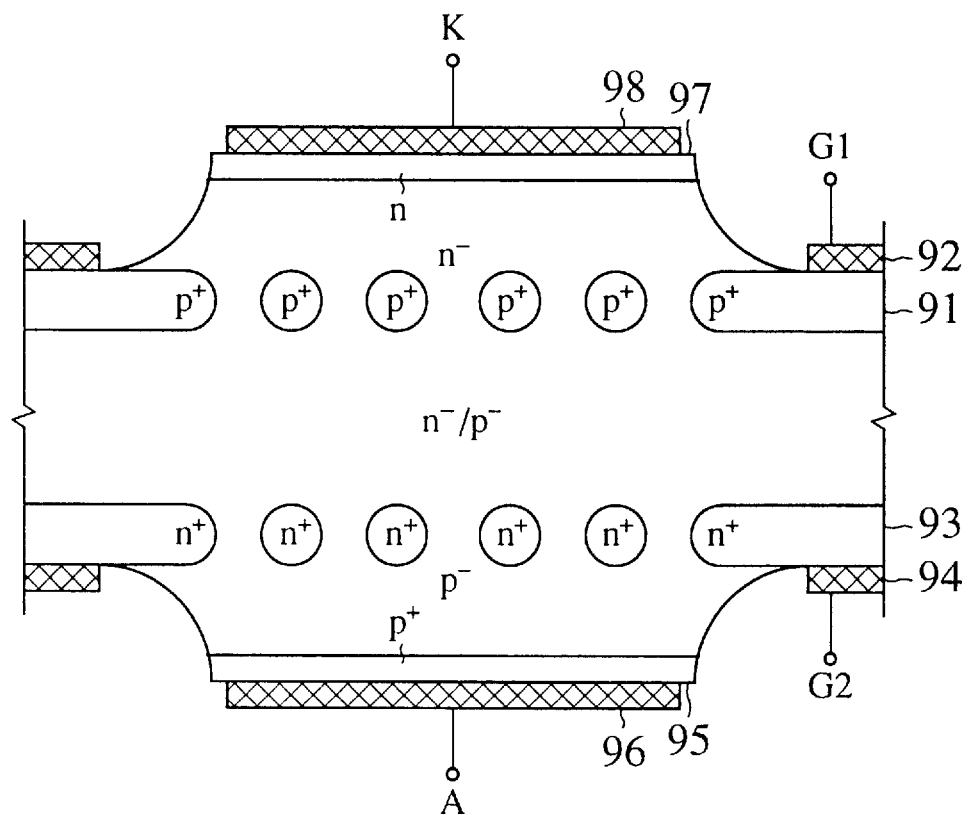
FIG. 6 shows a double gate SITH (DGSITH) according to a prior art.
Figure 7:
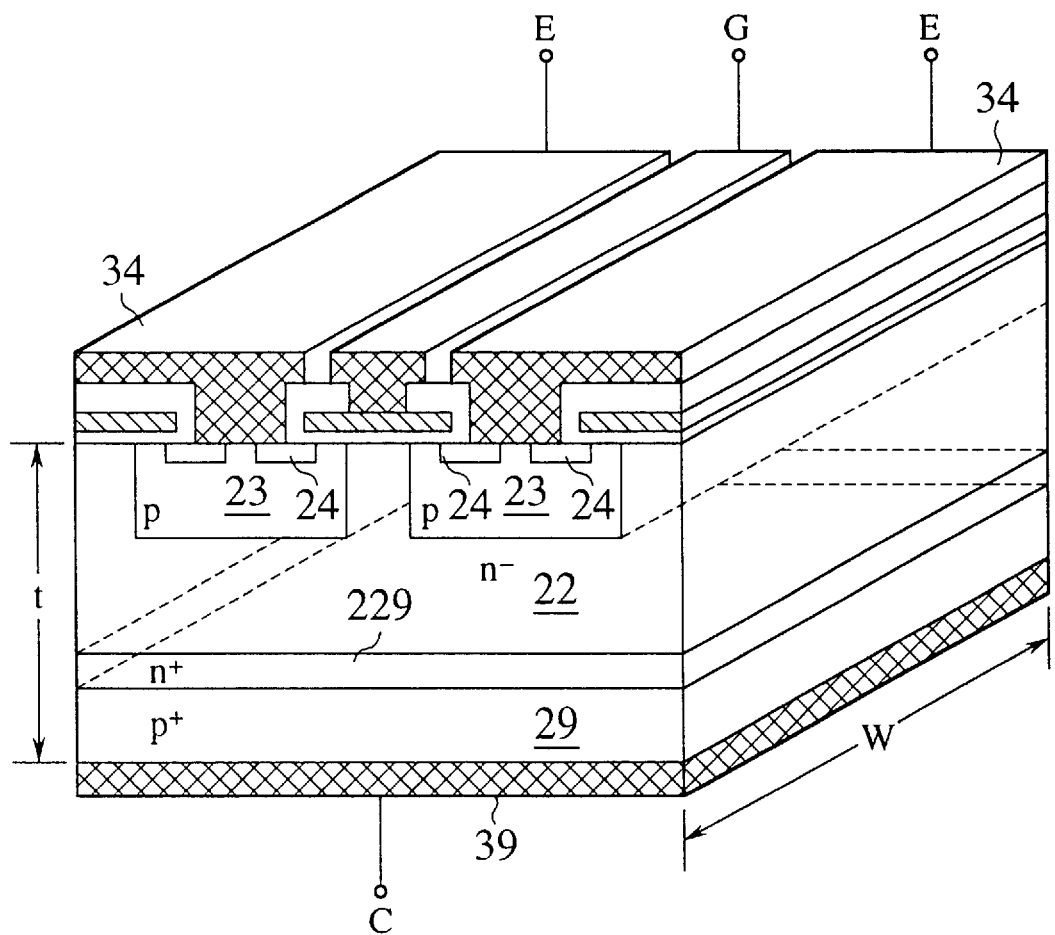
FIG. 7 shows a vertical IGBT according to a prior art.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings.

(First embodiment)

Figure 8A:
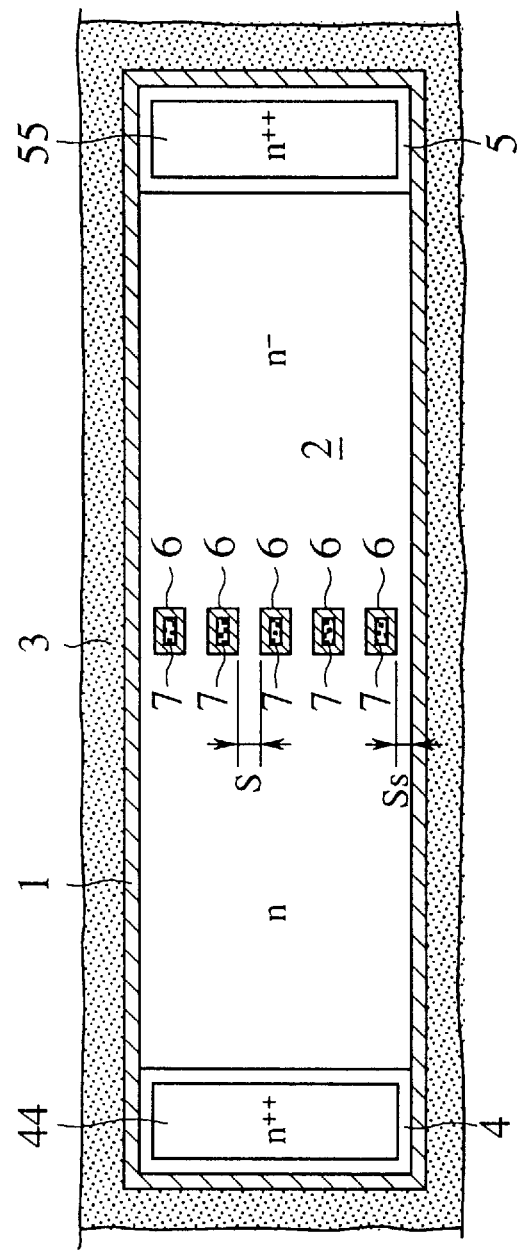
Figure 9A:
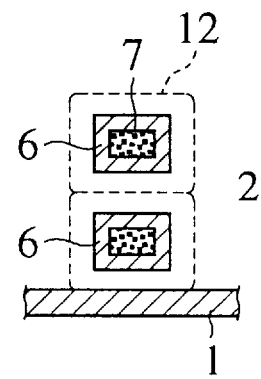
FIGS. 9A and 9B explain the operation of the IGT of the first embodiment.
Figure 9B:
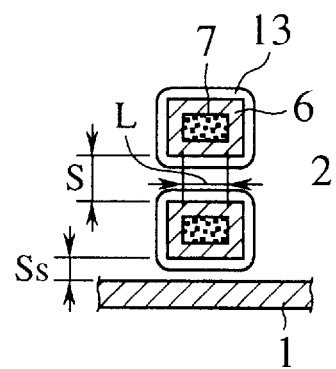

FIG. 8A is a plan view showing an insulated-gate transistor (IGT) formed on an SOI substrate according to the first embodiment of the present invention, and FIG. 8B is a sectional view showing the same. FIGS. 9A and 9B show the region in the vicinity of gates of the IGT and explain the operation of the IGT. A device isolating insulation film 1 and an isolation filler 3 isolate an n-type semiconductor layer (a first semiconductor region) 2 from adjacent devices. At opposite ends of the semiconductor layer 2, an $n^+$-type source diffusion layer (a second semiconductor region) 4 and an $n^+$-type drain diffusion layer (a third semiconductor region) 5 are formed. The impurity concentration of the diffusion layers 4 and 5 is about $1\times10^{18}$ to $1\times10^{21}$ cm$^{-3}$. The regions 4 and 5 reach a bottom insulation film 8. The top of the source 4 has a metal source electrode 10, and the top of the drain 5 has a metal drain electrode 11. Five gate trenches are formed at the middle point between the source and drain diffusion layers 4, 5 in the semiconductor layer 2.

The first embodiment employs the SOI substrate having the bottom insulation film 8 such as an oxide ($SiO_2$) film on which the n-type semiconductor layer 2 serving current paths, or channels is formed. The SOI substrate is formed according to, for example, a silicon direct bonding (SDB) technique. The semiconductor layer 2 is surrounded by a U-shaped device isolating trench. The side-walls of the trench are covered with the device isolating insulation films 1. A space defined by the insulation film 1 in the trench is filled with the isolation filler 3 to form a dielectric isolation (DI) structure. FIG. 8A shows only one side-wall of the trench. The gate trenches formed at the center of the semiconductor layer 2 reach the bottom insulation film 8. The side-walls of each gate trench are covered with a gate insulation film such as $SiO_2$ film 6 of 30 to 150 nm thick. A space defined by the film 6 in the gate trench is filled with a buried gate electrode 7 made of, for example, doped polysilicon (DOPOS). The gate electrode 7 may be made of refractory metal such as W (tungsten), silicide thereof such as $WSi_2$, $MoSi_2$, $TiSi_2$, and $CoSi_2$, or polycide thereof.

Adjacent gate insulation films 6 are spaced from each other by a spacing S, and an outermost gate insulation film 6 and the device isolation film 1 are spaced from each other by a spacing Ss. The spacing S and Ss are designed to pinch-off channels by gate depletion layers formed in the semiconductor layer 2. To pinch-off the channels without an applied gate voltage, S=1.6 μm and Ss=0.8 μm or shorter when the impurity concentration $N_D$ of the semiconductor layer 2 is about $1\times10^{15}$ cm$^{-3}$. If $N_D=1\times10^{14}$ cm$^{-3}$, S=4.5 μm or shorter, and if $N_D=1\times10^{13}$ cm$^{-3}$, S=12 μm or shorter. With these values of $N_D$ and S, a depletion layer 12 extends to pinch off each channel formed in the semiconductor layer 2 as shown in FIG. 9A. These values may be changed according to the type and thickness of the gate insulation film 6 and an interface level between the film 6 and the semiconductor layer 2. Here, Ss must be smaller than S/2, and Ss may be 0. When Ss=0, the outermost gate oxide film 6 is in contact with the device isolation film 1. When a metal gate electrode 9 formed on the buried gate electrodes 7 is negatively (reverse) biased, the depletion layers 12 penetrate from each gate insulation film 6 into the semiconductor layer 2 as shown in FIG. 9A, to disconnect the source 4 from the drain 5 and thereby turn off the device. When the metal gate electrode 9 is positively (forward) biased, an accumulation layer 13 having low on-resistance is formed around each gate insulation film 6 as shown in FIG. 9B, to pass a current between the source 4 and the drain 5. The device will provide a normally-off operation if $N_D$ and S are designed to pinch-off each channel with a gate voltage of zero and produce the accumulation layer 13 with a forward bias voltage. The device will provide a normally-on operation if ND and S are designed to leave a neutral undepleted region in each channel with a gate voltage of zero and pinch-off each channel with a predetermined gate voltage. In practice, a pinch-off point and the potential at the pinch-off point change depending on a voltage applied to the drain 5. Accordingly, it is necessary to consider two-dimensional potential distribution involving gate and drain voltages. When a gate length L is sufficiently short as shown in FIGS. 9A and 9B, the pinch-off point corresponds to a mathematical "saddle point" that is determined by the gate and drain voltages.

Figure 10A:
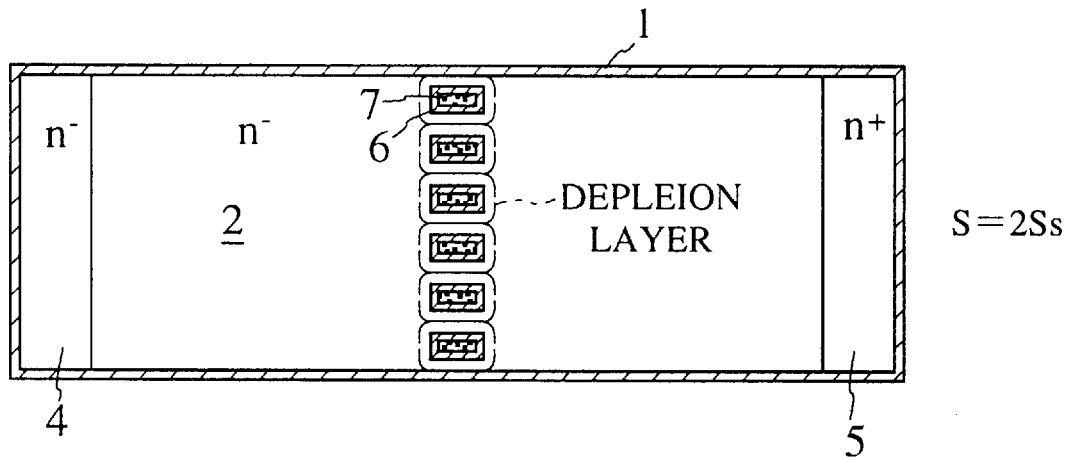
FIGS. 10A to 10C explain a spacing S between adjacent gate trenches and a spacing Ss between an outermost gate trench and a device isolating trench according to the present invention.
Figure 10B:
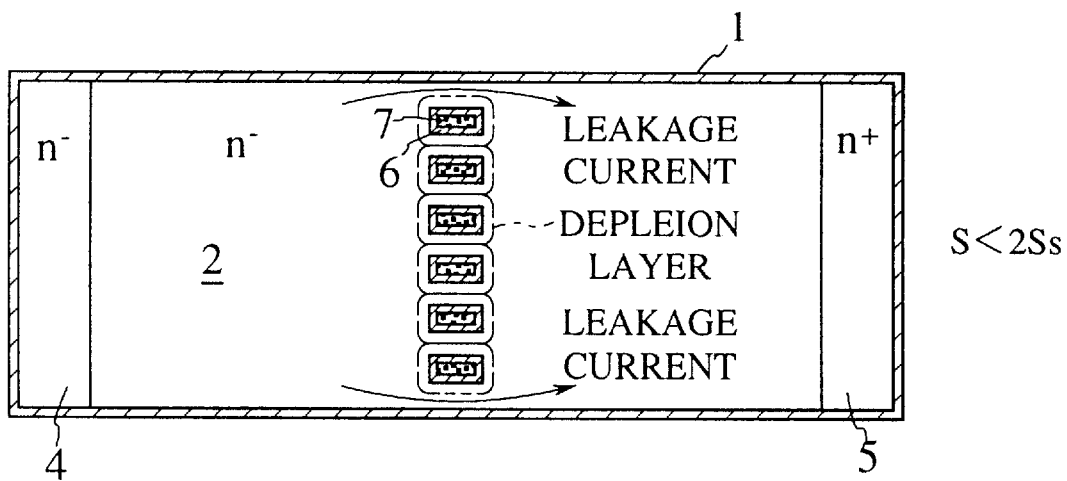
Figure 10C:
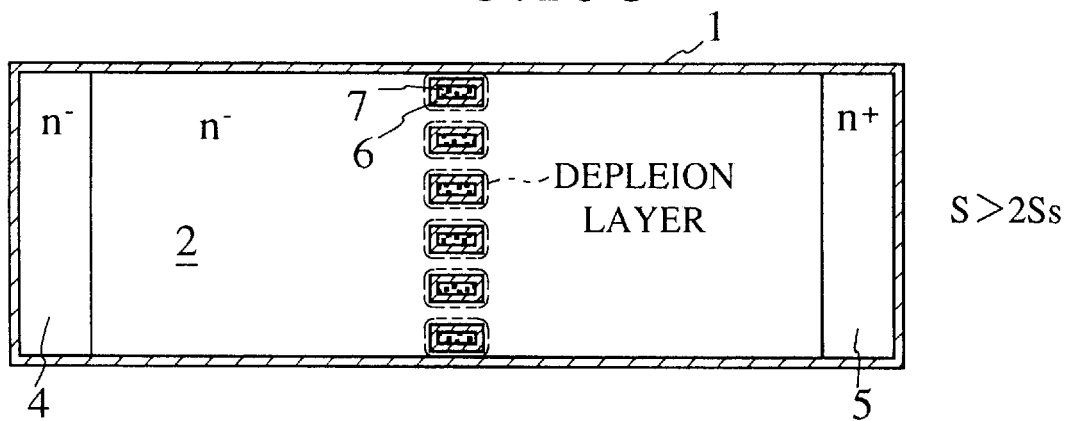
Figure 11:
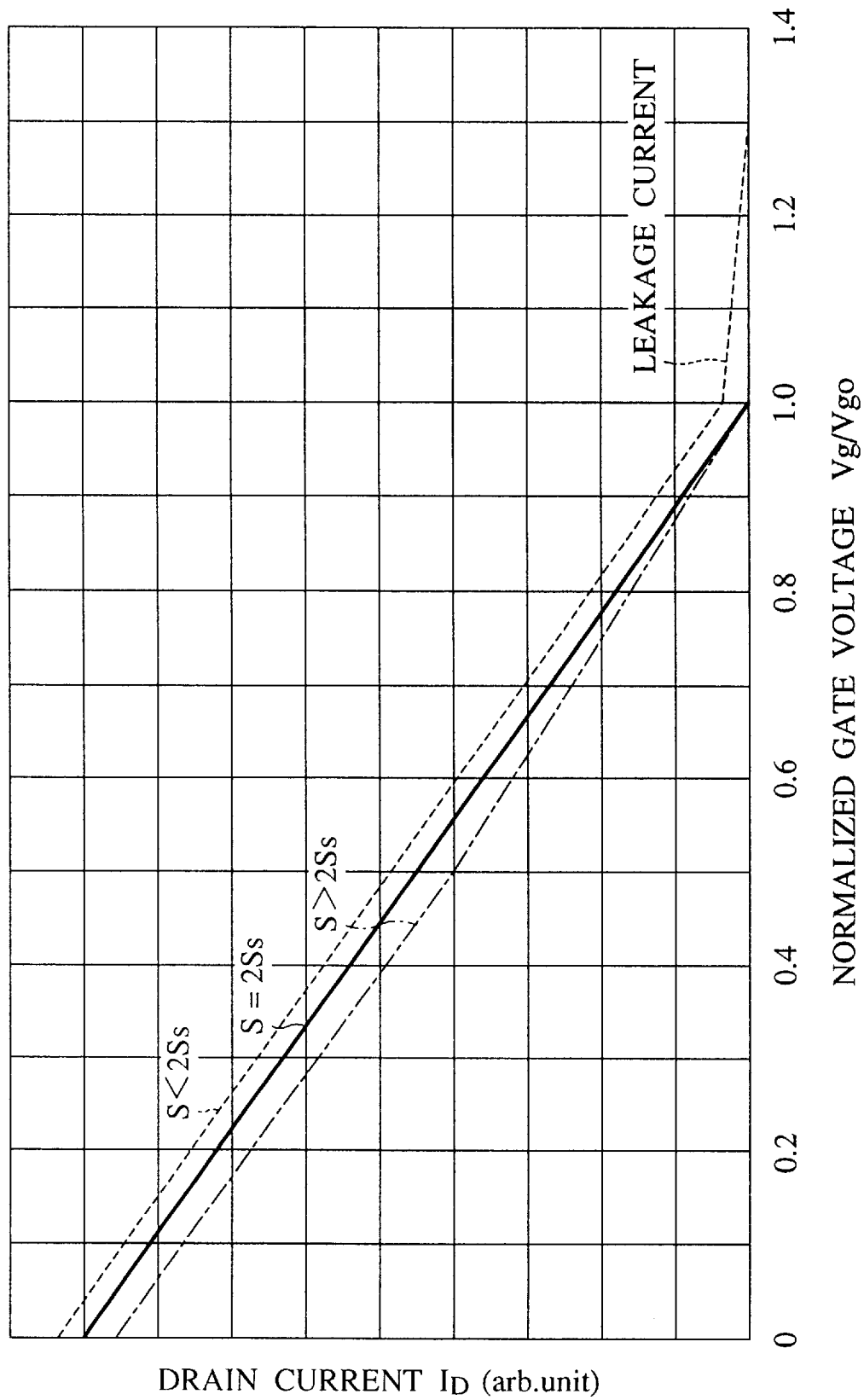
FIG. 11 is a graph showing $I_d$-$V_g$ characteristics depending on the spacing S and Ss.
Figure 12:
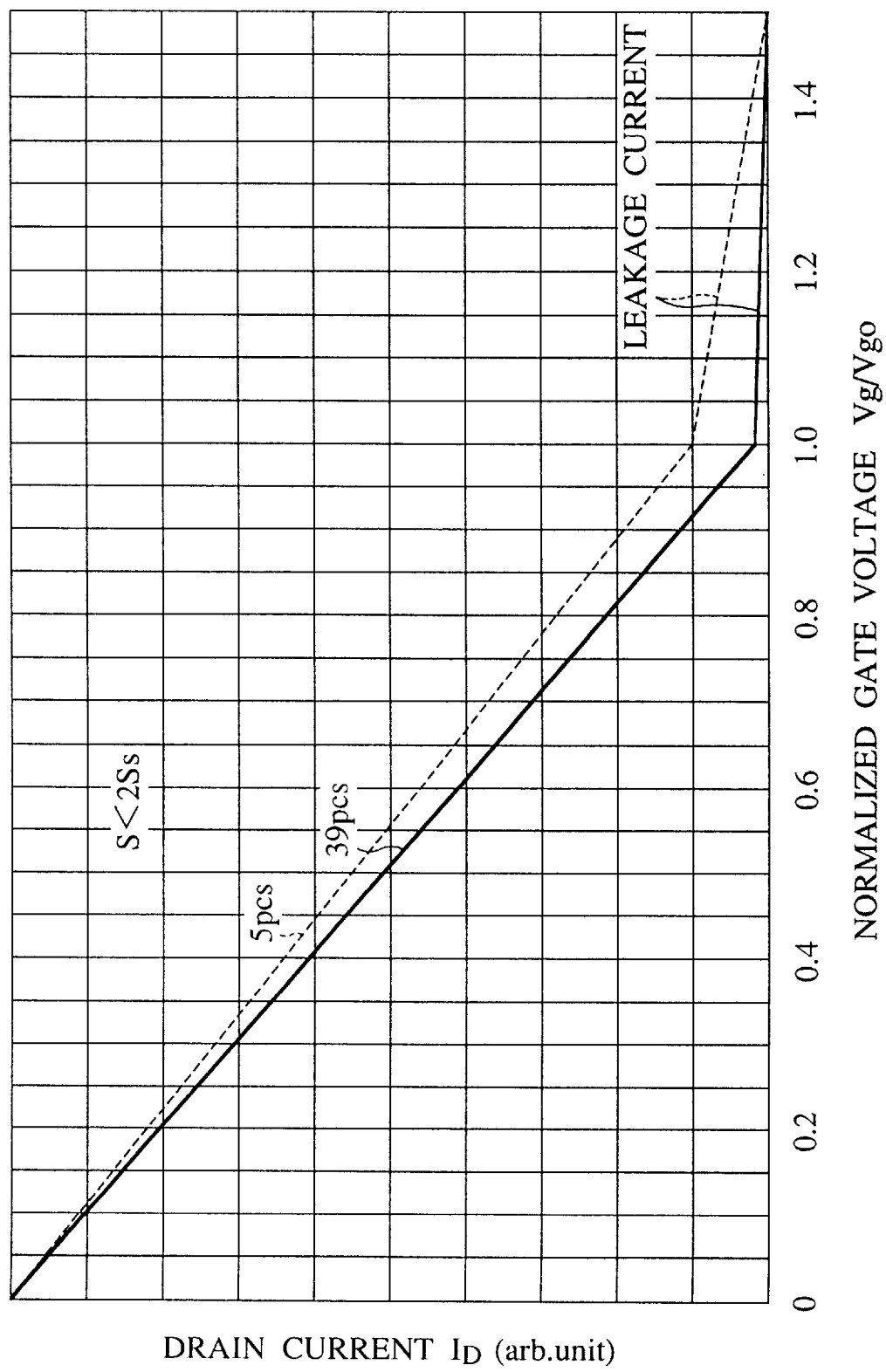
FIG. 12 is a graph showing $I_d$-$V_g$ characteristics with S<Ss.
Figure 13:
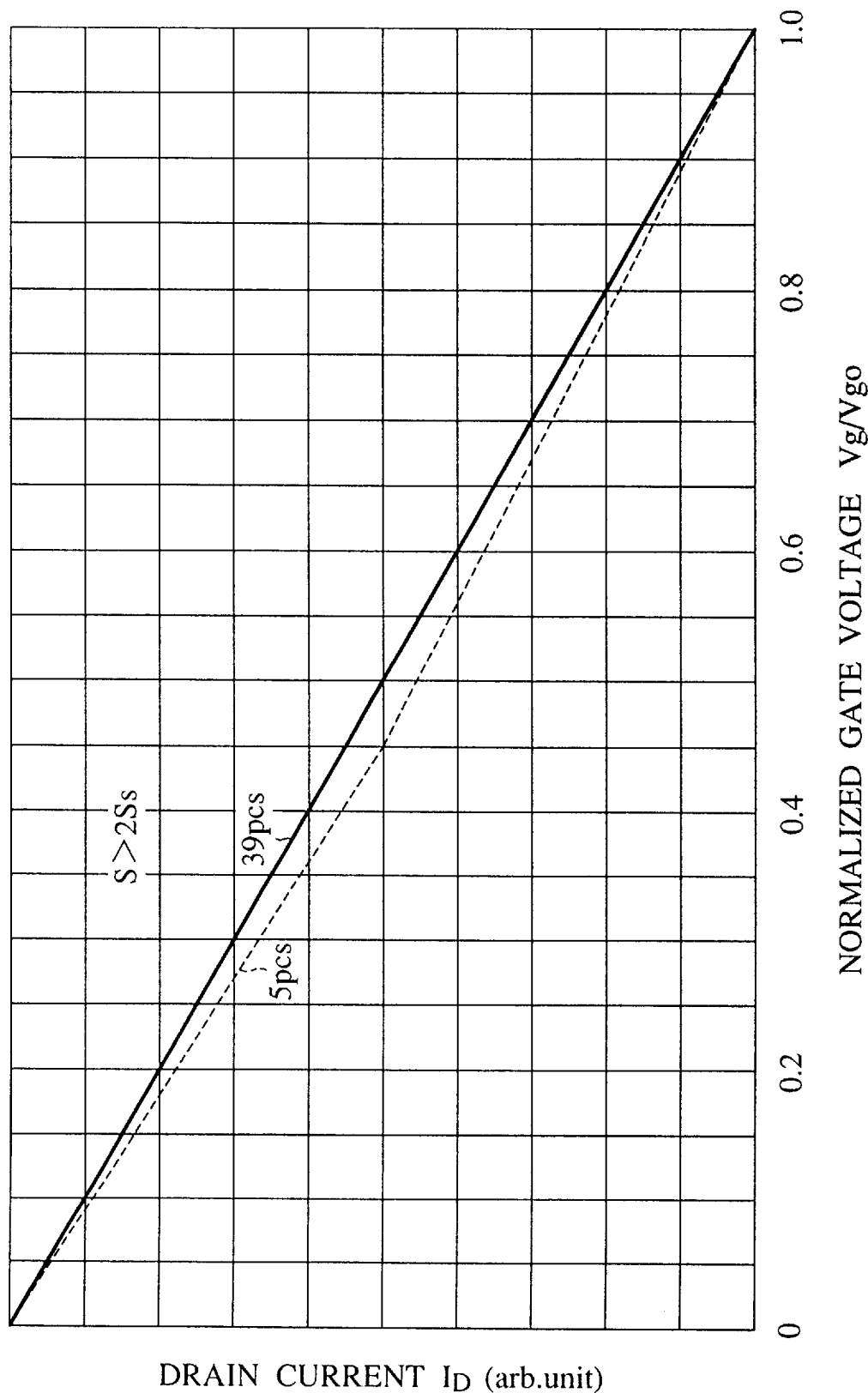
FIG. 13 is a graph showing $I_d$-$V_g$ characteristics with S>Ss.

A relationship between the spacing Ss (between the outermost gate insulation film 6 and the device isolation film 1) and the spacing S (between the adjacent gate insulation films 6) is determined according to application field of the IGT. FIGS. 10A to 10C show depletion layers 12 formed in IGTs with S=2Ss in FIG. 10A, S<2Ss in FIG. 10B, and S>2Ss in FIG. 10C. In FIG. 10B with S<2Ss, outermost channels are not pinched off when intermediate channels are pinched off, to cause a leakage current. In this case, $I_d$-$V_g$ characteristics with a large gate voltage $V_g$ deviate from linear characteristics as shown in FIG. 11. An abscissa of FIG. 11 indicates a gate voltage normalized by a gate voltage $V_{g0}$ at which the intermediate channels are pinched off. If S>2Ss as shown in FIG. 10C, the outermost channels are first pinched off, so that the $I_d$-$V_g$ characteristics deviate from the linear characteristics in a region where $V_g$ is small. When the channels are simultaneously pinched off as shown in FIG. 10A, the $I_d$-$V_g$ characteristics are linear as shown in FIG. 11. The $I_d$-$V_g$ characteristics of FIG. 11 do not take an effect of a drain voltage into consideration. The drain voltage reduces the barrier height and produces a current even if $V_g$=$V_{g0}$. According to a two-dimensional potential analysis that considers the drain voltage, there is a region in which the $I_d$-$V_g$ characteristics follow an exponential law. The barrier height depends both on the gate and drain voltages. The decreased barrier height induces the injection of electrons over the potential barrier, which is similar to that in the emitter-base junction of a bipolar transistor. For the sake of simplicity, the following explanation is based on one-dimensional potential. The effect of the outermost channels will be relatively small if the number of channels is large. FIG. 12 shows $I_d$-$V_g$ characteristics of an IGT having five gate trenches, i.e., six channels and an IGT having 39 gate trenches, i.e., 40 channels both with S<Ss, and FIG. 13 shows $I_d$-$V_g$ characteristics of the same IGTs but with S>Ss. In each figure, the effect of the outermost channels of the 39-trench IGT indicated with a solid lines is smaller than that of the 5-trench IGT indicated with a dotted line.

Figure 14A:
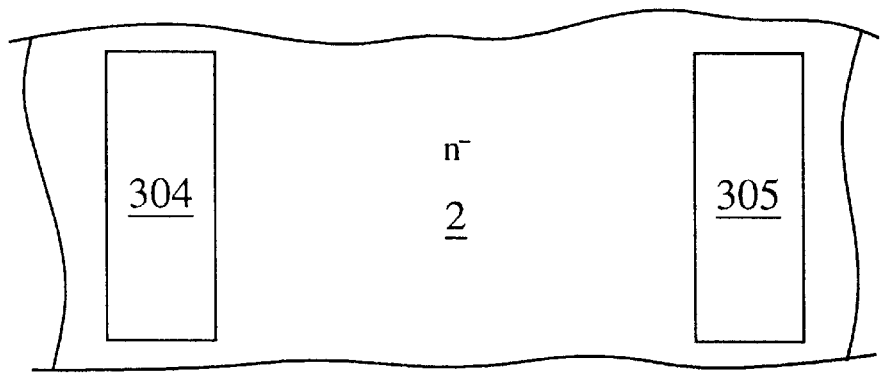
FIGS. 14A to 14C explain the processes of manufacturing the IGT of the first embodiment.
Figure 14B:
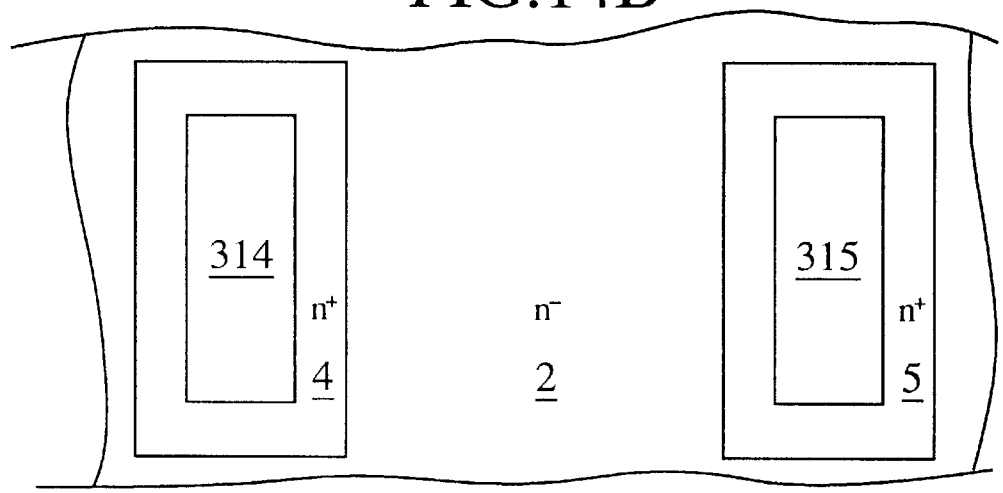
Figure 14C:
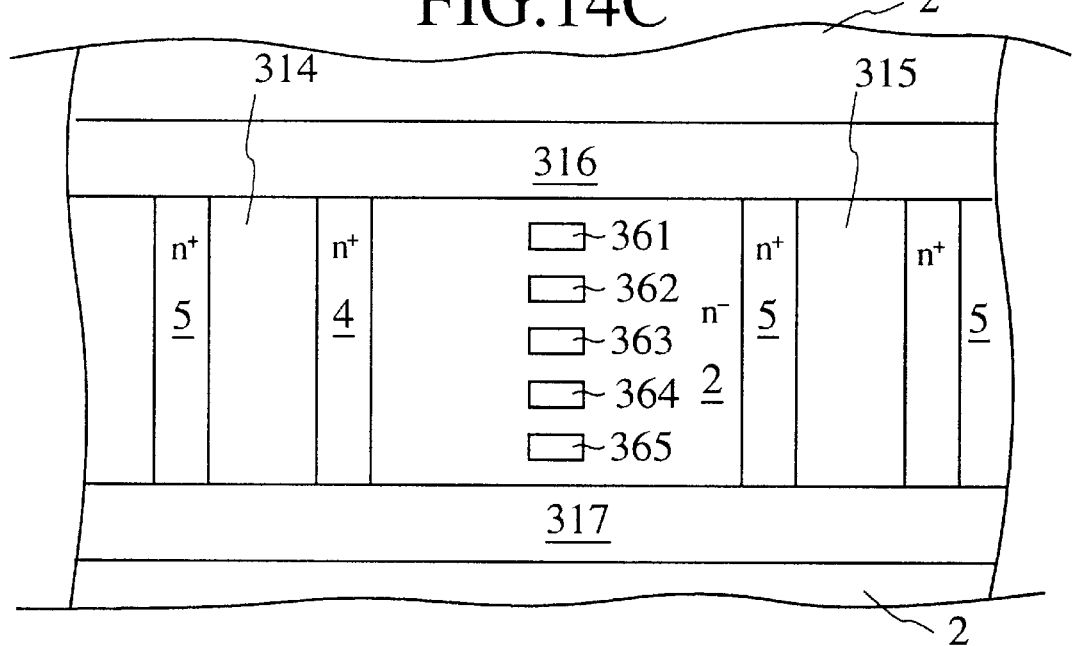

FIGS. 14A to 14C show the processes of manufacturing the IGT of the first embodiment.

(1) On a substrate having a predetermined plane, for example, (100) plane of a silicon substrate 82, an $SiO_2$ film is formed as a bottom insulation film 8 to a thickness of 1 $\mu$m according to a thermal oxidization technique or a CVD technique. The CVD technique may use $SiH_4$ and $N_2O$, or organic silicon such as TEOS (tetraethylorthosilicate, $Si(OC_2H_5)_4$). The surface of the bottom insulation film 8 is polished to obtain mirror like surface. An n-type silicon substrate 2 (a first semiconductor region) is prepared and polished to have a mirror surface. Both substrates 82, 2 are mated with facing mirror surface to mirror surface. The n-type silicon substrate 2 is adhered to the bottom insulation film 8 of the substrate 82 as shown in FIG. 8B. They are heat-treated to form an SOI substrate according to the SDB technique. The heat treatment may be carried out by applying a voltage. The substrate 2 is polished to obtain a required thickness, or a gate width W of, for example, 10 $\mu$m.

(2) The surface of the substrate 2 is thermally oxidized to form an oxide film 21 of 350 to 700 nm thick. The oxide film 21 is etched according to a photolithography technique, to form windows 304 and 305 as shown in FIG. 14A. The oxide film 21 is used as an etching mask to form first and second trenches 314 and 315 through the semiconductor layer 2 up to the bottom oxide film 8 according to an RIE or ECR ion etching technique using $SF_6$, $CF_4$, or $SiCl_4$. n-type impurities are horizontally diffused from the side-walls of the trenches 314 and 315 according to a vapour-phase diffusion technique employing $POCl_3$, $AsCl_3$, $SbCl_5$, etc. The horizontal diffusion is carried out to a required depth, to form an $n^+$-type source diffusion layer 4 and $n^+$-type drain diffusion layer 5.

(3) Third and fourth trenches 316 and 317 and gate trenches 361 to 365 are formed up to the bottom oxide film 8 as shown in FIG. 14C according to the photolithography technique and the RIE or ECR ion etching technique using $SF_6$, $CF_4$, or $SiCl_4$. At this time, the oxide film 21 is used again as an etching mask.

(4) Gate oxide films 6 and device isolating insulation films 1 are formed on the side-walls of the gate trenches 361 to 365 and trenches 314 to 317 according to, for example, the thermal oxidization technique.

(5) Spaces defined by the gate oxide films 6 and insulation films 1 in these trenches are filled with non-dope polysilicon (NDPOS) 3 according to, for example, a reduced-pressure CVD technique. Instead of NDPOS, oxygen doped polysilicon, i.e., semi-insulating poly-silicon (SIPOS) may also be used.

(6) Impurities such as boron (B) are diffused into the NDPOS in the gate trenches according to an ion implantation technique and a heat treatment, to form buried gate electrodes 7. Instead, the device isolating trenches and gate trenches may be separately filled with NDPOS for the isolating trenches and DOPOS for the gate trenches according to the CVD technique. It is preferable to fill the gate trenches with refractory metal such as W, or silicide thereof according to a selective CVD technique, to decrease the resistance of the buried gate electrodes 7.

(7) Diffusion windows are formed at predetermined positions on the oxide film 21 according to the photolithography technique. Ions of $^{75}As^+$ or $^{31}P^+$ are implanted through the windows at an acceleration voltage of 50 to 80 KeV and a dose $\Phi$ of $6 \times 10^{15}$ to $2 \times 10^{16}$ $cm^{-2}$, and a heat treatment is carried out to a predetermined depth, to form an $n^{++}$-type source contact layer 44 and $n^{++}$-type drain contact layer 55 as shown in FIG. 8B. The source and drain contact layers 44 and 55 may be omitted. It is preferable to form them to decrease ohmic contact resistance with respect to a metal source electrode 10 and metal drain electrode 11 and decrease on-resistance.

(8) Contact holes (or contact windows) are opened according to the photolithography technique, and the metal source electrode 10, metal drain electrode 11, and metal gate electrode 9 are formed according to a metallization process with Al, Ti/Al, Al—Si, etc. This completes the semiconductor device of the first embodiment of FIGS. 8A and 8B.

When the thickness W of the active n-type silicon substrate 2 is about 5 μm, it is relatively easy to diffuse phosphorus (P) from the top surface of the substrate 2 to the depth of 5 μm. If the thickness W is 10 to 20 μm, the diffusion of P requires a long time at high temperatures of 1150 to 1200 degrees centigrade, and such heat treatment may cause crystal defects. If the diffusion is deep, impurities will diffuse horizontally to prevent a fine structure and reduce the effective area for channels. This reduced channel area increases an on-voltage per unit chip area. The long diffusion time increases manufacturing costs. Instead of diffusing impurities from the top surface of the substrate 2, the present invention horizontally diffuses them from the side-walls of trenches, to form the source and drain diffusion layers 4 and 5. Consequently, the present invention prevents the crystal defects, realizes a fine structure appropriate for a high-speed operation, and improves productivity.

Figure 15A:
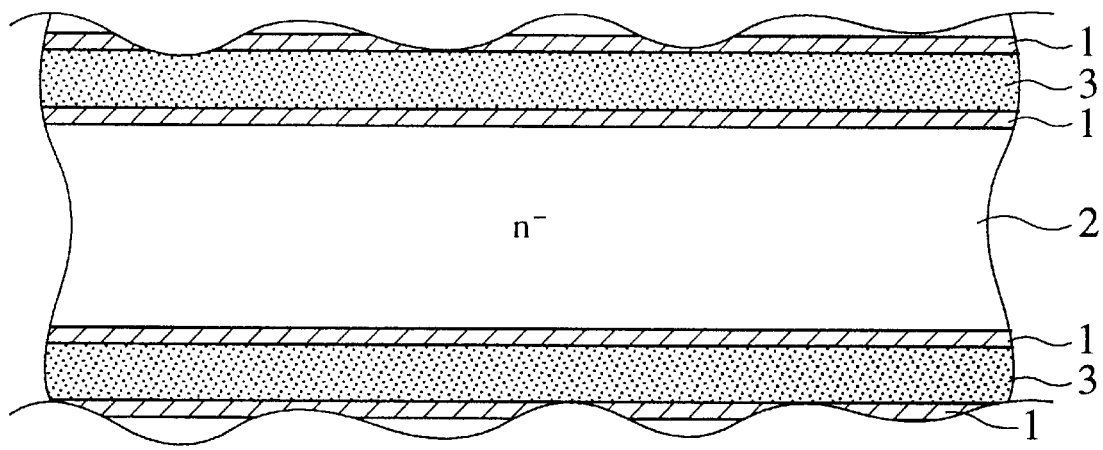
FIGS. 15A to 15C explain other processes of manufacturing the IGT of the first embodiment.
Figure 15B:
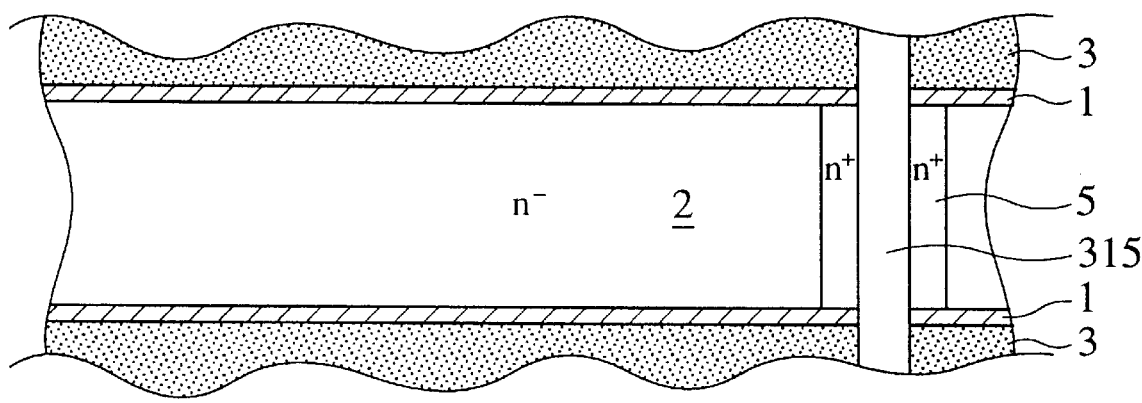
Figure 15C:
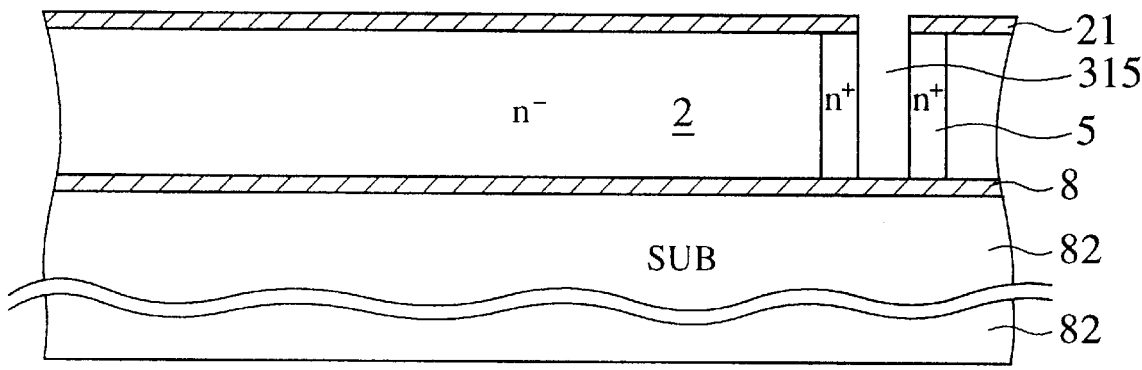

The manufacturing processes mentioned above are only examples. The trenches 316 and 317 may be formed first, and then the trenches 314 and 315 may be formed as shown in FIGS. 15A to 15C.

a) In FIG. 15A, the trenches 316 and 317 are formed first and are covered with device isolating insulation films 1. A space defined by the film 1 in each trench is filled with an isolation filler 3.

b) In FIG. 15B, the trenches 314 and 315 are formed first according to the photolithography and RIE techniques. The trench 314 is not shown in FIG. 15B.

c) In FIG. 15C, the side-walls of the trenches 314 and 315 are used as diffusion windows to horizontally diffuse $n^+$-type impurities and form $n^+$-type source and drain diffusion layers 4 and 5 extending up to the bottom insulation film 8. The source layer 4 is not shown in FIG. 15C.

d) The side wall of trenches 314 and 315 are covered with device isolating insulation films 1, and a space defined by the film 1 in each trench is filled with an isolation filler 3, for example, NDPOS.

e) Gate trenches 361 to 365 are formed up to the bottom insulation film 8. The side-walls of each of the gate trenches is covered with a gate insulation film 6. A space defined by the film 6 in each gate trench is filled with, for example, DOPOS to form a buried gate electrode 7.

Thereafter, the processes (7) and (8) mentioned above are carried out.

Figure 16A:
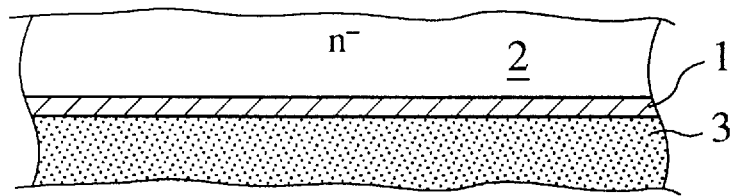
FIGS. 16A to 16E explain still other processes of manufacturing the IGT of the first embodiment.
Figure 16B:
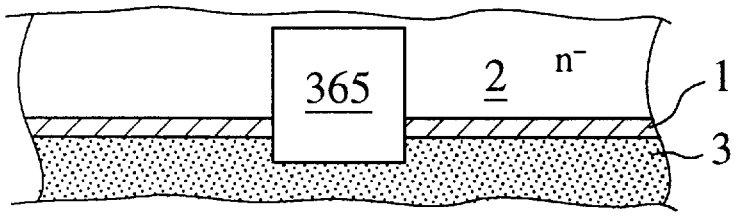
Figure 16C:
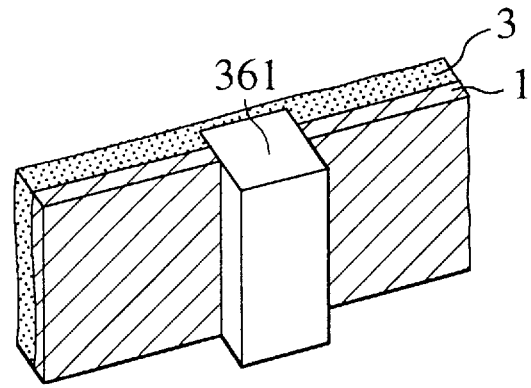
Figure 16D:
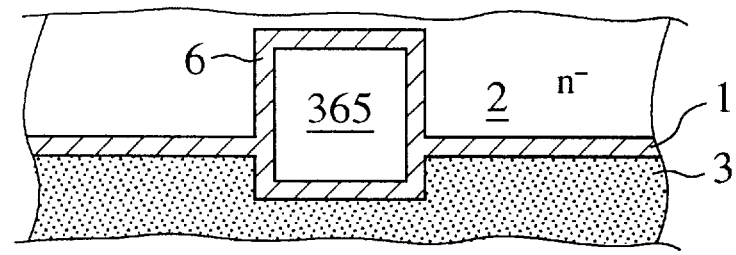

FIGS. 16A to 16E show the processes of manufacturing an IGT of Ss≦0. Each outermost gate trench is in contact with a device isolating region. FIG. 16A shows a device isolating trench filled with, for example, NDPOS. In FIG. 16B, gate trenches 361 to 365 are formed according to, for example, the ECR ion etching technique employing, for example, $C_3F_8$. At this time, the outermost trenches 361 and 365 are each formed through a device isolating insulation film 1 into the NDPOS layer 3 as shown in FIGS. 16B and 16C. FIG. 16C is a perspective view showing the trench 361. In FIG. 16D, a gate insulation film 6 is formed on the side-walls of each of the gate trenches 361 to 365 according to, for example, the thermal oxidization technique. A space defined by the film 6 in each gate trench is filled with isolation filler to form a buried gate electrode 7. This completes the IGT of Ss≦0.

Although the number of gate trenches in the above explanation is five as shown in FIG. 8A, this does not limit the present invention. The number of gate trenches of the present invention is at least one and is optionally chosen according to a required operation current.

(EXAMPLE 1-1)

Figure 16E:
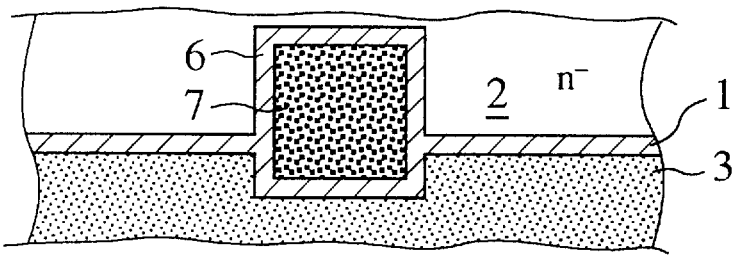
Figure 17:
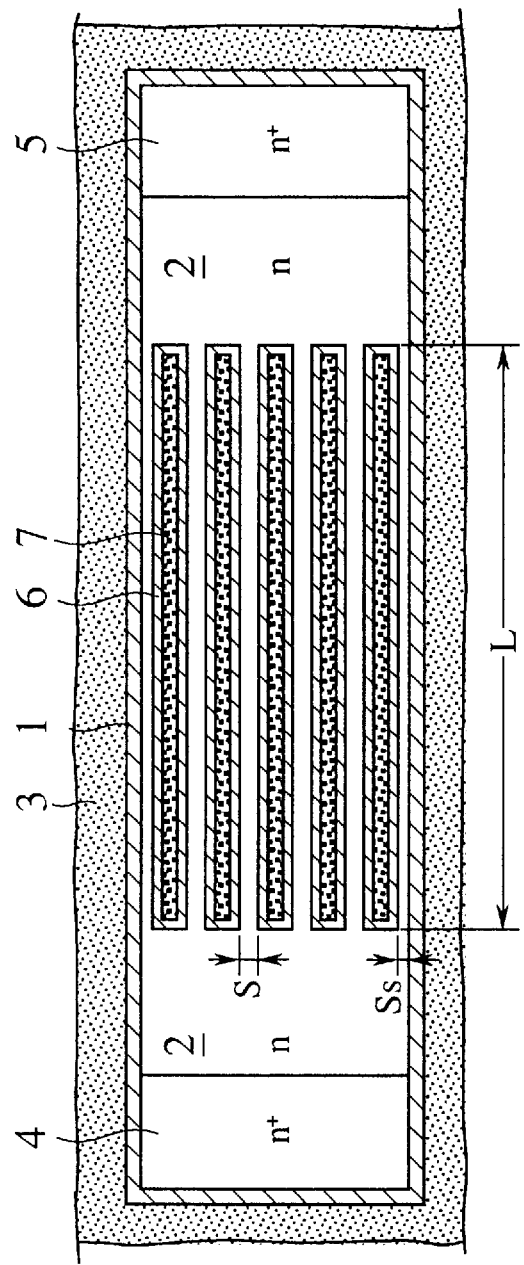
FIG. 17 is a plan view showing an IGT according to a first modification of the first embodiment.

FIG. 17 is a plan view showing an IGT according to the first modification of the first embodiment. This modification elongates a length of a gate trench along a current path (a channel), to actively use the effect of an accumulation layer 13. The length L of the channel is, for example, 50 to 150 μm. When the device is forward biased, the accumulation layer 13 is formed to increase a carrier concentration in an n-type semiconductor layer 2. At this time, an effective channel width $W_{eff}$ is determined by the thickness W (or channel width W) of the semiconductor layer 2, to realize low on-resistance. Spacings among the gate trenches of this modification are determined to be Ss<S/2 or Ss>S/2 according to requirements. Ss<S/2 is usually preferable. In an extremal case, Ss=0 so that each outermost gate oxide film 6 is in contact with a device isolating oxide film 1 as shown in FIG. 16E.

(EXAMPLE 1-2)

Figure 18:
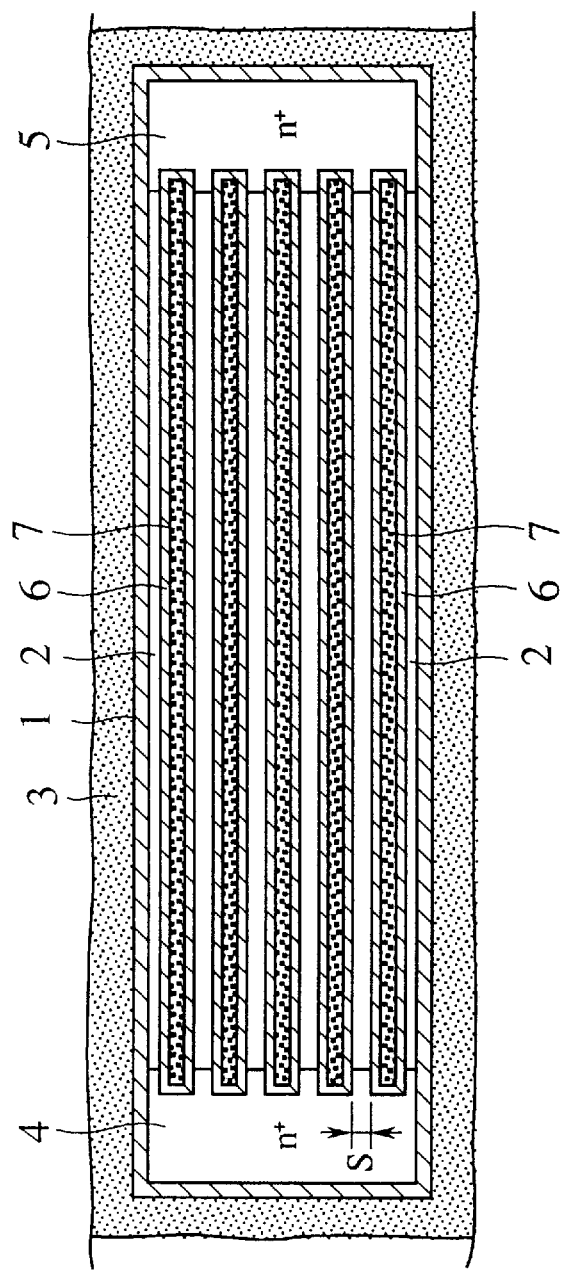
FIG. 18 is a plan view showing an IGT according to a second modification of the first embodiment.

FIG. 18 is a plan view showing an IGT according to the second modification of the first embodiment. This modification is useful when a required breakdown voltage of the device is not too high. A channel length L is long so that an accumulation layer may extend from an $n^+$-type source diffusion layer 4 to an $n^+$-type drain diffusion layer 5, to decrease on-resistance. Since each gate insulation film 6 is in the source and drain regions 4 and 5, the breakdown voltage of the device is determined by that of the gate insulation film 6.

(EXAMPLE 1-3)

FIG. 19 is a plan view showing an IGT according to the third modification of the first embodiment. Gate trenches are arranged adjacent to an $n^+$-type source diffusion layer 4. Electrons pass through an accumulation layer 13 formed around each gate oxide film 6 and drift through an $n^+$-type semiconductor layer 25 in front of a drain diffusion layer 5. At this time, the electrons are accelerated by a strong electric field of the drain 5. If the concentration of electrons injected into this part is sufficiently high, on-resistance in the semiconductor layer 25 will be ignorable. Since carriers travel through the bulk of the layer 25, a decrease in the mobility of carriers at the surface of the layer 25 causes no trouble. The cross-sectional area of the drift layer 25 orthogonal to the drifting direction of carriers is large to decrease on-resistance. Namely, the drift layer 25 increases a gate-drain breakdown voltage and minimizes on-resistance. A gate length (channel length) L may be shortened to 2 to 5 μm, and each short gate may be arranged adjacent to the source 4. This results in eliminating negative feedback due to the resistance of each channel, to achieve a MOSSIT operation. In this case, the electric field of the drain 5 affects the height of a potential barrier in front of the source 4. As a result, electrons are injected over a saddle point determined by gate potential and drain potential, and the electrons drift through the semiconductor layer 25 to reach the $n^+$ drain 5. Unlike the conventional MOSSIT, each of the channels of the third modification is deep from the top surface of an n-type semiconductor layer 2 and lets electrons travel in parallel with the top surface of the layer 2. Accordingly, an effective channel width $W_{eff}$ according to the third modification is larger than that of the conventional MOSSIT. Namely, the device of the present invention is completely different from the conventional MOSSIT in that a main current of the present invention is distributed vertically to the top surface of the substrate. The transconductance ($g_m$) of the MOSSIT is determined by the mobility of carriers in a bulk. Since carriers travel deep in the IGT of the present invention, the transconductance ($g_m$) of the device is larger than that of the conventional planar MOSSIT. This is also true for a device having a long channel length because the present invention distributes a main current vertically to the top surface of the device to increase a transconductance ($g_m$) and an operation speed higher than those of the conventional planar MOSFET.

(EXAMPLE 1-4)

Figure 20A:
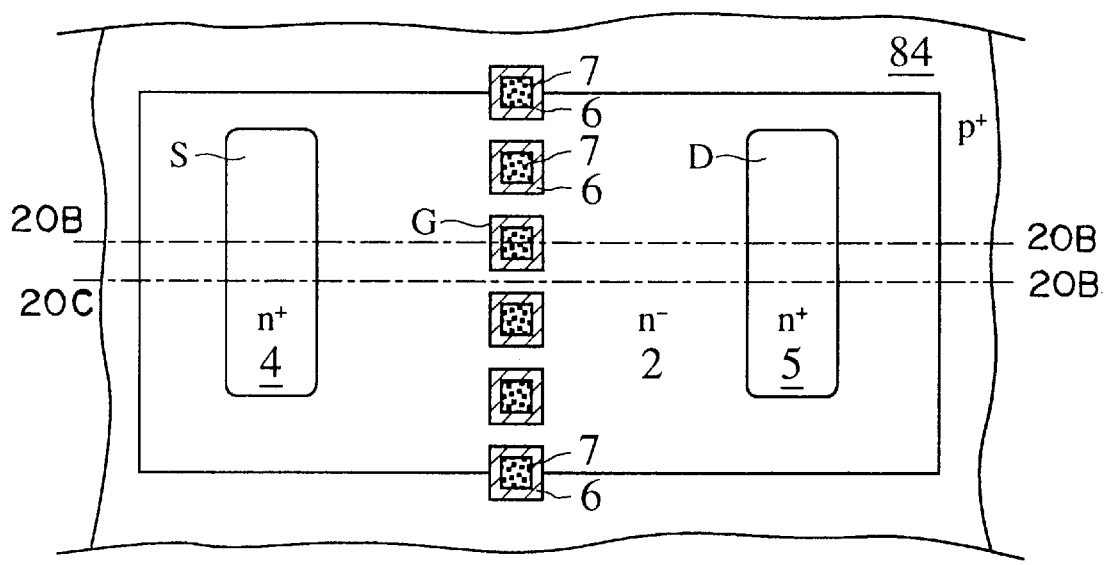
FIG. 20A is a plan view showing an IGT according to a fourth modification of the first embodiment.
Figure 20B:
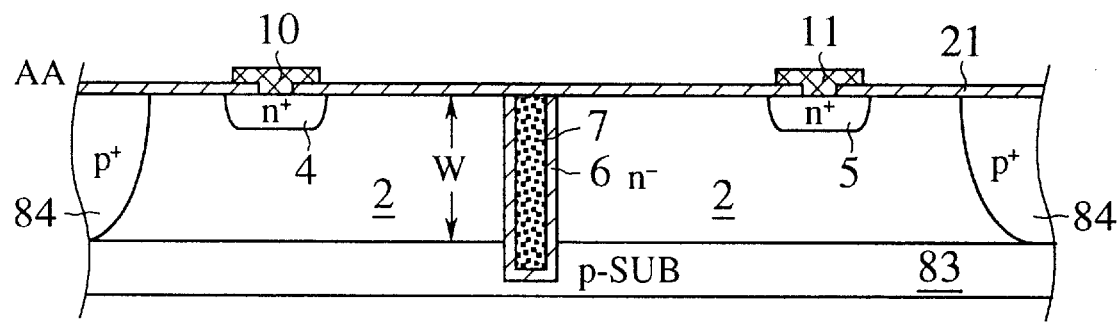
Figure 20C:
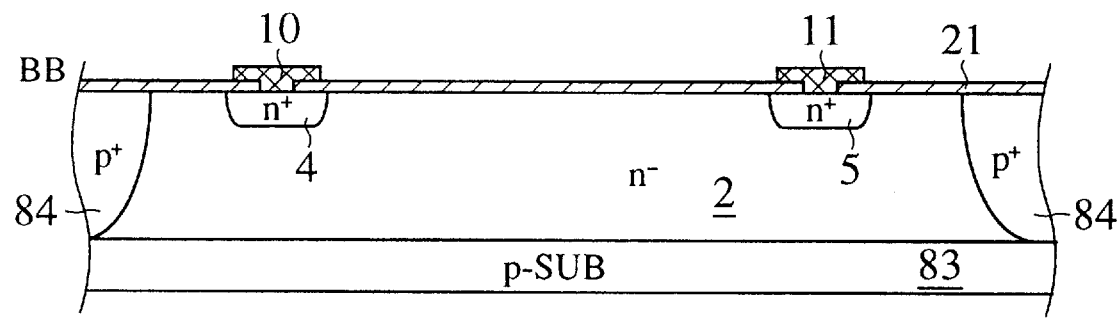

The first embodiment of the present invention is not limited to IGTs having a dielectric isolation (DI) structure. FIGS. 20A to 20C show an IGT having a pn junction isolation (JI) structure according to the fourth modification of the first embodiment. FIG. 20A is a plan view, FIG. 20B is a sectional view taken along a line A—A of FIG. 20A, and FIG. 20C is a sectional view taken along a line B—B of FIG. 20A. An island-like n⁻-type semiconductor layer 2 is formed on a p-type substrate 83 and is surrounded by a p⁺-type isolation region 84. At opposite ends of the semiconductor layer 2, an n⁺-type source diffusion layer 4 and an n⁺-type drain diffusion layer 5 are formed. Gate trenches are formed between the source 4 and the drain 5. The side-walls of each of the gate trenches is covered with a gate insulation film 6. A space defined by the gate insulation film 6 in each gate trench is filled with a buried gate electrode 7. The gate trenches reach the substrate 83. The source 4 and drain 5 are not in contact with the substrate 83, to provide a high breakdown voltage. A channel width (a gate width) W is vertical to the surface of the device, and therefore, is freely determined without regard to the surface area of a chip, to thereby greatly decrease on-resistance per unit chip area.

(Second embodiment)

Figure 21A:
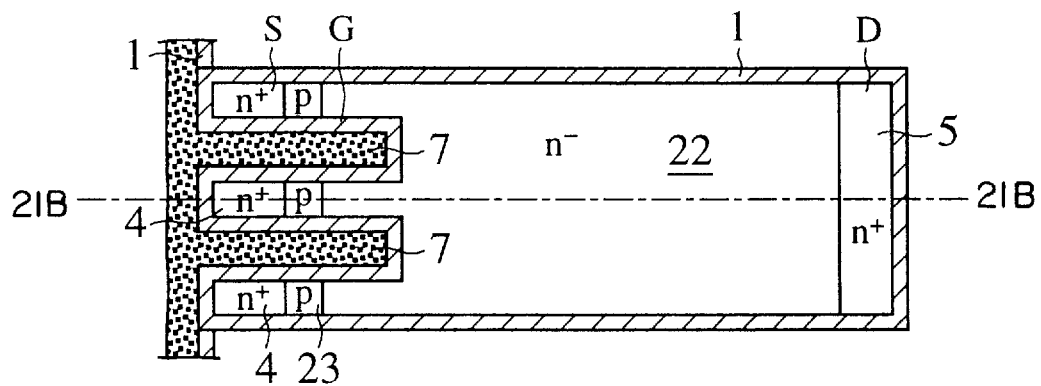
FIGS. 21A and 21C are sectional views showing the IGT of FIG. 20A.
Figure 21B:
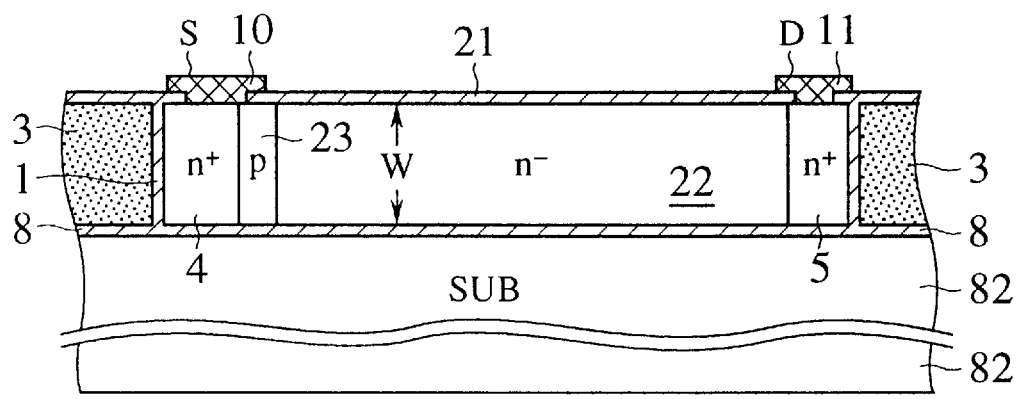
Figure 21C:
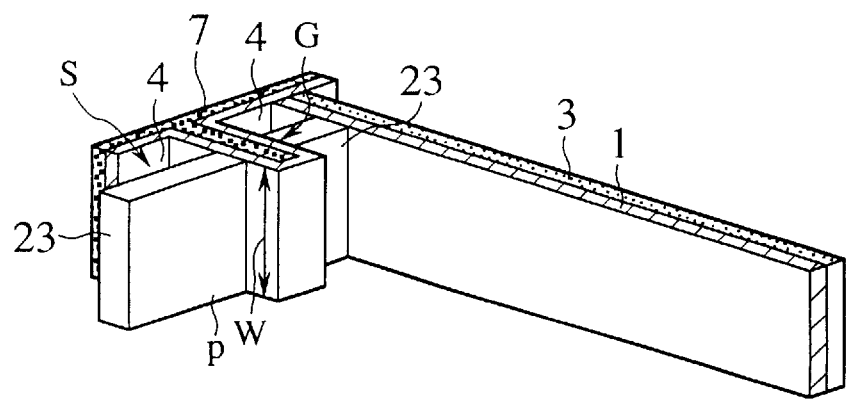

FIG. 21A is a plan view showing an IGT according to the second embodiment of the present invention, FIG. 21B is a sectional view taken along a line A—A of FIG. 21A, and FIG. 21C is a perspective view showing a part of the device. The device has a bottom insulation film 8 made of, for example, an oxide film on which an n⁻-type semiconductor layer (a first semiconductor region) 22 is formed to provide an SOI substrate. Similar to the first embodiment, the SOI substrate is formed according to, for example, the SDB technique. The semiconductor layer 22 is surrounded by a device isolating trench covered with a device isolating insulation film 1. A space defined by the film 1 in the trench between adjacent devices is filled with an isolation filler 3, to provide a DI structure. Gate trenches are formed from the top surface of the semiconductor layer 22 up to the bottom insulation film 8. Each gate trench is covered with a gate insulation film 6 of 30 to 150 nm thick. A space defined by the gate insulation film 6 in each gate trench is filled with a buried gate electrode 7 made of, for example, DOPOS. The electrode 7 may be made of refractory metal such as W (tungsten), silicide thereof such as $WSi_2$, $MoSi_2$, $TiSi_2$, and $CoSi_2$, or polycide thereof. A metal source electrode 10 and metal drain electrode 11 are formed at predetermined positions on opposite ends of the same top surface of the semiconductor layer 22. Under the source electrode 10, an n⁺-type source diffusion layer (a second semiconductor region) 4 is formed. Under the drain electrode 11, an n⁺-type drain diffusion layer (a third semiconductor region) 5 is formed. The source 4 and drain 5 have an impurity concentration of $1\times10^{18}$ to $1\times10^{21}$ cm⁻³ and reach the bottom insulation film 8. Along an interface between the source 4 and the semiconductor layer 22, a p-type base layer (a fourth semiconductor region) 23 is formed up to the bottom insulation film 8. The semiconductor layer 22 between the base 23 and the drain 5 forms an n⁻-type drift layer 22. The source electrode 10 short-circuits the source 4 to the base 23.

To turn on the IGT, the source electrode 10 is grounded, a positive voltage is applied to the drain electrode 11, and a positive voltage is applied to the buried gate electrodes 7 with respect to the source electrode 10. When the positive voltage is applied to the buried gate electrodes 7, an inversion channel is formed around the side-walls of the base 23, to pass electrons from the source 4 into the drift layer 22 through the inversion channel, to thereby turn on the IGT. When a voltage lower than a threshold or a negative voltage is applied to the buried gate electrodes 7, the inversion channel disappears to stop injecting electrons from the source 4 and turn off the IGT.

As is apparent in FIG. 21B, an effective channel width $W_{eff}$ of the IGT is determined by the product of the thickness W (or channel width W) of the drift layer 22 and the number of channels and is freely chosen in a depth direction vertical to the top surface of the substrate even if a chip area is limited. Hence, the on-resistance per unit chip area of the second embodiment is very small. Electrons effectively travel in the bulk of the drift layer 22 without the influence of surface scattering or surface defects. In this way, the second embodiment improves the mobility of electrons, decreases on-resistance, and hastens a switching speed.

Figure 22A:
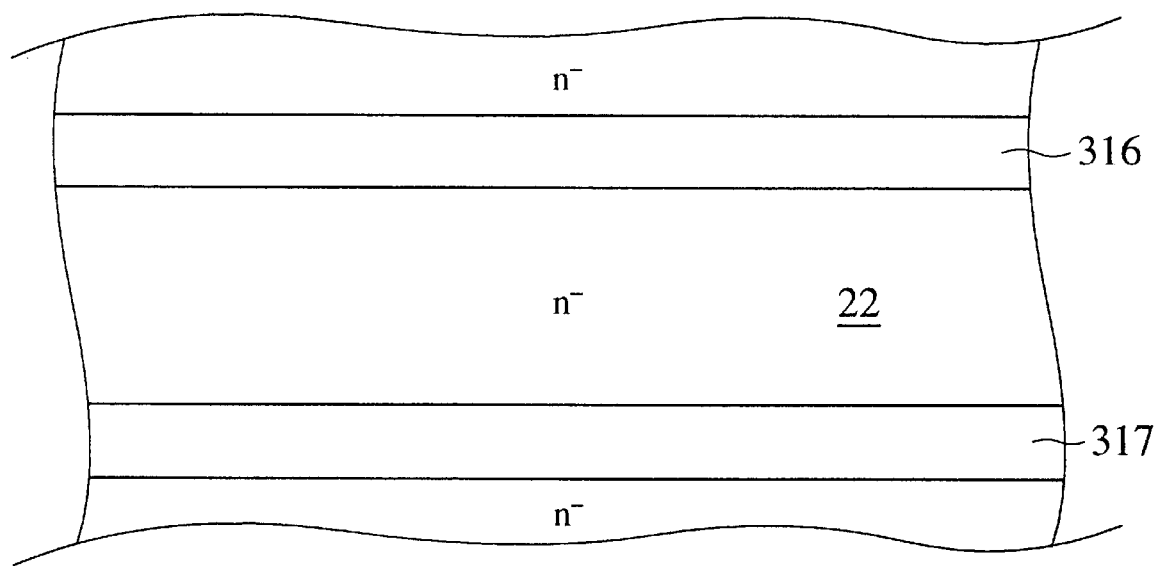
FIGS. 22A to 22F explain the processes of manufacturing the IGT of the second embodiment.
Figure 22B:
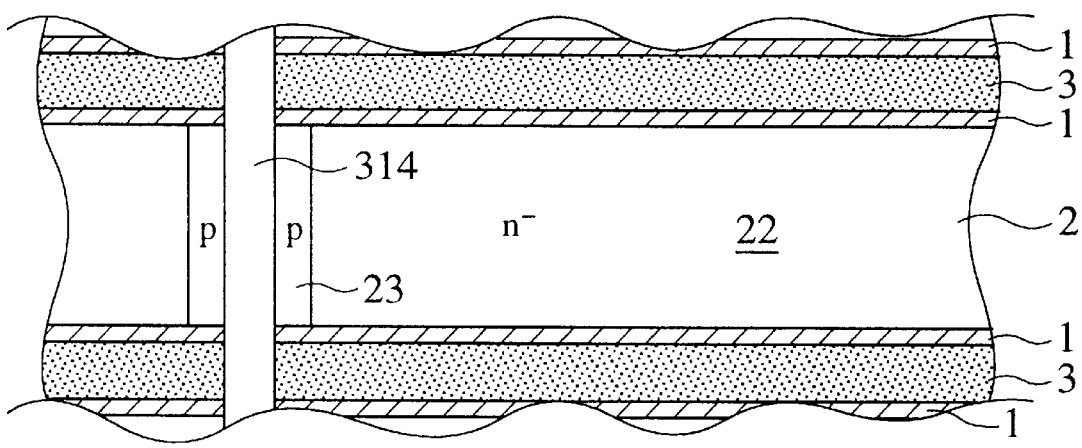
Figure 22C:
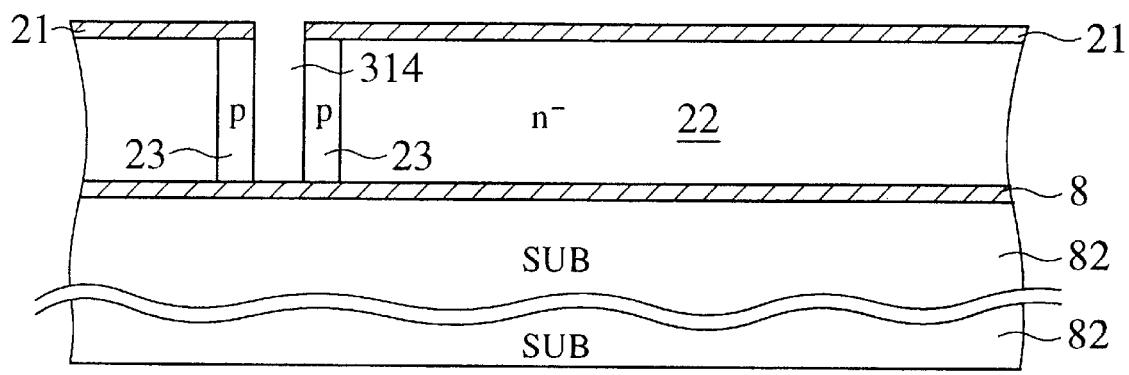
Figure 22D:
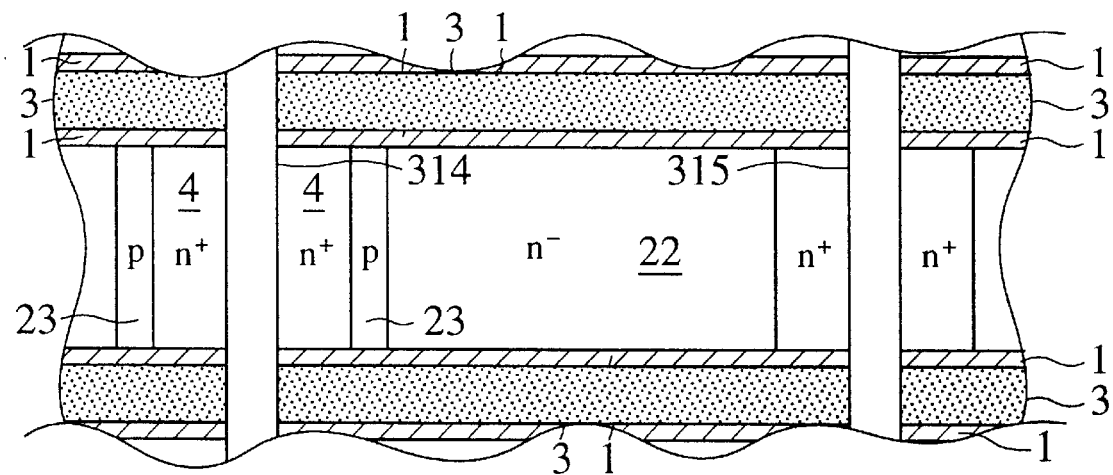
Figure 22E:
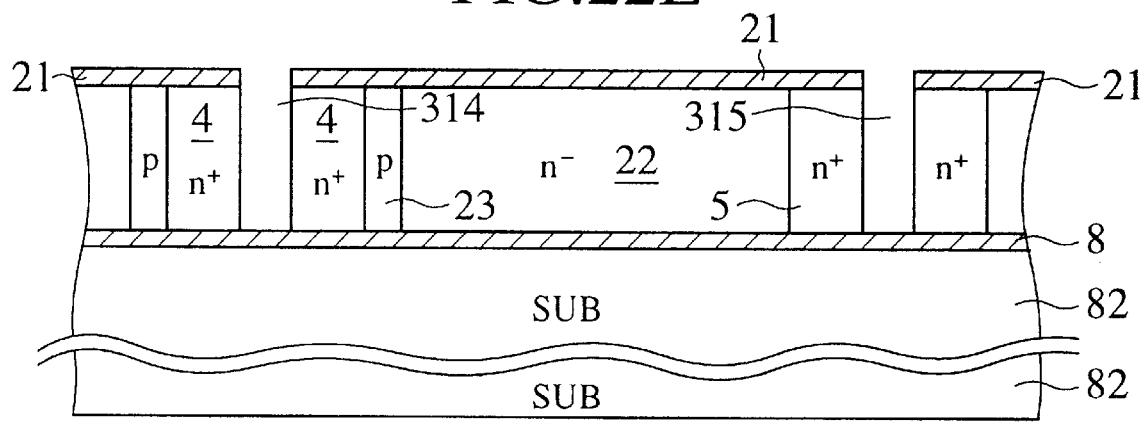
Figure 22F:
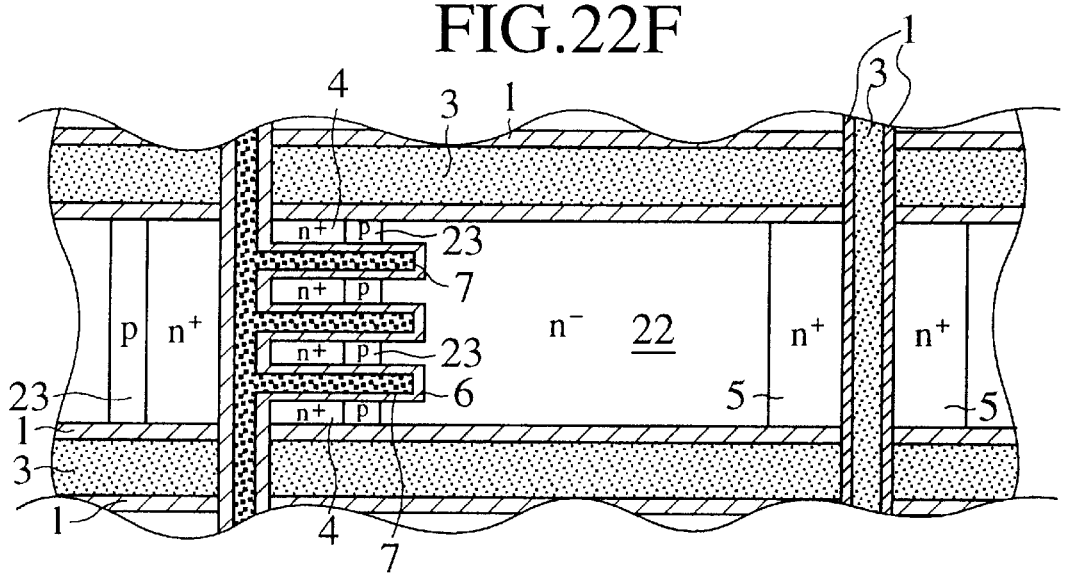

FIGS. 22A to 22F explain the processes of manufacturing the IGT of the second embodiment.

a) A bottom insulation film 8 is formed on a silicon substrate 82, and an n⁻-type semiconductor layer 22 is formed on the film 8 according to the SDB technique similar to the first embodiment. An oxide film 21 of 350 to 700 nm thick is formed on the semiconductor layer 22 according to the thermal oxidization technique. Predetermined positions of the oxide film 21 are etched off according to the photolithography and RIE techniques.

b) In FIG. 22A, the oxide film 21 is used as an etching mask to form trenches 316 and 317 up to the bottom insulation film 8 according to the RIE or ECR ion etching technique. A device isolating insulation film 1 is formed in each trench, and an isolation filler 3 made of, for example, NDPOS is deposited.

c) In FIG. 22B, a trench 314 is formed up to the bottom insulation film 8 according to the photolithography and RIE techniques. The side-walls of the trench 314 are used as diffusion windows to horizontally diffuse p-type impurities such as boron (B), to form a p-type base layer 23. FIG. 22C is a sectional view of FIG. 22B, showing that the base layer 23 is formed up to the bottom insulation film 8 by the horizontal diffusion.

d) In FIG. 22D, a trench 315 is formed up to the bottom insulation film 8 according to the photolithography and RIE techniques. The side-walls of the trenches 314 and 315 are used as diffusion windows to horizontally diffuse n⁺-type impurities such as phosphorus (P) or arsenic (As) to form an n⁺-type source diffusion layer 4 and n⁺-type drain diffusion layer 5 up to the bottom insulation film 8 as shown in FIG. 22E. FIG. 22D is a plan view, and FIG. 22E is a sectional view.

e) In FIG. 22F, a comb-like gate trench is formed. The gate trench extends beyond the base 23 up to the semiconductor layer 22, i.e., the drift layer 22. The side-walls of the gate trench is covered with a gate insulation film 6, and a buried gate electrode 7 is formed from, for example, DOPOS.

f) Returning to FIG. 21B, a metal source electrode 10 is formed to short-circuit the source 4 to the base 23, and a metal drain electrode 11 is formed on the drain layer 5, to complete the IGT of the second embodiment.

The second embodiment is not limited to the structure mentioned above. Various modifications are possible.

(EXAMPLE 2-1)

Figure 23A:
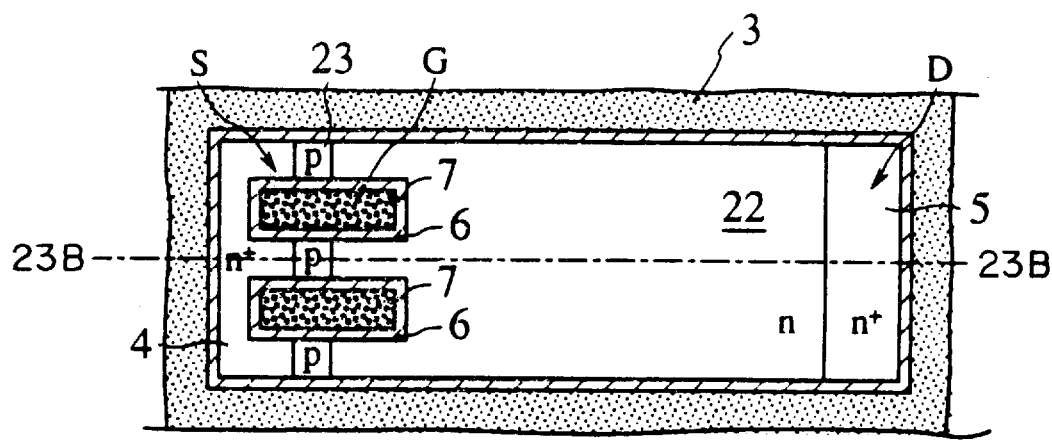
FIGS. 23A and 23B are plan and sectional views showing an IGT according to a first modification of the second embodiment.
Figure 23B:
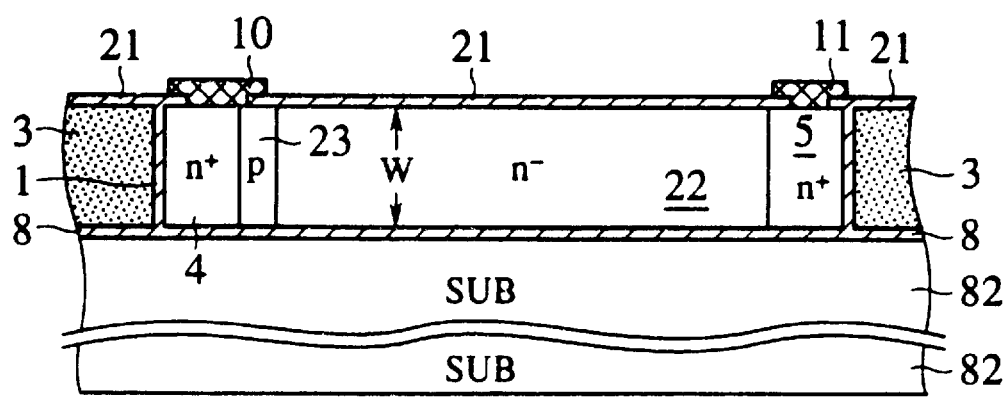

FIG. 23A is a plan view showing an IGT according to the first modification of the second embodiment, and FIG. 23B is a sectional view taken along a line A—A of FIG. 23A. This modification employs independent gate trenches each having a gate insulation film 6 and buried gate electrode 7. The buried gate electrodes 7 are connected to one another with surface wiring. Unlike the separated sources 4 of FIG. 21A, the modification of FIG. 23A employs a common comb-like n$^+$-type source diffusion layer 4.

Figure 24A:
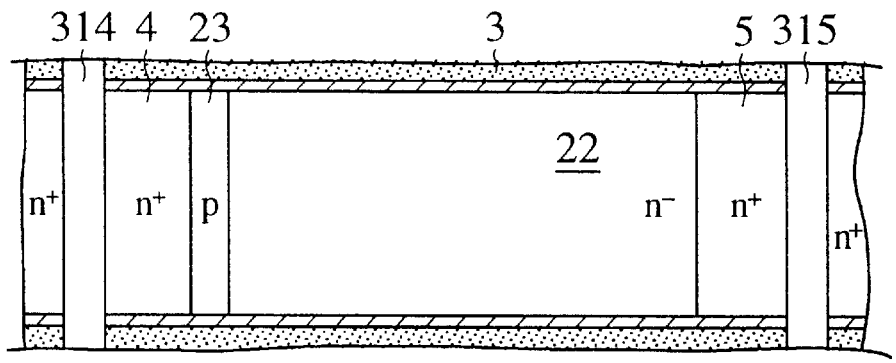
FIGS. 24A to 24D explain the processes of manufacturing the IGT of the first modification of the second embodiment.
Figure 24B:
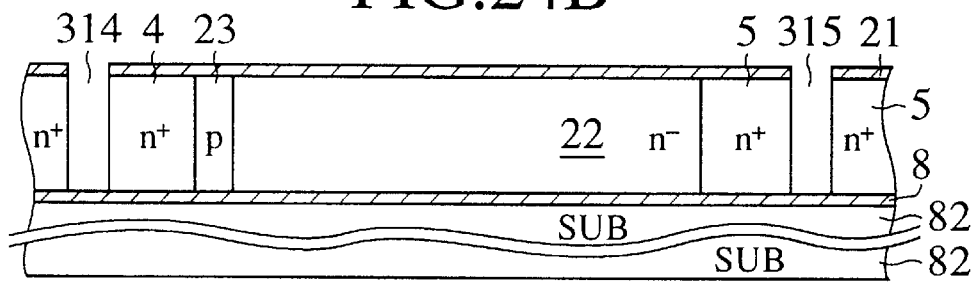
Figure 24C:
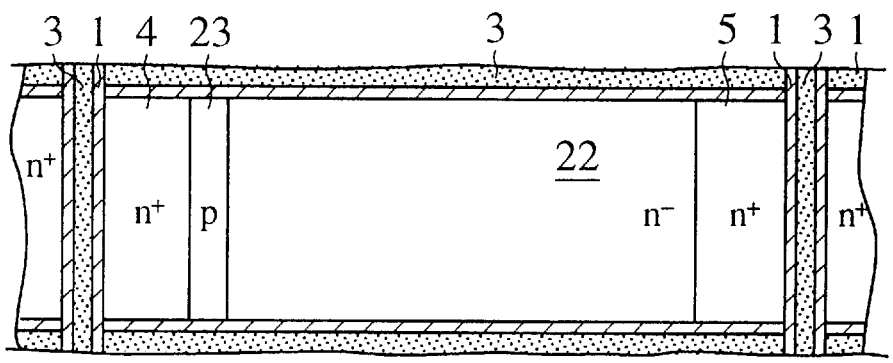
Figure 24D:
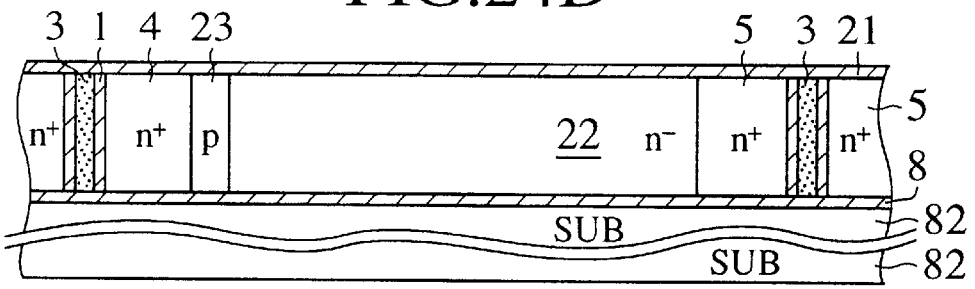

The gate trenches are deep to reach a bottom insulation film 8, and a channel width W is vertical to the top surface of the substrate. Accordingly, an effective channel width $W_{eff}$ is freely extended without regard to the surface area of the substrate, to decrease on-resistance and increase a current. The IGT of the first modification is easily manufactured according to the processes of FIGS. 24A to 24D.

a) In an SOI substrate, a p-type base layer 23 and n$^-$-type source and drain diffusion layers 4 and 5 are formed as shown in a plan view of FIG. 24A and a sectional view of FIG. 24B. Processes used are the same as those of FIGS. 22A to 22E.

b) The side walls of trenches 314 and 315 used as windows for horizontally diffusing impurities to form the n$^+$ source and drain layers 4 and 5 are thermally oxidized to form a device isolating oxide film 1. A space defined by the film 1 is filled with an isolation filler 3 such as NDPOS according to the CVD technique as shown in FIGS. 24C and 24D.

c) Gate trenches are formed up to a bottom insulation film 8, and the side-walls of each gate trench is covered with a gate insulation film 6 as shown in FIG. 23A. A space defined by the gate insulation film 6 is filled with, for example, DOPOS to form a buried gate electrode 7, to thereby complete the IGT of FIGS. 23A and 23B.

(EXAMPLE 2-2)

Figure 25:
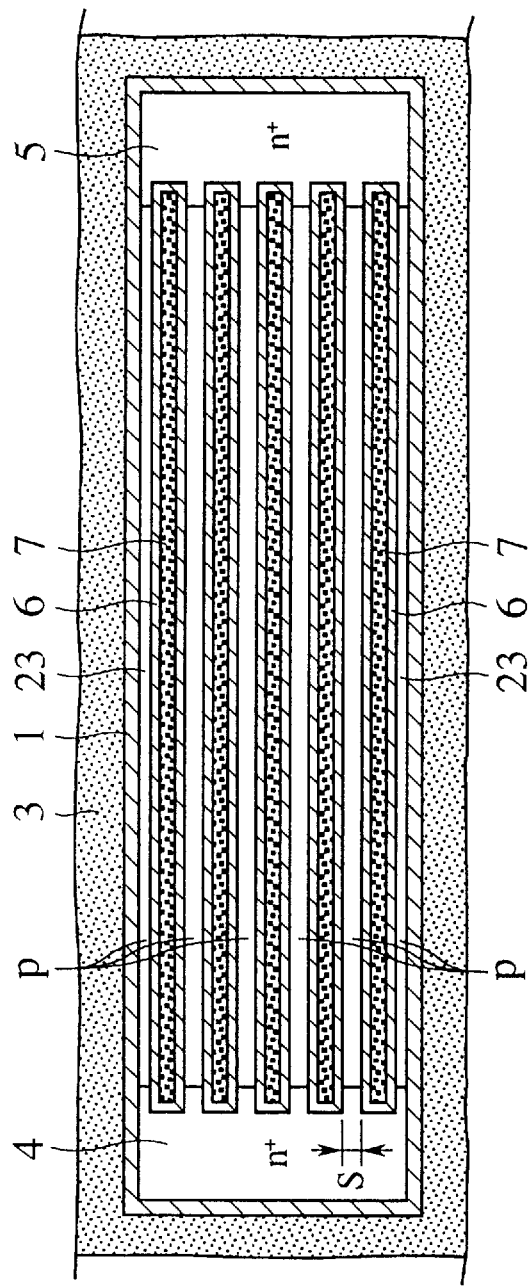
FIG. 25 is a plan view showing an IGT according to a second modification of the second embodiment.

FIG. 25 is a plan view showing an IGT according to the second modification of the second embodiment. A p-type base layer 23 is long to reach an n$^+$-type drain diffusion layer 5, and gate trenches extend from an n$^+$-type source diffusion layer 4 to the drain 5. When an SOI substrate is formed according to the SDB technique, the p-type semiconductor layer (a first semiconductor region) 23 is formed on a bottom insulation film 8. Thereafter, n$^+$-type impurities are horizontally diffused from the side-walls of trenches, to form the source 4 and drain 5. A channel width W extends vertically to the surface of the substrate, and therefore, the on-resistance of the device can be decreased without regard to the surface area of the substrate.

(EXAMPLE 2-3)

Figure 26A:
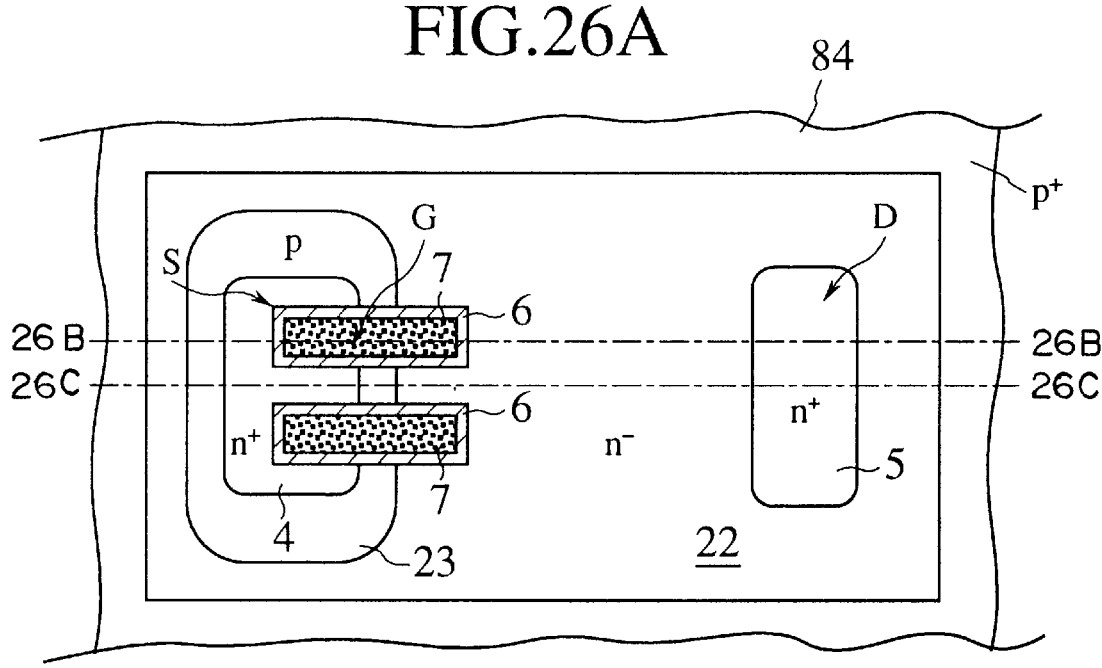
FIG. 26A is a plan view showing an IGT according to a third modification of the second embodiment.
Figure 26B:
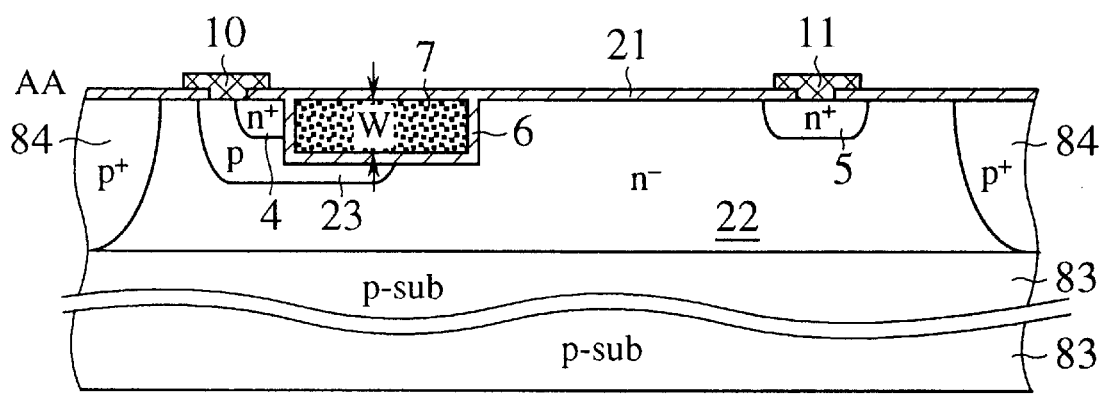
FIGS. 26B and 26C are sectional views showing the IGT of FIG. 26A.
Figure 26C:
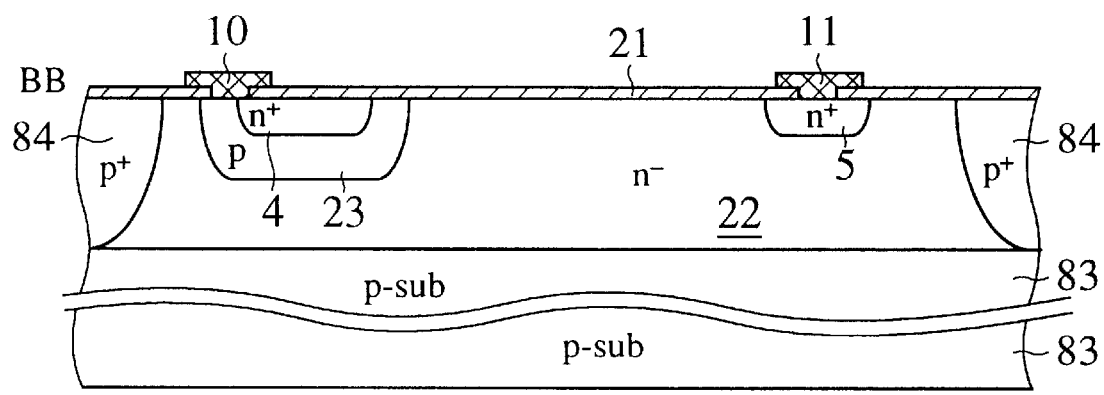

FIG. 26A is a plan view showing an IGT according to the third modification of the second embodiment, FIG. 26B is a sectional view taken along a line A—A of FIG. 26A, and FIG. 26C is a sectional view taken along a line B—B of FIG. 26A. The third modification has a junction isolation (JI) structure. On a p-type substrate 83, an n$^-$-type semiconductor layer (a first semiconductor region) 22 is epitaxially grown. The semiconductor layer 22 works as an n$^-$-type drift layer 22, which is surrounded by a p$^+$-type diffusion region 84, to form the JI structure.

An island-like p-type base layer (a fourth semiconductor region) 23 is formed in a part of the semiconductor layer 22 to have common top surface to the top surface of the semiconductor layer 22. An n$^+$-type source diffusion layer (a second semiconductor region) 4 is formed inside the base 23. An n$^+$-type drain diffusion layer (a third semiconductor region) 5 is formed away from the base 23 in the semiconductor layer 22. To improve a drain breakdown voltage, it is preferable that the drain 5 is not in touch with the substrate 83. Gate trenches are formed away from the substrate 83 up to substantially the same depth as that of the base 23. A channel width W is equal to the depth W of the gate trenches, so that the channel width W may be increased without regard to the surface area of the semiconductor substrate, to thereby decrease the on-resistance of the device.

(EXAMPLE 2-4)

Figure 27A:
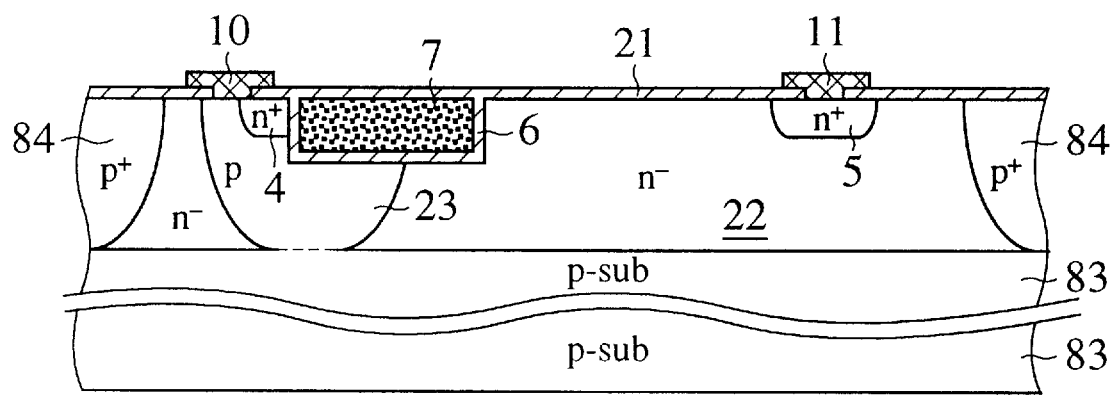
FIGS. 27A and 27B are plan and sectional views showing an IGT according to fourth modification of the second embodiment.
Figure 27B:
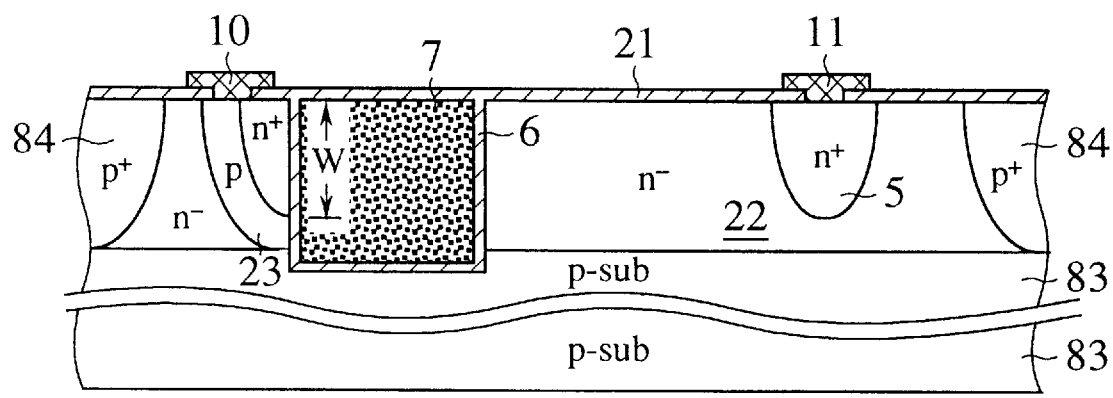

FIG. 27A is a sectional view showing an IGT according to the fourth modification of the second embodiment. A p-type base layer 23 is deep to reach a p-type substrate 83. It is preferable that gate trenches are deep to reach the substrate 83 as shown in FIG. 27B, to increase a channel width W and decrease on-resistance.

(EXAMPLE 2-5)

Figure 28A:
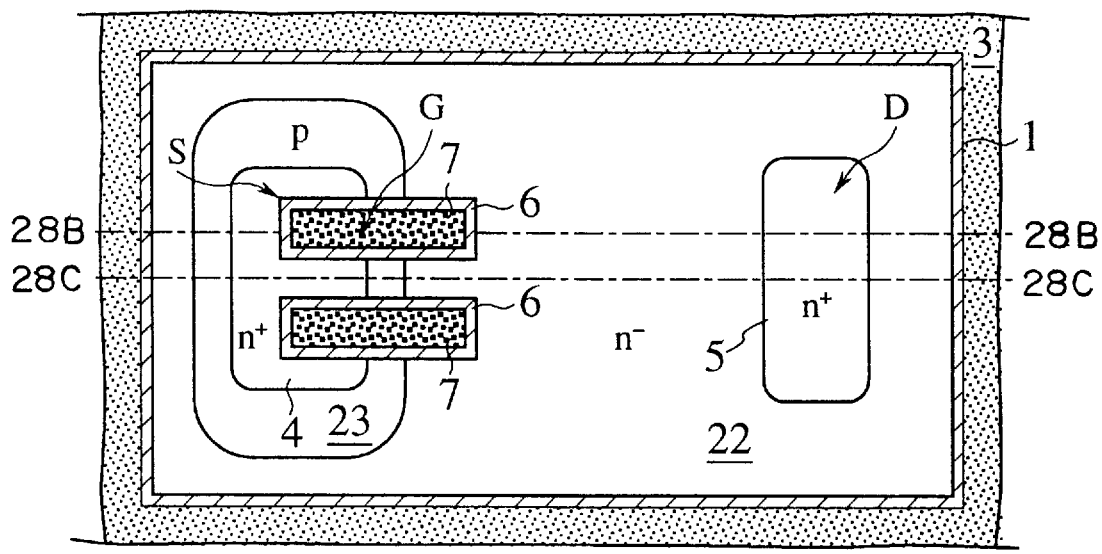
FIG. 28A is a plan view showing an IGT according to a fifth modification of the second embodiment.
Figure 28B:
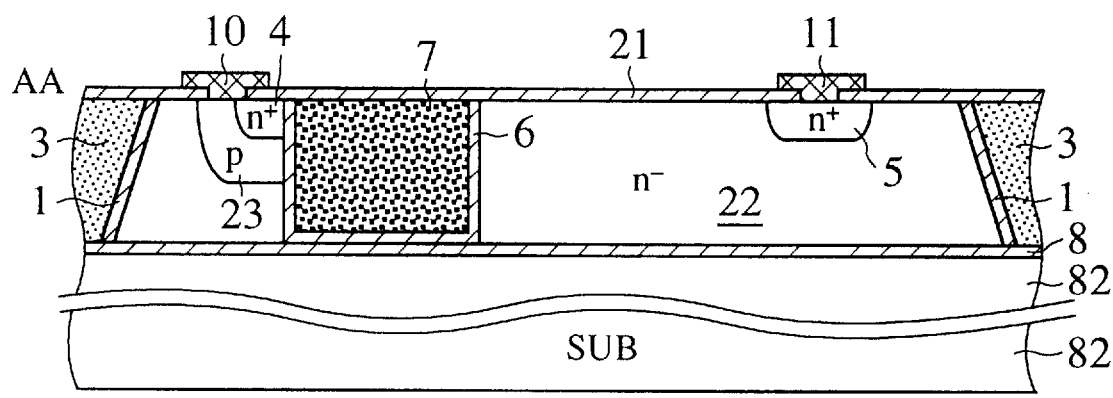
FIGS. 28B and 28C are sectional views showing the IGT of FIG. 28A.
Figure 28C:
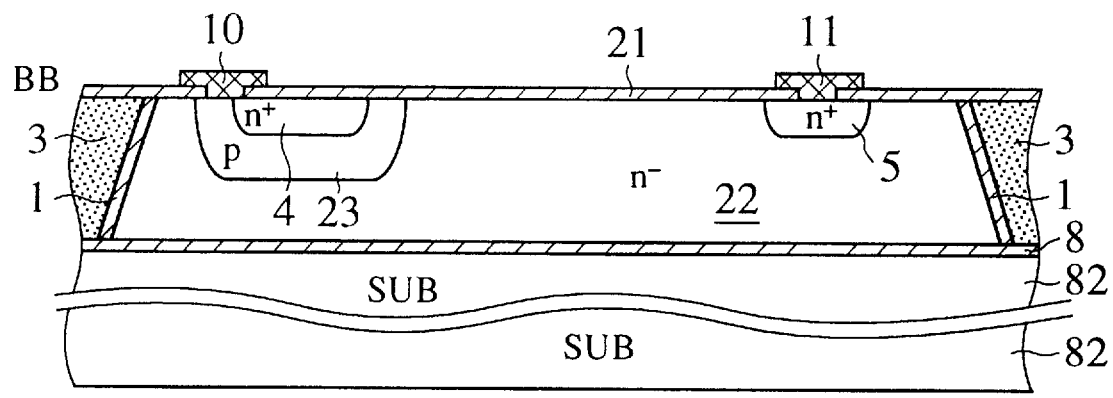

FIG. 28A is a plan view showing an IGT according to the fifth modification of the second embodiment, FIG. 28B is a sectional view taken along a line A—A of FIG. 28A, and FIG. 28C is a sectional view taken along a line B—B of FIG. 28A. Similar to the second embodiment of FIGS. 21A to 21C, an n$^-$-type semiconductor layer (a first semiconductor region) 22 is formed on a bottom insulation film 8, to form an SOI structure. The fifth modification is characterized in a device isolating structure. The semiconductor layer 22, i.e., a drift layer is surrounded by a V-shaped trench, which is covered with a device isolating insulation film 1. A space defined by the film 1 in the trench is filled with an isolation filler 3. The V-shaped trench that forms a DI structure is formed with the use of an anisotropic etching solution such as a KOH solution or an ethylenediamine (NH$_2$(CH$_2$)$_2$NH$_2$) and pyrocatechol C$_6$H$_4$(OH)$_2$ (EDP) solution. Except the V-shaped isolation trench, the fifth modification is substantially equal to the third modification. It is preferable to form n$^+$-type drain diffusion layer 5 deeply enough to reach the bottom insulation film 8. By deep n$^+$-type drain diffusion layer, electrons drift in the bulk region of n$^-$-type semiconductor layer 22 without the influence of surface scattering.

(EXAMPLE 2-6)

Figure 29A:
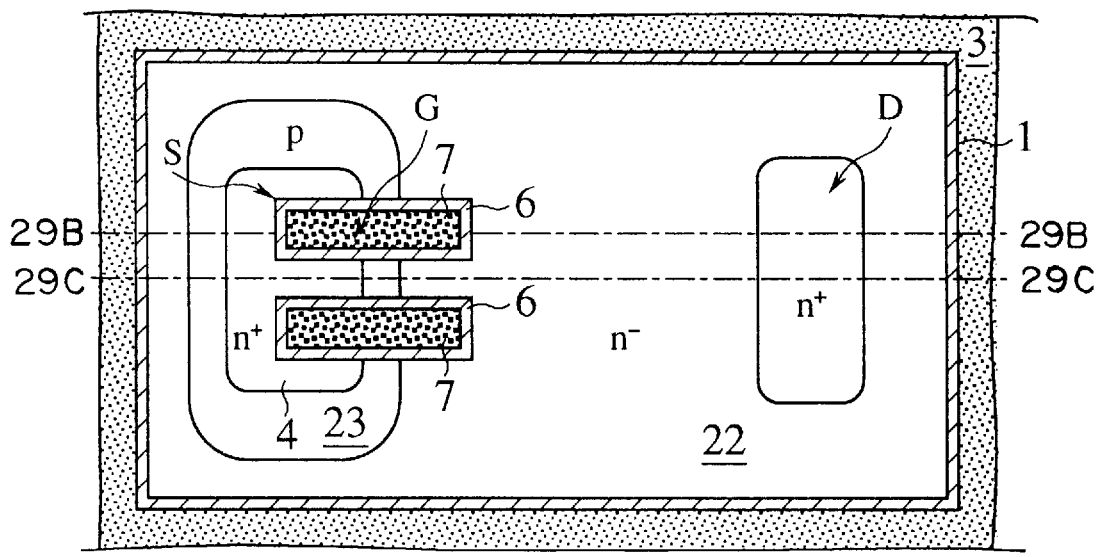
FIG. 29A is a plan view showing an IGT according to a sixth modification of the second embodiment.
Figure 29B:
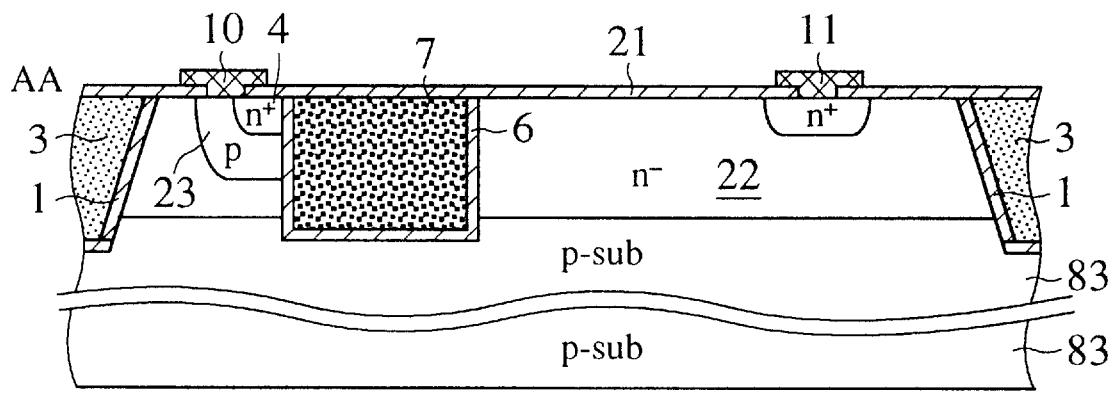
FIGS. 29B and 29C are sectional views showing the IGT of FIG. 29A.
Figure 29C:
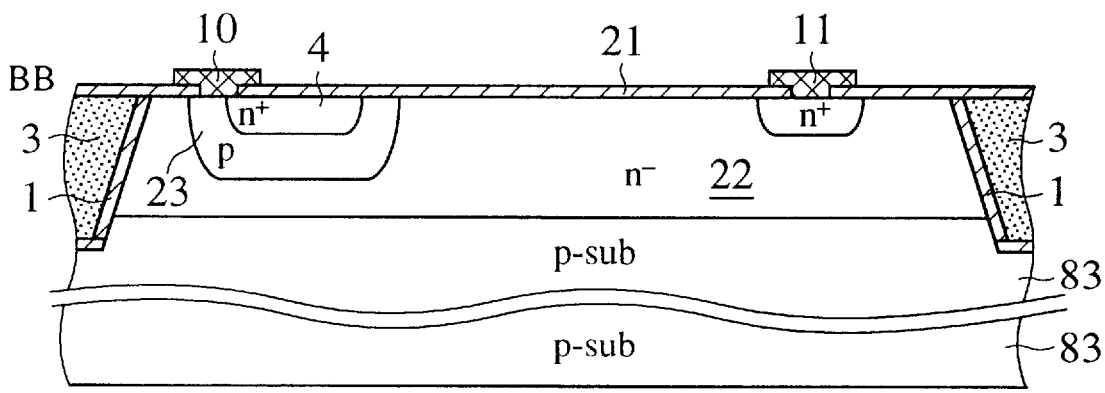

FIG. 29A is a plan view showing an IGT according to the sixth modification of the second embodiment, FIG. 29B is a sectional view taken along a line A—A of FIG. 29A, and FIG. 29C is a sectional view taken along a line B—B of FIG. 29A. This modification has a V-shaped isolation structure similar to the fifth modification but differs from the same in that an n$^-$-type drift layer (a first semiconductor region) 22 is epitaxially grown on a p-type substrate 83. Compared with the SOI structure, the structure of the sixth modification has better crystal quality to improve the mobility of electrons in the drift layer 22, realize a high-speed operation, and decrease on-resistance. The bottom of the drift layer 22 forms a pn junction isolation (JI) structure and the periphery thereof forms a dielectric isolation (DI) structure.

(Third embodiment)

Figure 30A:
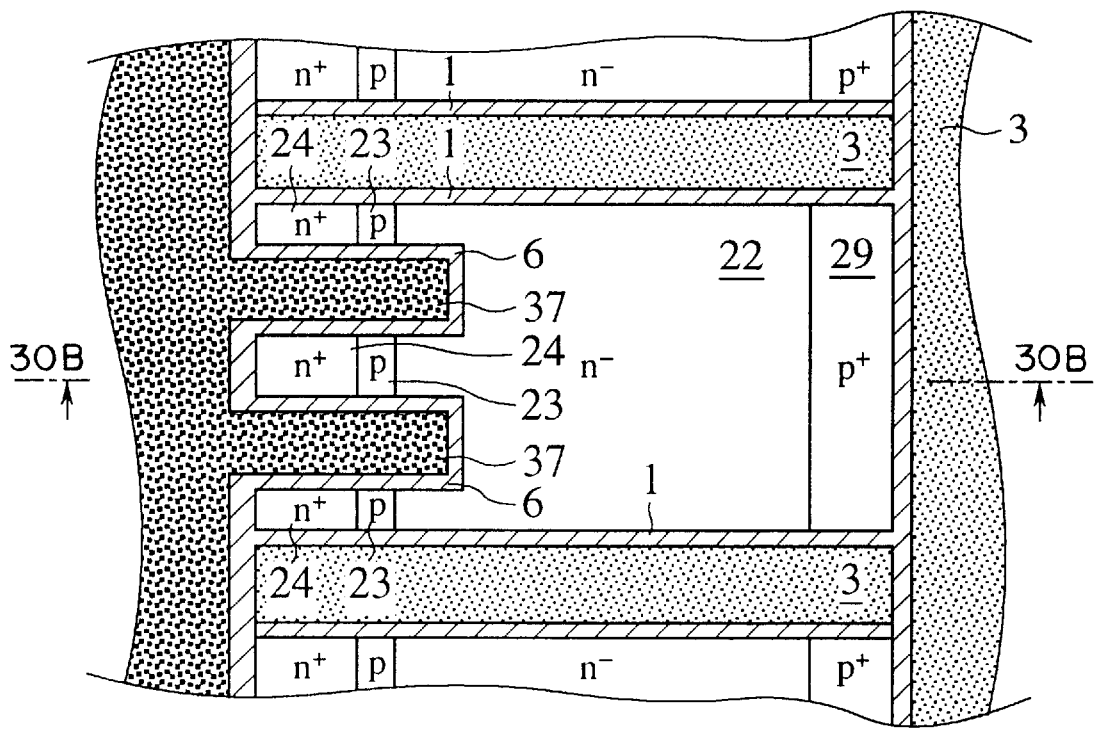
FIG. 30A is a plan view showing an IGBT according to a third embodiment of the present invention.
Figure 30B:
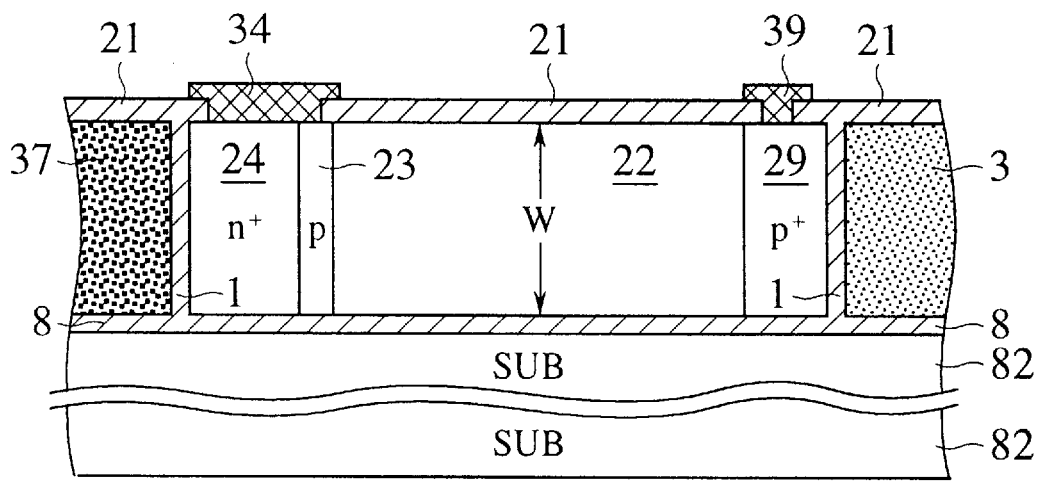
FIG. 30B is a sectional view taken along a line A—A of FIG. 30A.

FIG. 30A is a plan view showing an IGBT according to the third embodiment of the present invention, and FIG. 30B is a sectional view taken along a line A—A of FIG. 30A. An n⁻-type semiconductor layer (a first semiconductor region) 22 is formed on a bottom insulation film 8 made of, for example, an oxide film, to form an SOI substrate. The SOI substrate is formed according to the SDB technique. The semiconductor layer 22 is surrounded by a device isolating trench whose side-walls are each covered with a device isolating insulation film 1. A space defined by the film 1 in the isolation trench is filled with an isolation filler 3, to form a DI structure. Gate trenches are formed through the semiconductor layer 22 up to the bottom insulation film 8. The side-walls of each gate trench are covered with a gate insulation film 6 of 30 to 150 nm thick. A space defined by the film 6 in each gate trench is filled with, for example, DOPOS to form a buried gate electrode 37. The buried gate electrode 37 may be made of refractory metal such as W (tungsten), silicide thereof such as $WSi_2$, $MoSi_2$, $TuiSi_2$, and $CoSi_2$, or polycide thereof. At predetermined position on opposite ends of the same top surface of the semiconductor layer 22, a metal emitter electrode 34 and a metal collector electrode 39 are formed. Under the emitter electrode 34, an n⁺-type emitter layer (a second semiconductor region) 24 is formed. Under the collector electrode 39, a p⁺-type collector layer (a third semiconductor region) 29 is formed. The emitter 24 and collector 29 have each an impurity concentration of about $1 \times 10^{18}$ to $1 \times 10^{21}$ cm⁻³ and reach the bottom insulation film 8. A p-type base layer (a fourth semiconductor region) 23 is formed along an interface between the emitter 24 and the semiconductor layer 22 up to the bottom insulation film 8. The semiconductor layer 22 between the base 23 and the collector 29 is called a drift layer 22.

To turn on the IGBT, the emitter electrode 34 is grounded, a positive voltage is applied to the collector electrode 39, and a positive voltage is applied to the buried gate electrode 37 with respect to the emitter electrode 34. When the positive voltage is applied to the buried gate electrode 37, an inversion channel is formed along the side-walls of the base 23, similar to a MOSFET. As a result, electrons are injected from the emitter 24 into the drift layer 22 through the inversion channel. The injected electrons induce an injection of holes from the collector 29. Namely, the injected electrons from the emitter 24 decrease the barrier height in a pn junction between the collector 29 and the drift layer 22 and the pn junction is forward biased to cause a conductivity modulation in the drift layer 22 by injected holes and electrons. As a result, the device becomes conductive, and the resistance of the drift layer 22, which is originally high, decreases due to the conductivity modulation, to provide low on-resistance characteristics even if the impurity concentration of the n⁻ drift layer 22 is low and even if the distance between the p base 23 and the p⁺ collector 29 is large to increase a breakdown voltage or blocking voltage. To turn off the IGBT, a negative voltage is applied to the buried gate electrode 37 with respect to the emitter electrode 34. When the negative voltage is applied to the buried gate electrode 37, the inversion channel along the side-walls of the p base 23 disappears to stop the injection of electrons from the n⁺ emitter 24. At this time, the n⁻ drift layer 22 still contains electrons. Holes accumulated in the n⁻ drift layer 22 mostly pass through the p base 23 into the emitter electrode 34 and partly recombine with the electrons in the n⁻ drift layer 22, to disappear. Once the holes accumulated in the n⁻ drift layer 22 entirely disappear, the device turns off.

An effective channel width $W_{eff}$ of the IGBT of the third embodiment is determined according to the product of the thickness W of the n⁻ drift layer 22 and the number of channels and is freely chosen in a depth direction even if a chip area is limited. As a result, on-resistance per chip area is very small. Electrons travel through the bulk of the n⁻ drift layer 22 without the influence of surface scattering or surface defects, to improve the mobility of electrons, decrease on-resistance, and increase a switching speed.

Figure 31:
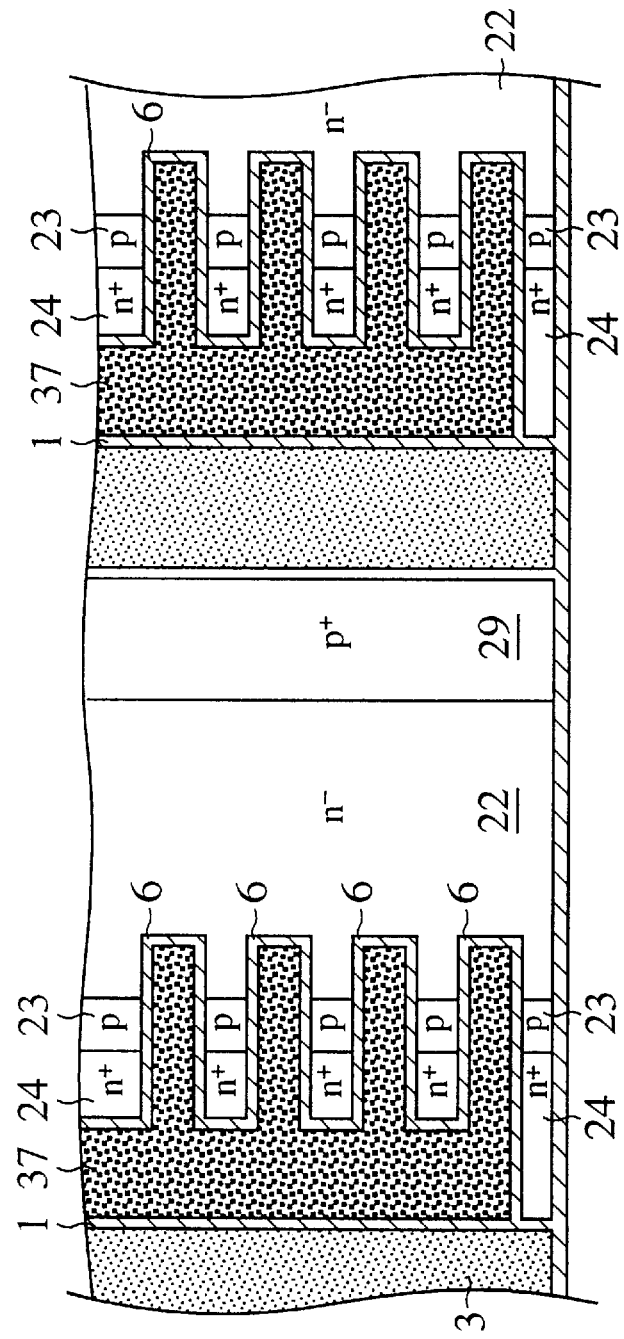
FIG. 31 is a plan view showing adjacent IGBTs according to the third embodiment.

Unlike the conventional vertical IGBTs that pass a main current vertical to the main surface (top surface) of a substrate and distribute the main current in parallel with the main surface with a channel width W being oriented in parallel with the main surface, the IGBT of the present invention passes a main current in parallel with the main surface of a substrate and distributes the main current vertically to the main surface. This characteristic of the present invention is apparent in FIG. 31 that shows unit cells each made of the device of FIG. 30A. Many unit cells are arranged side by side to form a multichannel structure or series connected structure. In FIG. 31, the device isolation filler 3 is on the right side of the collector 29 of a first unit cell, and the buried gate electrode 37 of a second unit cell is formed along the filler 3. A third unit cell (not shown) is arranged adjacent to the second unit cell. In this way, many IGBT unit cells are arranged in a matrix form on a chip, to provide a large current. And it is easy to form a series connection of unit cells to provide a very high blocking voltage device. The conventional vertical IGBTs realize this kind of structure only with a multilayer structure that requires an advanced complicated epitaxial growth technique. Since such an epitaxial growth technique involves a high temperature process accompanied by thermal diffusion effect, it is difficult to fabricate the multilayer structure. On the other hand, the IGBTs of the present invention easily realize the multichannel structure or multi-series connected structures with an effective channel width $W_{eff}$ being optionally set in a direction vertical to the main surface of a substrate. Namely, the effective channel width $W_{eff}$ per chip area of the IGBT of the present invention is very large. To realize a small-power IGBT the single unit cell of FIG. 30A may be used as a discrete device.

Figure 32A:
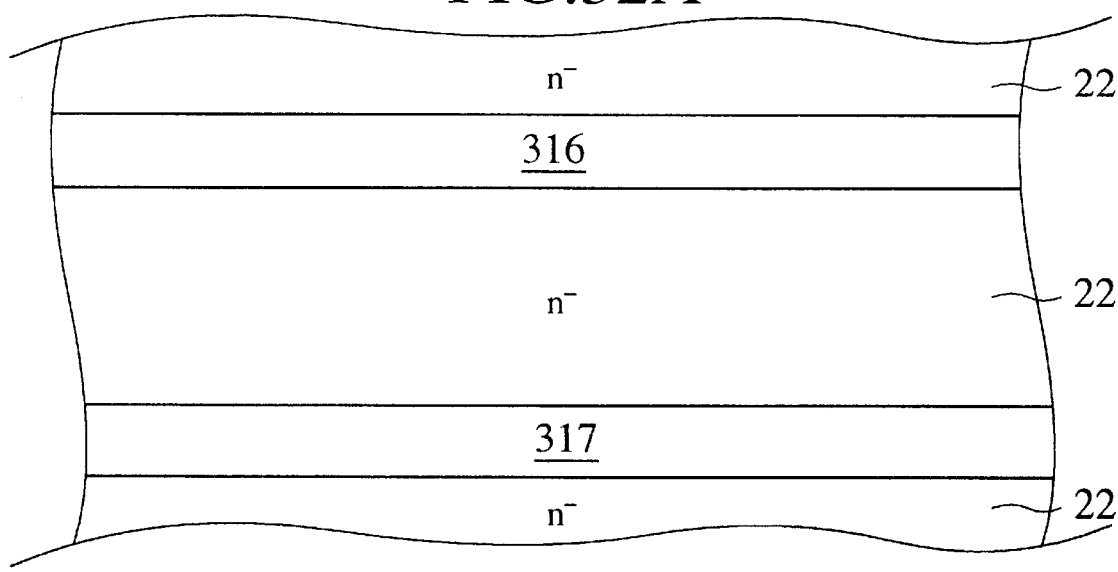
FIGS. 32A to 32E explain the processes of manufacturing the IGBT of the third embodiment.
Figure 32B:
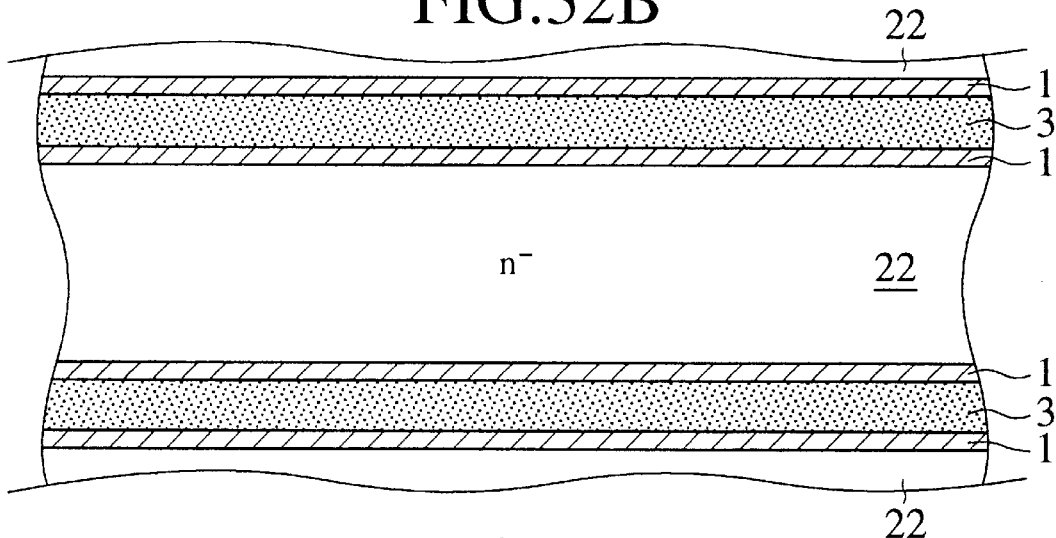
Figure 32C:
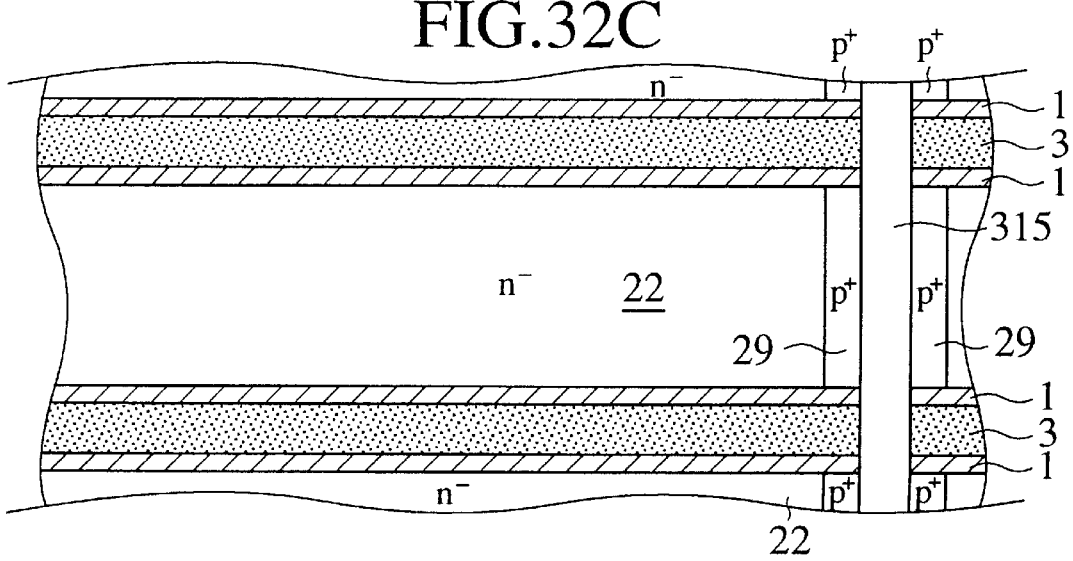
Figure 32D:
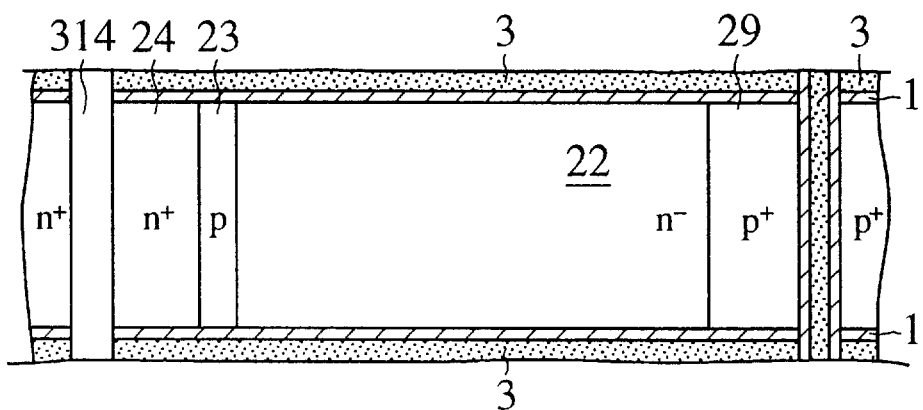
Figure 32E:
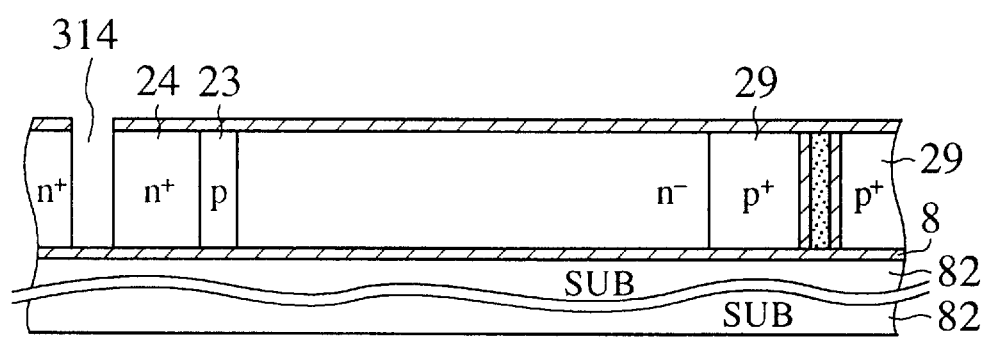

FIGS. 32A to 32E explain the processes of manufacturing the IGBT of the third embodiment.

a) A bottom insulation film 8 is formed on a silicon substrate 82, and an n⁻-type semiconductor layer 22 is formed on the film 8 according to the SDB technique similar to the first embodiment. The surface of the semiconductor layer 22 is thermally oxidized to form an oxide film 21 of 350 to 700 nm thick. Predetermined positions of the oxide film 21 are etched off according to the photolithography and RIE techniques.

b) In FIG. 32A, the oxide film 21 is used as an etching mask to form first and second trenches 316 and 317 up to the bottom insulation film 8 according to the RIE or ECR ion etching technique. In FIG. 32B, a device isolating insulation film 1 is formed, and NDPOS or SIPOS to form an isolation filler 3 is deposited.

c) In FIG. 32C, a third trench 315 is formed up to the bottom insulation film 8 according to the photolithography and RIE techniques. The side-walls of the trench 315 are used as diffusion windows to horizontally diffuse p-type impurities such as boron (B) to form a p⁺-type collector layer 29.

d) A device isolating insulation film 1 is formed on the side-walls of the trench 315. Namely, a borosilicate glass (BSG) film formed on the surface of the side-walls during the diffusion process of boron is removed to expose the surface of the silicon substrate, and the film 1 is formed again according to the thermal oxidization technique on the surface of the trench side-walls. On the film 1, NDPOS is deposited to fill the trench 315 according to the CVD technique. In FIGS. 32D and 32E, a fourth trench 314 is formed up to the bottom insulation film 8. The side-walls of the trench 314 are used as diffusion windows to horizontally diffuse boron (B), and a heat treatment is carried out to form a p-type base layer 23. A BSG film formed on the diffusion window during the diffusion process of boron is removed to open a diffusion window to horizontally diffuse n-type impurities such as phosphorus (P), arsenic (As), antimony (Sb), etc., to form an $n^+$-type emitter layer 24 as shown in FIGS. 32D and 32E. Boron (B) having a large diffusion coefficient and arsenic (As) having a small diffusion coefficient may simultaneously be diffused and heat-treated, to form the base 23 and emitter 24. In any case, the p base 23 and $n^+$ emitter 24 are evenly horizontally formed up to the bottom insulation film 8 as shown in FIG. 32E. At this time, the $p^+$ collector 29 is horizontally diffused farther from the position of FIG. 32C.

e) A comb-like gate trench is formed beyond the base 23 into the semiconductor layer 22 as shown in FIG. 30A. A gate insulation film 6 is formed on the side-walls of the gate trench, and DOPOS is deposited to form a buried gate electrode 7.

f) A metal emitter electrode 34 is formed to short-circuit the $n^+$ emitter 24 to the p base 23, and a metal collector electrode 39 is formed on the $p^+$ collector 29 as shown in FIG. 30B. This completes the IGBT of the third embodiment.

The $p^+$ collector 29, p base 23, and $n^+$ emitter 24 may be formed according to an oblique ion implantation technique. In this case, the trenches 315 and 314 are simultaneously formed. A photoresist mask is used to selectively implant ions $^{11}B^+$ to the trench 315 and ions $^{11}B^+$ and $^{75}As^+$ to the trench 314. The trenches 315 and 314 are annealed and are simultaneously filled with an isolation filler 3.

The third embodiment is not limited to the structure of FIGS. 30A and 30B. Various modifications are possible.

(EXAMPLE 3-1)

Figure 33A:
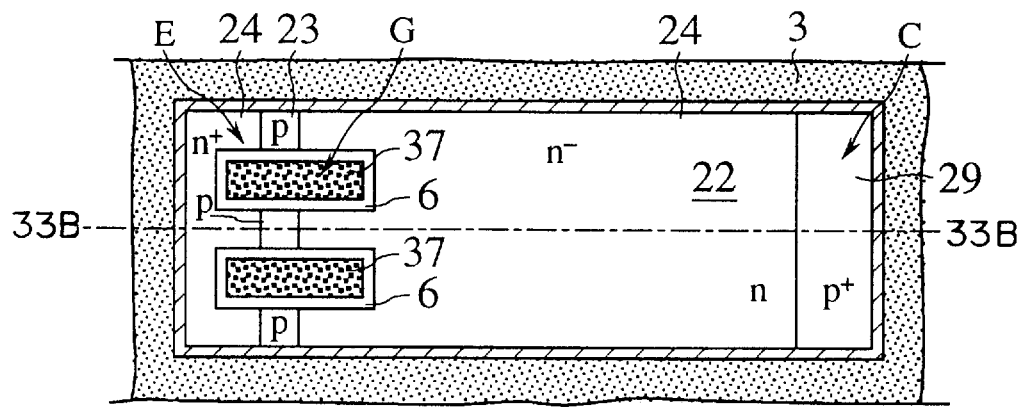
FIG. 33A is a plan view showing an IGBT according to a first modification of the third embodiment.
Figure 33B:
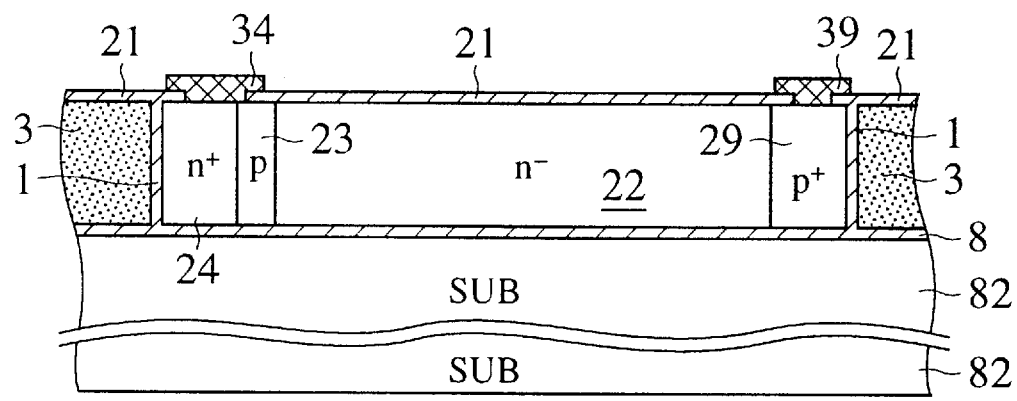
FIG. 33B is a sectional view taken along a line A—A of FIG. 33A.

FIG. 33A is a plan view showing an IGBT according to the first modification of the third embodiment, and FIG. 33B is a sectional view taken along a line A—A of FIG. 33A. This modification employs independent gate trenches each having a gate insulation film 6 and a buried gate electrode 37. The buried gate electrodes 37 are connected to each other with surface wiring metal. Unlike the structure of FIG. 30A that employs the separate $n^+$-type emitter layers 24, the first modification employs a common comb-like $n^+$-type emitter layer 24. The gate trenches are deep to reach a bottom insulation film 8, and a channel width $W_{eff}$ is vertical to the surface of a substrate. Accordingly, the effective channel width is freely extendible without regard to the surface area of the substrate, to reduce on-resistance and increase a current.

Figure 34A:
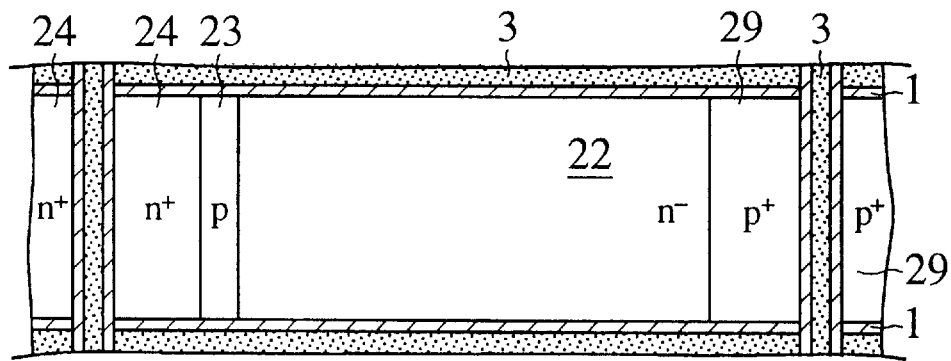
FIGS. 34A and 34B are plan and sectional views explaining thee processes of manufacturing the IGBT of the first modification of the third embodiment.
Figure 34B:
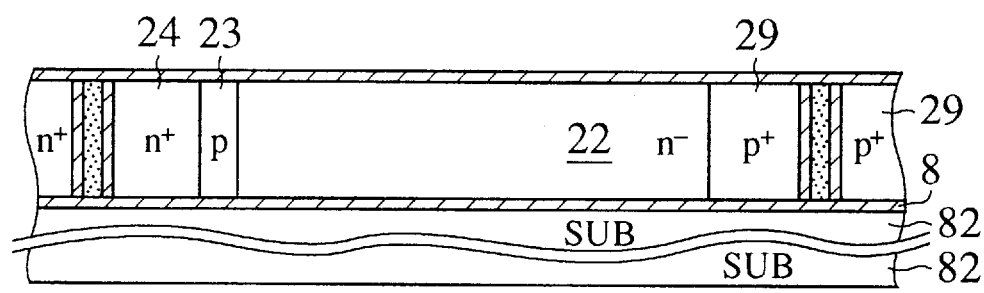

FIGS. 34A and 34B explain the processes of manufacturing the IGBT of the first modification.

a) A p-type base region 23, an $n^+$-type emitter layer 24, and a $p^+$-type collector layer 29 are formed in an $n^-$ semiconductor layer 22 having SOI structure according to the processes of FIGS. 32A to 32E of the third embodiment.

b) The surfaces (side walls) of the trenches 314 and 315 used as diffusion windows to form the $n^+$ emitter 24, p base 23 and $p^+$ collector 29 are thermally oxidized to form device isolating oxide films 1. A space defined by the film 1 in each of the trenches is filled with, for example, NDPOS according to the CVD technique, to form an isolation filler 3 as shown in FIGS. 34A and 34B.

c) Gate trenches are formed up to the bottom insulation film 8. The side-walls of each gate trench are covered with a gate insulation film 6, and a space defined by the film 6 in each gate trench is filled with, for example, DOPOS to form a buried gate electrode 37. This completes the structure of FIGS. 33A and 33B.

(EXAMPLE 3-2)

Figure 35A:
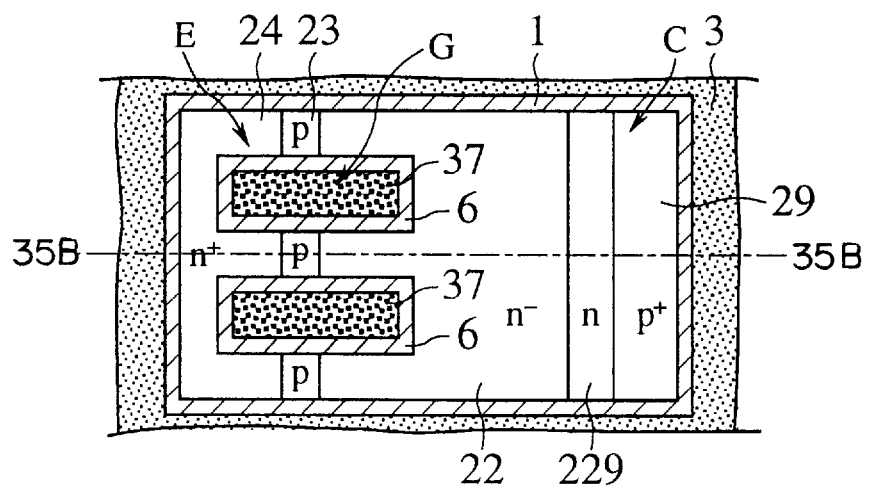
FIG. 35A is a plan view showing an IGBT according to a second modification of the third embodiment.
Figure 35B:
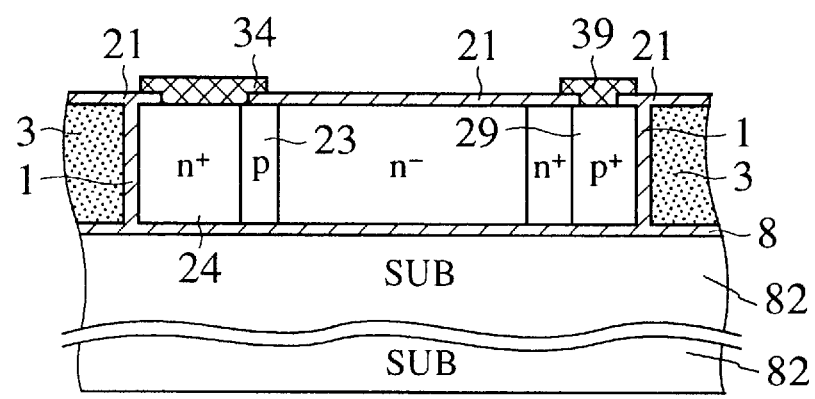
FIG. 35B is a sectional view taken along a line A—A of FIG. 35A.

FIG. 35A is a plan view showing an IGBT according to the second modification of the third embodiment, and FIG. 35B is a sectional view taken along a line A—A of FIG. 35A. This modification forms an $n^+$-type buffer layer (fifth semiconductor region) 229 in front of a $p^+$-type collector layer 29, so that no punch-through occurs between the collector 29 and a p-type base layer 23, to thereby improve a collector breakdown voltage or blocking voltage. Compared with the IGBT of FIG. 33A, an $n^-$-type drift layer 22 between the base 23 and the collector 29 is shorter to improve an operation speed and decrease on-resistance. The structure shown by FIGS. 35A and 35B is a mere example. The IGBT having $n^+$ buffer layer 229 is also formed by JI structure. The $n^-$ semiconductor layer ($n^-$ drift layer) 22 may be formed on p-type semiconductor layer instead of the bottom insulation film 8 shown in FIG. 35B.

(EXAMPLE 3-3)

Figure 36A:
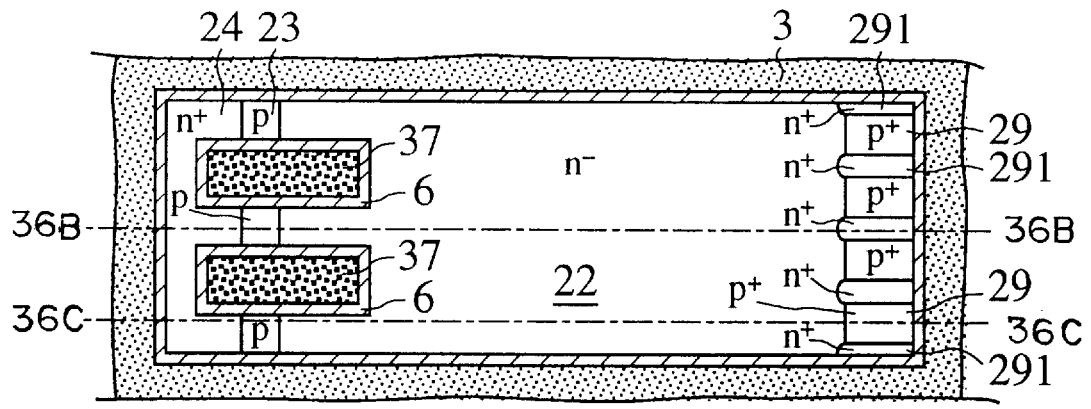
FIG. 36A is a plan view showing an IGBT according to a third modification of the third embodiment.
Figure 36B:
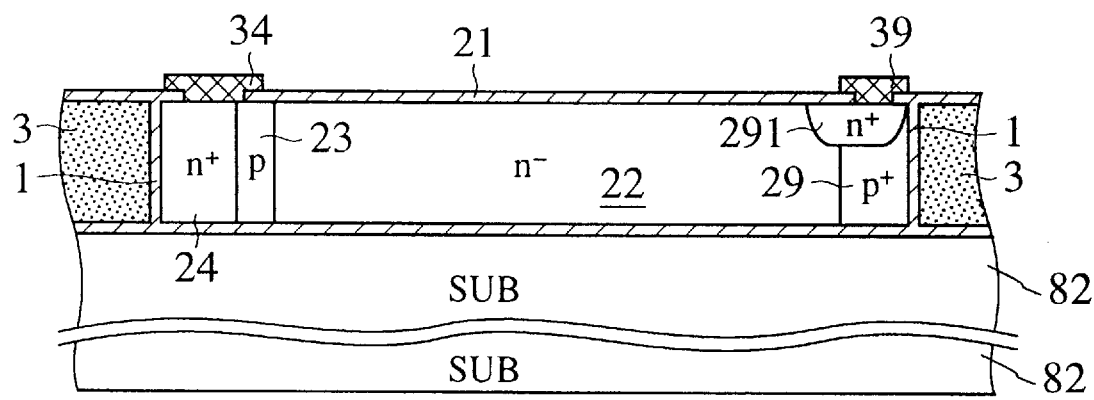
FIG. 36B is a sectional view taken along a line A—A of FIG. 36A.
Figure 36C:
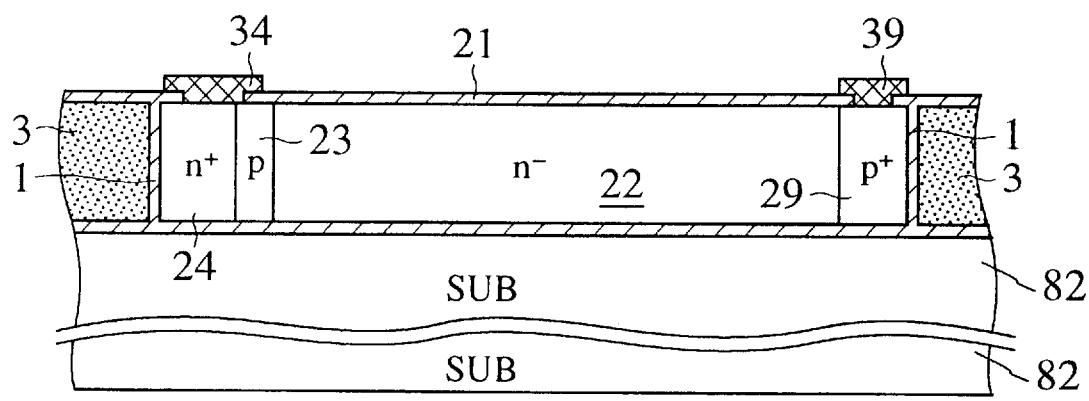
FIG. 36C is a sectional view taken along a line B—B of FIG. 36A.

FIG. 36A is a plan view showing an IGBT according to the third modification of the third embodiment, FIG. 36B is a sectional view taken along a line A—A of FIG. 36A, and FIG. 36C is a sectional view taken along a line B—B of FIG. 36A. This IGBT has "a collector short structure" with an $n^+$-type short region (fifth semiconductor region) 291 being formed adjacent to a $p^+$-type collector layer 29 and with a metal collector electrode 39 short-circuiting the $p^+$ collectors 29 to the no short regions 291. According to a standard IGBT, a gate is put in a reverse biased state to eliminate an inversion channel in a p base layer 23. At this time, electrons are still present in an $n^-$ drift layer 22, and therefore, a $p^+$ collector layer 29 still injects holes into the $n^-$ drift layer 22, so that the IGBT may not be turned off at once. Namely, a tail current exists until the electrons and holes recombine with each other and disappear, to thereby extend a turn-off period. According to the third modification, electrons remaining in the drift layer 22 are drawn through the $n^+$ short regions 291, to speedily turn off the device. The no short regions 291 may be formed up to a bottom insulation film 8. For easy manufacturing, the $n^+$ short regions 291 may be formed adjacent to the surface of the device as shown in FIG. 36B without deteriorating the effect thereof.

(EXAMPLE 3-4)

Figure 37A:
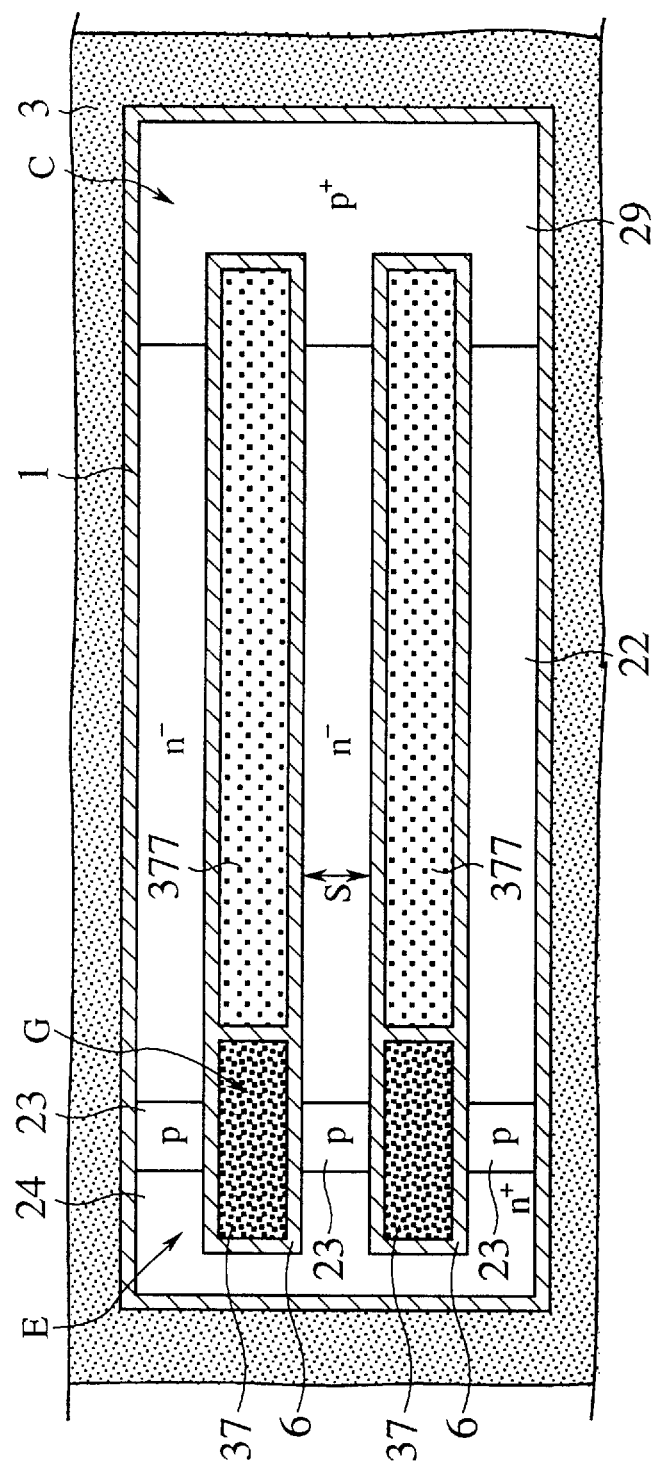
FIGS. 37A and 37B are plan views showing IGBTs according to a fourth modification of the third embodiment.

FIG. 37A is a plan view showing an IGBT according to the fourth modification of the third embodiment. Gate trenches are in contact both with an $n^+$ emitter layer 24 and a p-type collector layer 29. In each of the gate trenches, a buried gate electrode 37 made of DOPOS is formed only in the vicinity of a p base layer 23. The remaining part of each gate trench is filled with NDPOS to form an insulation region 377. A cross section (not shown) of this IGBT is the same as that of FIG. 30B, and a channel width is equal to the thickness W of an $n^-$ drift layer 22.

For the entire extension of the n⁻ drift layer 22, a spacing S between the gate insulation films 6 of a pair of the gate trenches is narrow compared with the channel width W. A spacing between the outer gate insulation film 6 and a device isolating insulation film 1 is equal to the spacing S. This structure decreases the effective volume of an active region of the IGBT, to eliminate surplus carriers when the IGBT is turned off. This reduces reverse recovery charge $Q_{rr}$, to shorten a turn-off time and improves a switching speed. The accuracy of the spacing S is determined to allow the use of a standard photolithography technique. Accordingly, the $Q_{rr}$ is reduced without deteriorating mechanical strength or without causing crystal defects. For example, the channel width W, i.e., the thickness W of the drift layer 22 is 5 to 20 μm and S=1.5 μm to 5 μm, to form the high-speed IGBT without employing a life time control technique that involves complicated and low-controllability processes such as proton irradiation, electron beam irradiation, or diffusion of heavy metal such as Pt and Au.

Figure 37B:
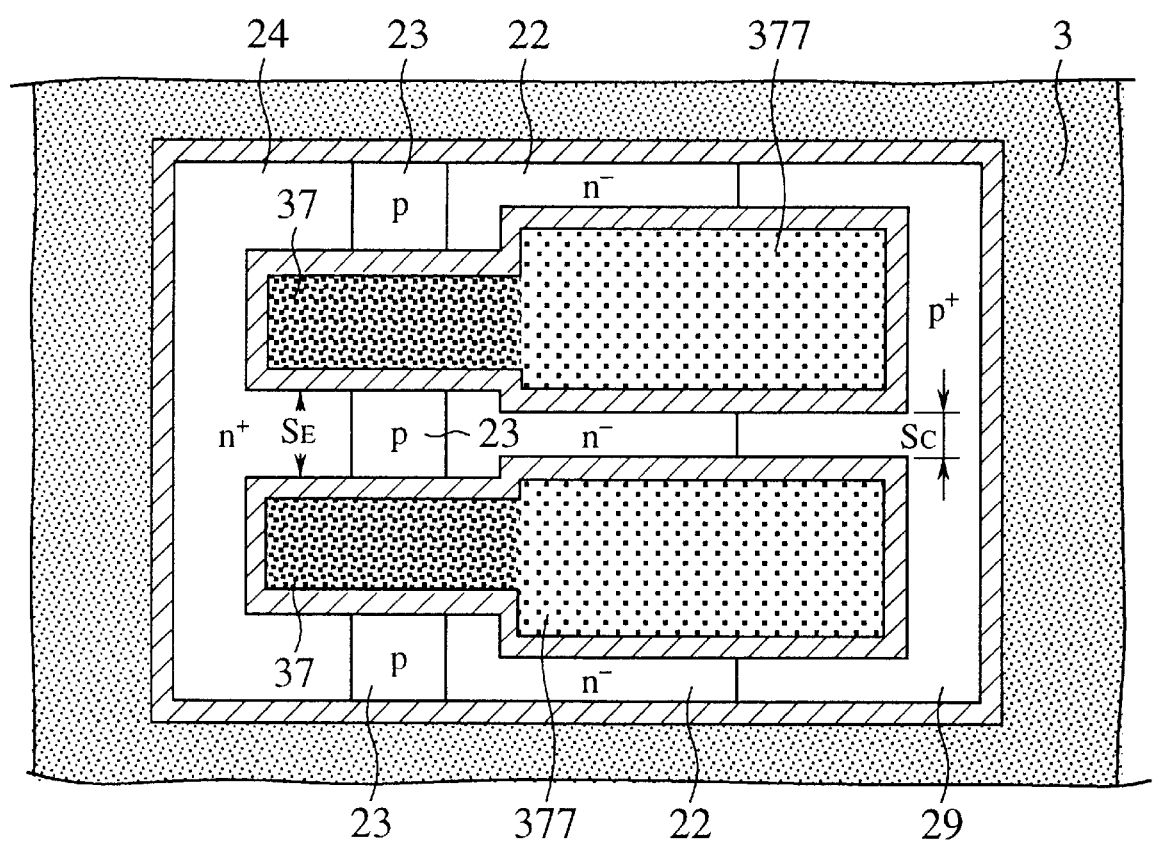

According to the fourth modification, a spacing $S_E$ between the gate trenches in the vicinity of the n⁺ emitter 24 may be wider than a spacing $S_c$ between the same gate trenches in the vicinity of the p⁺ collector 29 as shown in FIG. 37B, to further reduce surplus carriers and improve a switching speed. An insulation film between the DOPOS 37 and the NDPOS 377 of FIG. 37A is omitted in FIG. 37B. This omission is also applicable to FIG. 37A. In this case, each gate trench is first filled with the NDPOS 377, and ions such as boron ($^{11}B^+$) are selectively implanted in the vicinity of the p base 23.

(EXAMPLE 3-5)

Figure 38A:
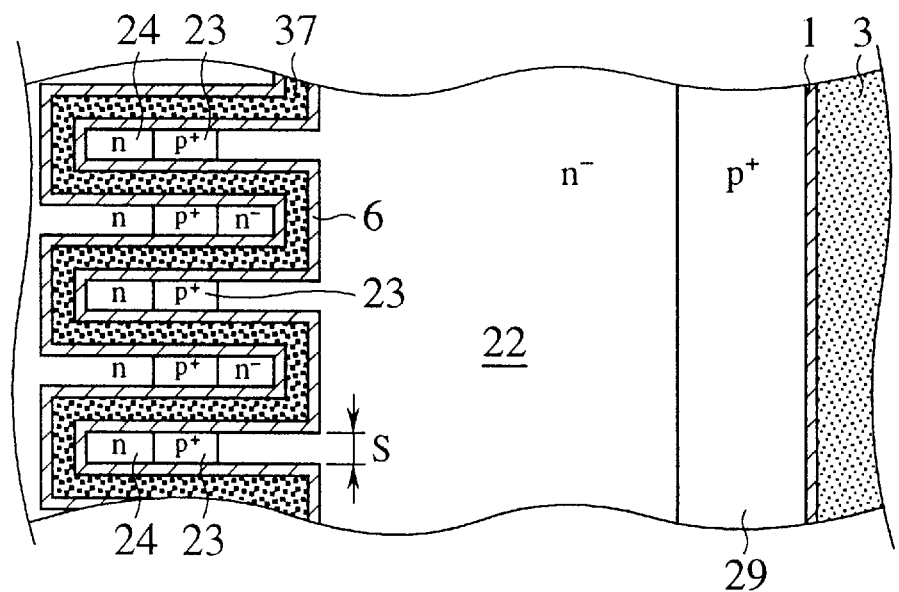
FIGS. 38A and 38B are an views showing IGBTs according to a fifth modification of the third embodiment.
Figure 38B:
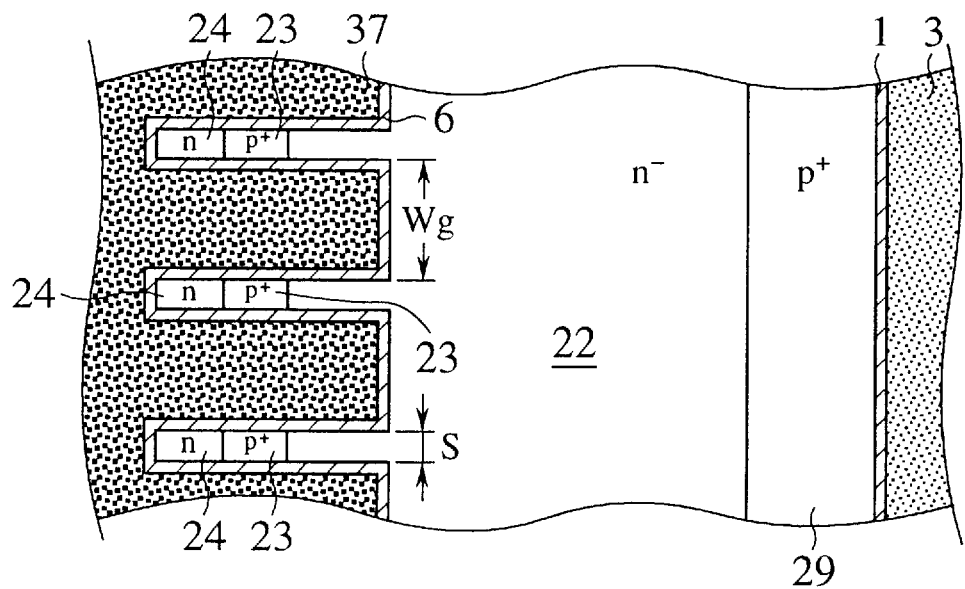

FIG. 38A is a plan view showing an IGBT according to the fifth modification of the third embodiment. This device corresponds to an injection enhanced gate transistor (IEGT). The area of a p base layer 23 is actively reduced. In the IGBT, the p base layer 23 is a path of minority carriers. As the quantity of minority carriers to be accumulated per unit area increases, a saturation voltage decreases due to a conductivity modulation. A zigzag winding gate trench of FIG. 38A partly makes the p base 23 inactive, to thereby reduce the width S of the p base 23. A structure of FIG. 38B is effective to reduce the width of the p base 23. It is difficult, however, to fill a wide deep trench with DOPOS. Accordingly, the regularly winding narrow trench of FIG. 38A is easier to manufacture. The structures of FIGS. 38A and 38B are both effective to decrease a saturation voltage and on-resistance.

(EXAMPLE 3-6)

Figure 39A:
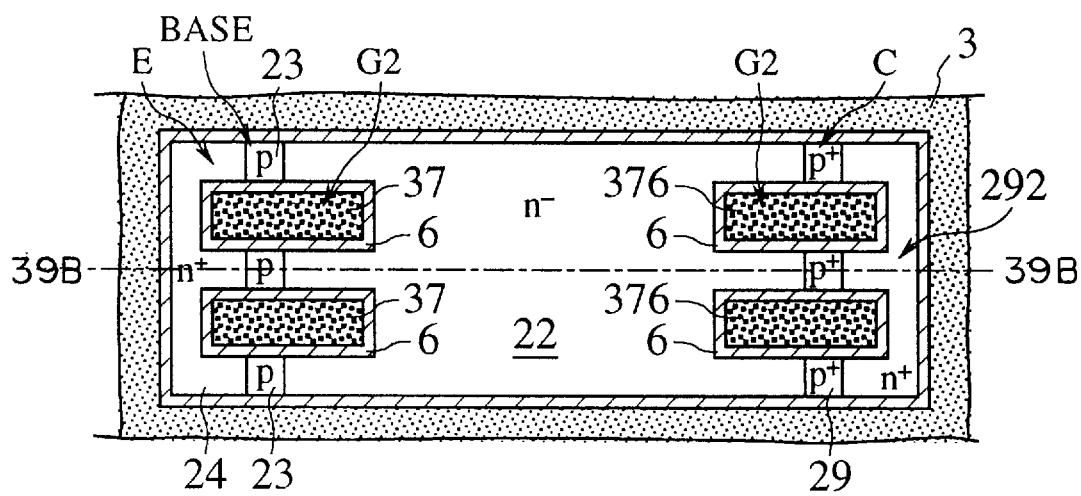
FIGS. 39A and 39B are plan and sectional views showing a double gate IGBT according to a sixth modification of the third embodiment.
Figure 39B:
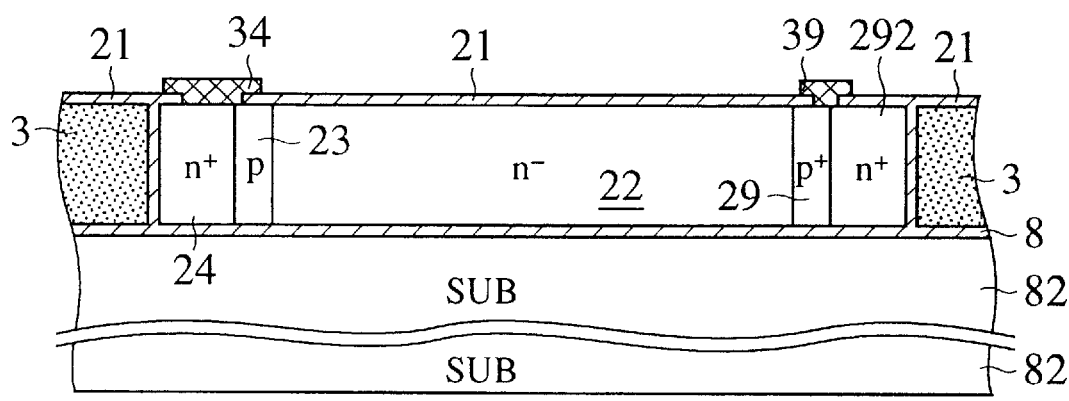

FIG. 39A is a plan view showing a double gate IGBT according to the sixth modification of the third embodiment, and FIG. 39B is a sectional view taken along a line A—A of FIG. 39A. An n⁺ collector region (a fifth semiconductor region) 292 is adjacent to a p⁺ collector layer (a third semiconductor region) 29. Second gate trenches are formed in the p⁺ collector 29 and n⁺ collector 292. The side-walls of each of the second gate trenches are covered with a gate insulation film 6. A space defined by the film 6 in each second gate trench is filled with DOPOS to form a second buried gate electrode 376. The n⁺ collector 292, an n⁻ drift layer 22, and the second buried gate electrodes 376 form an n-channel MOSFET on the collector side. When the IGBT is turned off, surplus electrons in the n⁻ drift layer 22 are forcibly drawn by the n⁺ collector 292, to speed up the turn-off operation.

(Fourth embodiment)

Figure 40A:
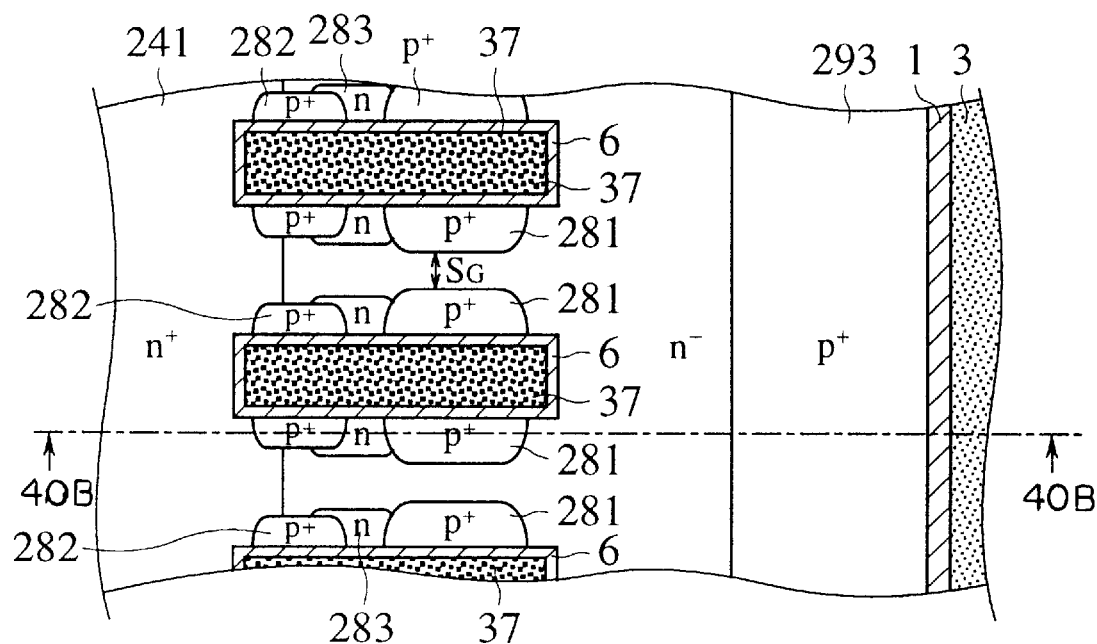
FIGS. 40A and 40B are plan and sectional views showing an MCSITH according to a fourth embodiment of the present invention.
Figure 40B:
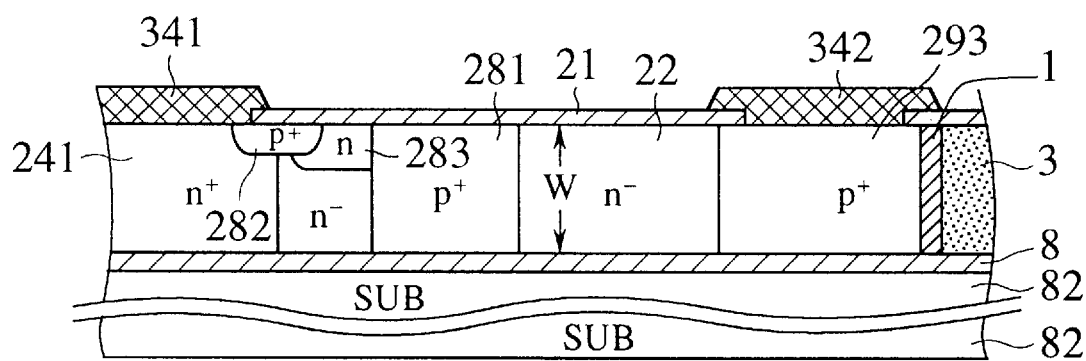
Figure 41A:
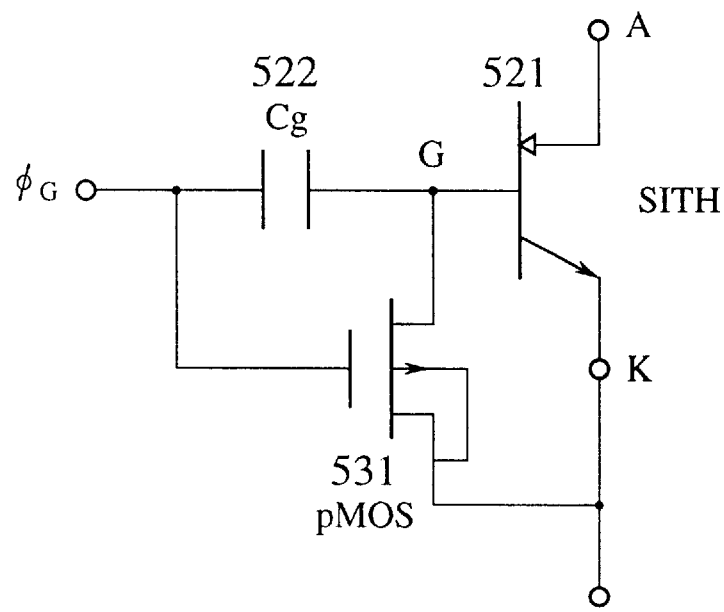
FIG. 41A is an equivalent circuit of the MCSITH of the fourth embodiment.

FIG. 40A is a plan view showing a MOS-controlled SITH (MCSITH) according to the fourth embodiment of the present invention, FIG. 40B is a sectional view taken along a line A—A of FIG. 40A, and FIG. 41A is an equivalent circuit of the MCSITH. An n⁻-type semiconductor layer (a first semiconductor region) 22 is formed on a bottom insulation film 8 to form an SOI structure. An n⁺-type cathode layer (a second semiconductor region) 241, p⁺-type gate region (a fourth semiconductor region) 281, and p⁺-type anode layer (a third semiconductor region) 293 are formed up to the bottom insulation film 8. The n⁺ cathode 241 and p⁺ anode 293 are made by horizontally diffusing impurities from diffusion windows, i.e., the side-walls of each device isolating trench, similar to the third embodiment. The p⁺ gate region 281 is formed by making a diffusion trench at a required position up to the bottom insulation film 8 and by horizontally diffusing impurities from the side-walls of the diffusion trench. A p⁺-type auxiliary cathode region (a fifth semiconductor region) 282 is formed by diffusing impurities from the top surface of the substrate adjacent to the n⁺ cathode 241. Between the p⁺ auxiliary cathode 282 and the p⁺ gate region 281, an n-type well (a sixth semiconductor region) 283 is formed. After forming the p⁺ gate regions, gate trenches fully containing the diffusion trenches are formed up to the bottom insulation film 8. Due to the gate trenches, the diffusion trenches disappear. The side-walls of each gate trench are covered with a gate insulation film 6, and a space defined by the film 6 in each gate trench is filled with a buried gate electrode 37. The p⁺ auxiliary cathode 282 serves as a drain, and the p⁺ gate region 281 serves as a source, to form a pMOS transistor 531 of FIG. 41A. In FIG. 41A, the MCSITH has a turn-on capacitor (Cg) 522 directly connected to the p⁺ gate region 281 of the SITH. The pMOS transistor 531 is connected between the p⁺ gate region 281 and the n⁺ cathode 241. The buried gate electrode 37 is made of DOPOS, or silicide of refractory metal such as $WSi_2$ and $TiSi_2$, or refractory metal such as W and Mo. The buried gate electrode 37 serves as a gate electrode of the pMOS transistor 531 and an electrode of the capacitor (Cg) 522 of the SITH. Namely, the buried gate electrode 37, gate insulation film 6 such as an oxide film, and p⁺ gate region 281 form the slab (parallel plate) capacitor (Cg) 522 on the side wall of the gate trench. The larger the capacitance of the capacitor (Cg) 522, the shorter the turn-on time of the SITH. If the capacitance of the capacitor (Cg) 522 is too large, carriers accumulated at around the p⁺ gate regions 281 of the SITH are excessive to extend a turn-off time. Accordingly, there is an optimum capacitance of the capacitor (Cg) 522, to shorten both the turn-on and turn-off times. The optimum capacitance is about 10 to 80 times as large as the gate-cathode capacitance $C_{GK}$ of the gate region of the SITH. Accordingly, the insulation film 6 along the side wall of the gate region 281 must be thinner than 100 nm, preferably 7 to 20 nm.

A cathode electrode 341 made of metal such as Al connects the n⁺ cathode 241 to the p⁺ auxiliary cathode 282. An anode electrode 342 made of metal such as Al is formed on the p⁺ anode 293. The main thyristor 521 of the MCSITH must be a normally-off SITH. Accordingly, a spacing $S_G$ between the adjacent p⁺ gate regions 281 and the impurity concentration of the n⁻ semiconductor layer 22 are selected so that the n⁻ semiconductor layer 22 is pinched off by depletion layers extended from the p⁺ gate regions 281 with a gate bias voltage of zero. The impurity concentration of the semiconductor layer 22 is low, for example, about $10^{11}$ to $10^{13}$ cm⁻³, and that of the n-well region 283 is about $10^{16}$ cm$^{-3}$. Consequently, no punch-through current flows between the source and drain of the pMOS transistor 531 even if the SI thyristor is of the normally-off type and the gate length L of the pMOS transistor 531 is shorter than 2 μm. When the impurity concentration of the n-well region 283 is about 10$^{18}$ cm$^{-3}$, the pMOS transistor 531 may have a gate of submicron order, to greatly reduce on-resistance as well as a leakage current due to a punch-through current of the pMOS transistor 531. The impurity concentration of the p$^+$-type regions 282, 281, and 293 is about 10$^{18}$ to 10$^{20}$ cm$^{-3}$, and that of the n$^+$ cathode 241 is about 10$^{18}$ to 10$^{21}$ cm$^{-3}$.

To turn off the MCSITH of the fourth embodiment, a positive voltage is applied to the buried gate electrode 37, to decrease a potential barrier height formed in a channel in the n$^-$ semiconductor layer 22 through the capacitor (Cg) 522 connected to the gate region 281 with the use of capacitive coupling (static induction effect). As a result, electrons are injected from the n$^+$ cathode 241. The channel of the MCSITH is formed in the n$^-$ semiconductor layer 22 between the adjacent p$^+$ gate regions 281.

The injected electrons are accumulated around an interface between the n$^-$ semiconductor layer 22 and the p$^+$ anode 293. As a result, a potential barrier against holes of the p$^+$ anode 293 disappears, and the holes are injected from the p$^+$ anode 293. These holes promote an injection of electrons from the n$^+$ cathode 241, to thereby turn on the SI thyristor. The pMOS transistor 531 formed between the p$^+$ auxiliary cathode 282 and the p$^+$ gate region 281 may be of a depletion type. In this case, the pMOS transistor 531 is in a blocking state when a positive voltage is applied to the buried gate electrode 37.

When a voltage of zero is applied to the buried gate electrode 37, the pMOS transistor 531 becomes conductive, so that holes are drawn by the cathode electrode 341 through the p$^+$ gate region 281, and a potential barrier against electrons in front of the n$^+$ cathode 241 rises to turn off the SI thyristor.

Figure 41B:
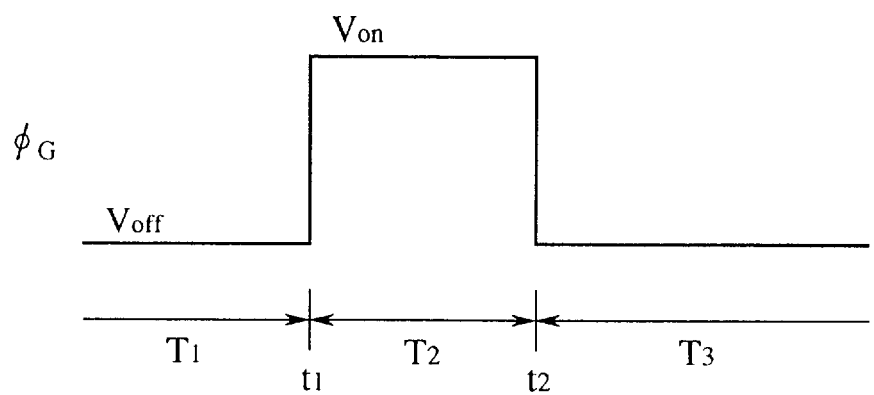
FIG. 41B is a waveform showing a gate drive pulse of the MCSITH of the fourth embodiment.

FIG. 41B shows a waveform of a gate drive pulse $\phi_G$ of the MCSITH. As shown in FIG. 41A, the gate of the normally-off SITH 521 is connected to the gate capacitor 522, and the pMOS transistor 531 is connected between the gate and the cathode. The gate of the pMOS transistor 531 is controlled by the pulse $\phi_G$, which is an input pulse to the gate capacitor 522. In period T1 of FIG. 41B, the pulse $\phi_G$ is at a potential of V$_{off}$ that makes the pMOS transistor 531 conductive. At this time, the gate and cathode of the SITH 521 are at the same potential to establish a blocking state. At time t1, the pulse $\phi_G$ changes from V$_{off}$ to V$_{on}$, and the potential of the gate of the SITH 521 increases due to capacitive coupling. When the pulse $\phi_G$ is at V$_{on}$, the pMOS transistor 531 is in a blocking state. The normally-off SITH 521 changes from the blocking state to a conducting state in response to a small voltage corresponding to a diffusion potential between the gate and cathode of the SITH 521. At this time, a gate current is required only to charge an input capacitance of the gate, so that there is no need to provide a direct current. In a period T2, the SITH 521 is in a conducting state. At time t2, the pulse $\phi_G$ changes from V$_{on}$ to V$_{off}$, and the pMOS transistor 531 again in a conducting state to put the SITH 521 in a blocking state.

The effective channel width W$_{eff}$ of the MCSITH of the fourth embodiment is determined by the product of the thickness W (FIG. 40B) of the semiconductor layer 22 and the number of channels. Accordingly, the effective channel width W$_{eff}$ is freely selected in a depth direction vertical to the surface of the substrate even if a chip area is limited. The fourth embodiment, therefore, is capable of reducing on-resistance per chip area. Electrons effectively travel through the bulk of the semiconductor layer 22 without the influence of surface scattering or surface defects. Consequently, the mobility of electrons improves, on-resistance decreases, and a switching speed increases. An on-voltage of a MOS composite device such as the MCSITH is determined by the on-voltage of a main device. Namely, a main device of the MCSITH is the SITH, which is basically an nip diode. Unlike another switching device such as an IGBT having an npnp four-layer structure, the SITH has a smaller number of pn junctions to involve a low on-voltage theoretically. The channel width that is vertical to the top surface of the substrate of the fourth embodiment is effective to greatly decrease the on-voltage.

(EXAMPLE 4-1)

Figure 42A:
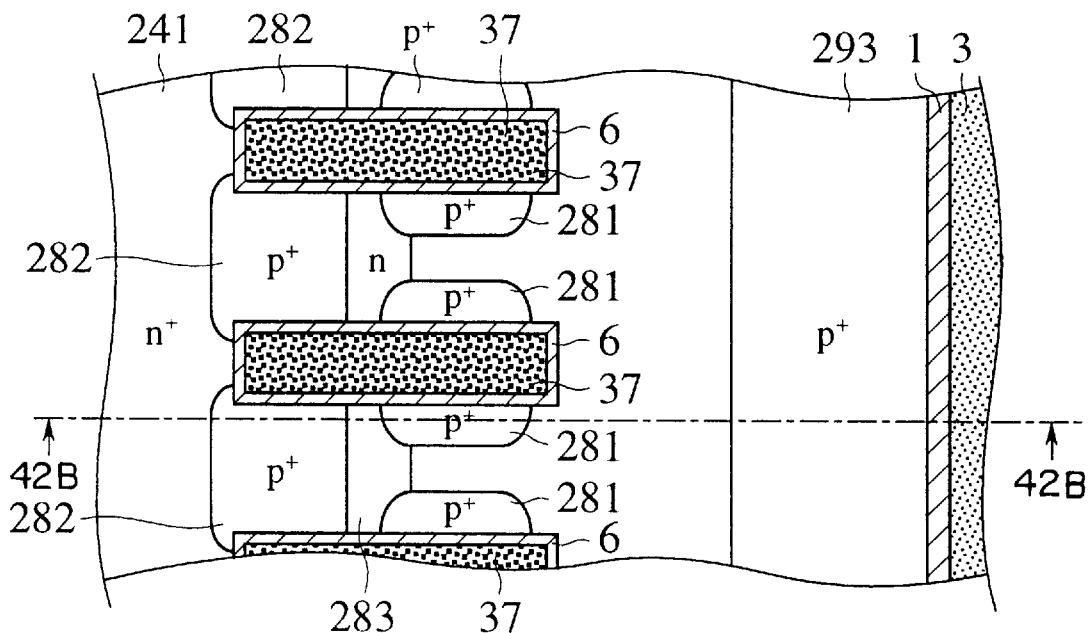
FIGS. 42A and 42B are plan and sectional views showing an MCSITH according to a modification of the fourth embodiment.
Figure 42B:
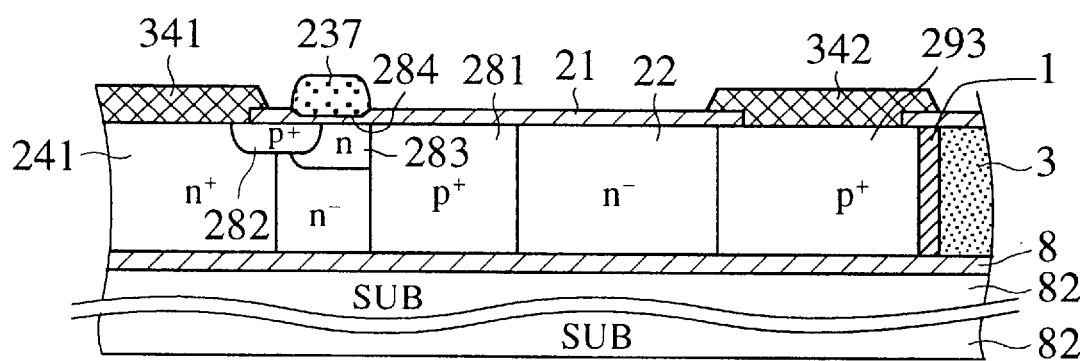

FIG. 42A is a plan view showing an MCSITH according to the first modification of the fourth embodiment, and FIG. 42B is a sectional view taken along a line A—A of FIG. 42A. This MCSITH is easy to manufacture. A pMOS transistor is formed on the top surface of a substrate between an n$^+$-type cathode layer 241 and a p$^+$-type gate region 281. The distribution of a channel of an SITH serving as a main device is vertical to the top surface of the substrate, to decrease on-resistance. Accordingly, there is no problem even if the resistance of the pMOS transistor through which a current passes during a turn-off operation is high. A p$^+$-type auxiliary cathode region 282 is formed adjacent to the n$^+$ cathode 241, and an n-type well 283 is formed between the p$^+$ auxiliary cathode 282 and the gate region 281 similar to FIGS. 40A and 40B. As is apparent from the comparison of FIG. 42A with FIG. 40A, the p$^+$ auxiliary cathode 282 and n-well 283 of FIG. 42A are wider than those of FIG. 40A. A gate oxide film 284 of the pMOS transistor is formed on the top surface of the substrate and on which a surface gate electrode 237 is formed. The surface gate electrode 237 is connected to a buried gate electrode 37. This structure has a pattern margin for a photolithography process, and a channel doping ion implantation process is easily made to the top surface of the n-well 283. Accordingly, the threshold of the pMOS transistor is easy to control. As a result, the MCSITH is driven with a small gate voltage.

(Fifth embodiment)

Figure 43A:
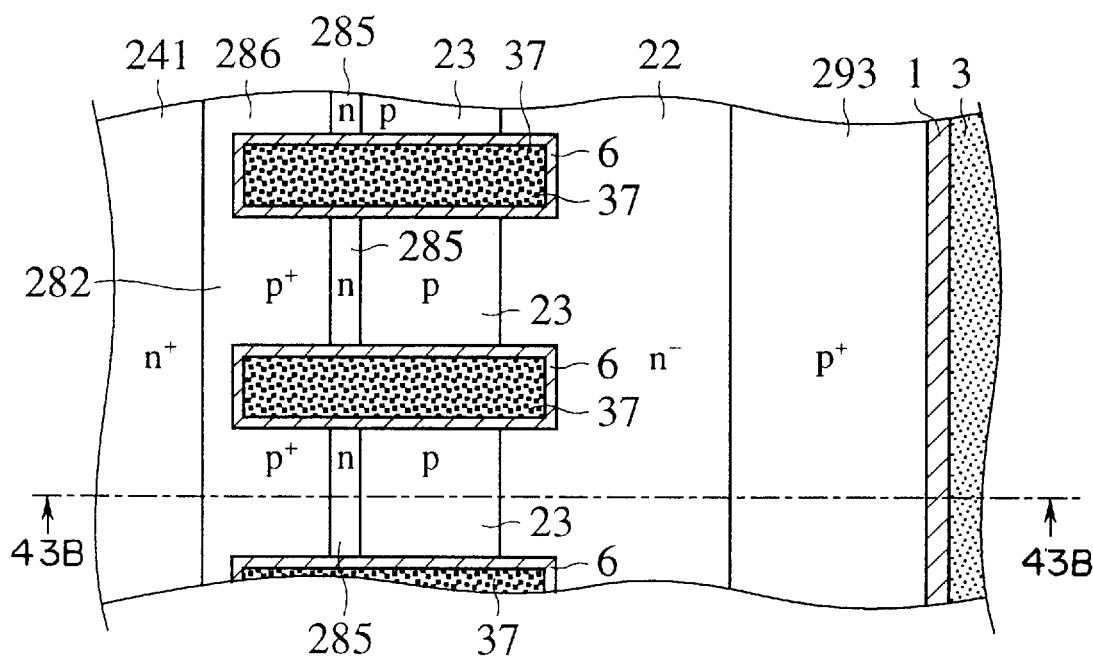
FIGS. 43A and 43B are plan and sectional views showing an MCT according to a fifth embodiment of the present invention.
Figure 43B:
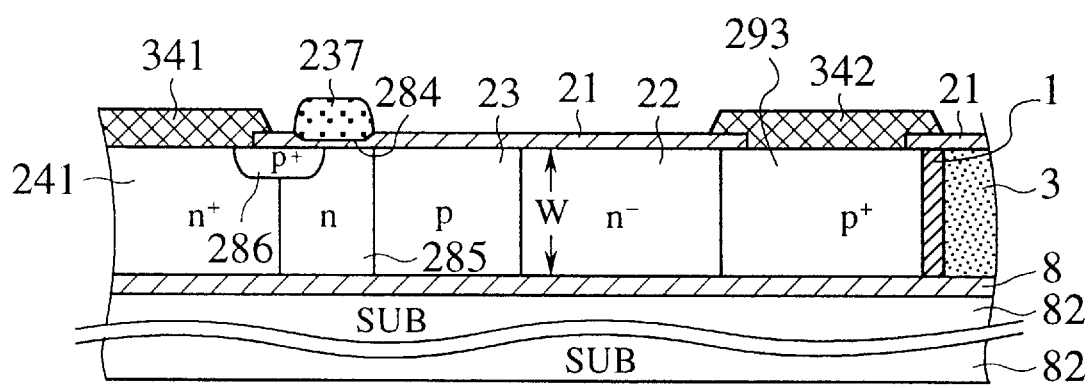

The third and fourth embodiments relate to IGBTs and MCSITHs. The present invention is applicable to MOS-controlled thyristors (MCTs) that are MOS composite semiconductor devices similar to the IGBTs. FIG. 43A is a plan view showing an MCT according to the fifth embodiment of the present invention, and FIG. 43B is a sectional view taken along a line A—A of FIG. 43A. An n$^-$-type semiconductor layer (a first semiconductor region) 22 is formed on a bottom insulation film 8. Impurities are horizontally diffused from the right side of the n$^-$ semiconductor layer 22, to form a p$^+$-type anode layer (a third semiconductor region) 293. p-type impurities, n-type impurities, and high-concentration n-type impurities are successively diffused horizontally from the left side of the n$^-$ semiconductor layer 22, to form a p-type base layer (a fourth semiconductor region) 23, an n-type base layer (a sixth semiconductor region) 285, and an n$^+$-type cathode layer (a second semiconductor region) 241.

Figure 44:
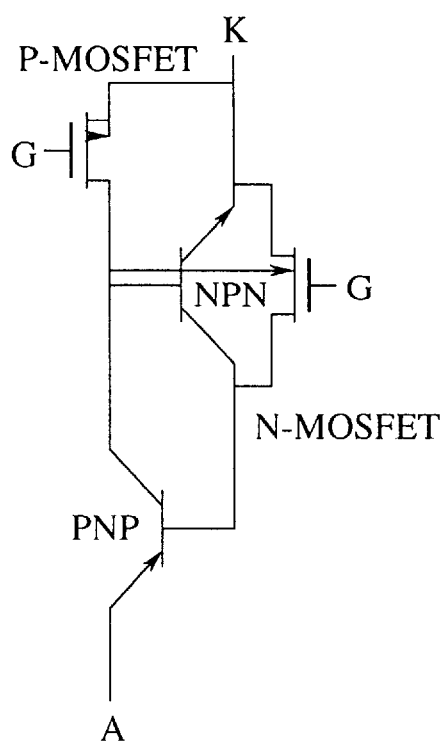
FIG. 44 is an equivalent circuit of the MCT of the fifth embodiment.

Impurities are diffused from the top surface of the substrate around an interface between the n-type base 285 and the cathode 241, to form a p$^+$-type short region (a fifth semiconductor region) 286. Gate trenches are formed in contact with the p-type base 23 and n-type base 285. The side-walls of each gate trench are covered with a gate oxide film 6, and a space defined by the film 6 in each gate trench is filled with, for example, DOPOS to form a buried gate electrode 37. The gate trenches are formed up to the bottom insulation film 8. A gate oxide film 284 is formed on top of the p-type base 23 and n-type base 285. On the gate oxide film 284, a surface gate electrode 237 is formed from, for example, DOPOS. The surface gate electrode 247 and buried gate electrodes 37 are electrically connected to each other. The surface gate electrode 237 is covered with an interlayer insulation film (not shown). A contact hole (or contact window) is opened through the interlayer insulation film and oxide film 21, and a metal cathode electrode 341 is formed in the contact hole, to electrically connect the p$^+$ short region 286 to the n$^+$ cathode 241. A metal anode electrode 342 is formed on the p$^+$ anode 293. FIG. 44 shows an equivalent circuit of the MCT of FIGS. 43A and 43B.

According to the MCT of the fifth embodiment, an nMOSFET is formed between the n-type base 285 and the n$^-$-type semiconductor layer 22. A channel of the nMOSFET is provided by the side-walls of the gate trenches formed in the p-type base 23. When a positive gate potential is applied, the nMOSFET is put in a conducting state, and electrons are injected into the semiconductor layer 22, to turn on the MCT. At the same time, holes are injected from the anode 293, to pass a large current. To turn off the MCT, a negative voltage is applied to a pMOSFET whose channel is at the surface of the n-type base 285 between the p$^+$ short region 286 and the p-type base 23, to draw holes from the semiconductor layer 22.

An effective channel width $W_{eff}$ of the MCT of the fifth embodiment is determined by the product of the thickness W of the drift layer 22 (FIG. 43B) and the number of channels. Accordingly, the channel width $W_{eff}$ is freely set in a depth direction vertical to the top surface of the substrate even if a chip area is limited. As a result, on-resistance per chip area is very small. Electrons effectively travel through the bulk of the drift layer 22 without the influence of surface scattering or surface defects. This results in increasing the mobility of electrons, decreasing on-resistance, and improving a switching speed.

(Sixth embodiment)

Figure 45A:
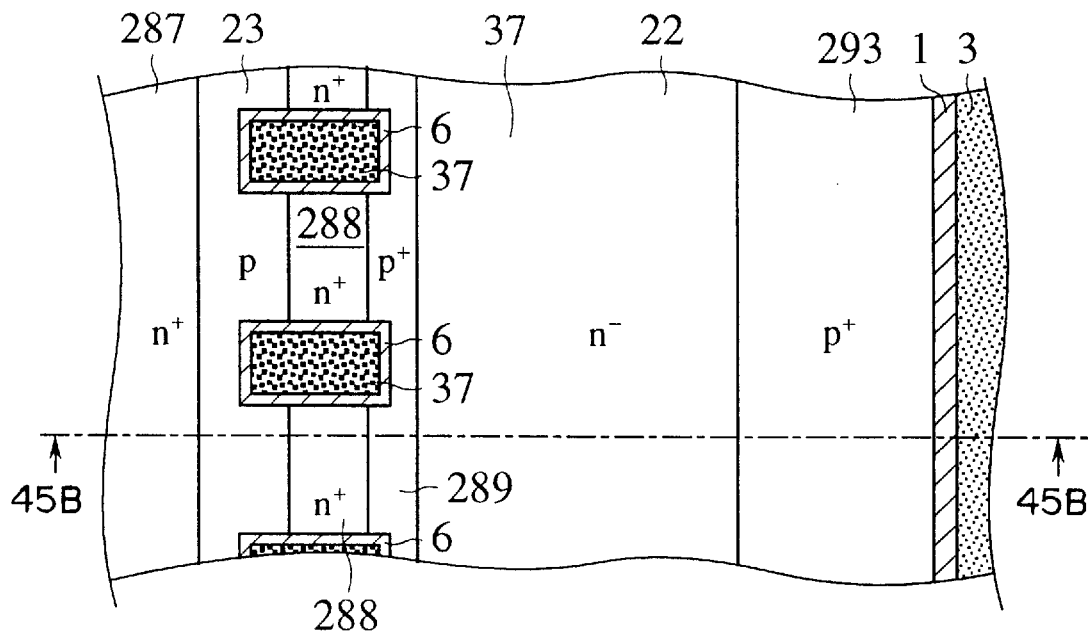
FIGS. 45A and 45B are plan and sectional views showing an EST according to a sixth embodiment of the present invention.
Figure 45B:
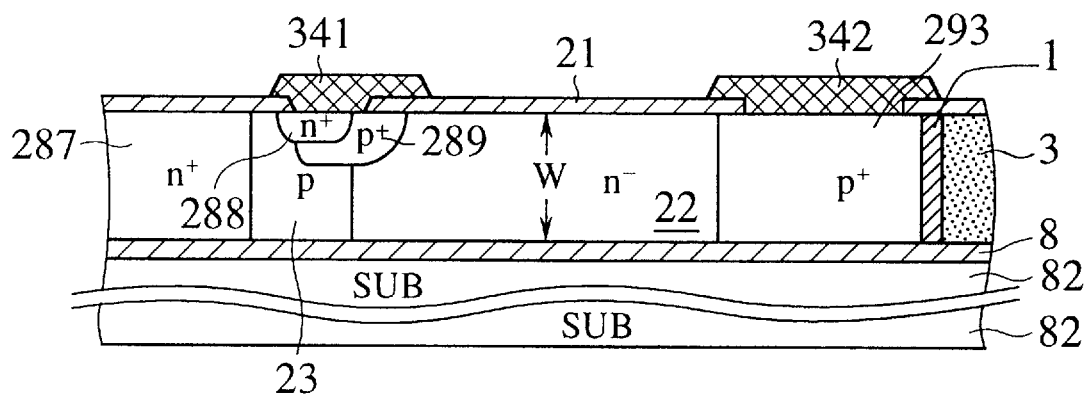
Figure 46:
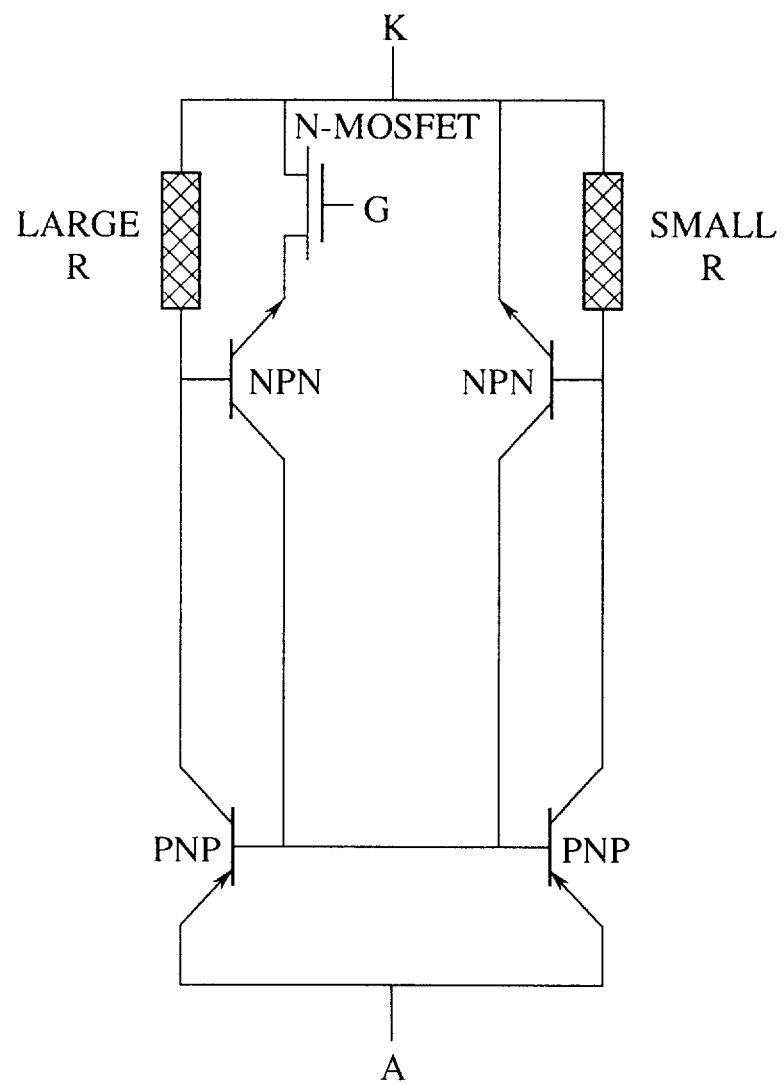
FIG. 46 is an equivalent circuit of the EST of the sixth embodiment.

FIG. 45A is a plan view showing an emitter switched thyristor (EST) according to the sixth embodiment of the present invention, and FIG. 45B is a sectional view taken along a line A—A of FIG. 45A. An n$^-$-type semiconductor layer (a first semiconductor region) 22 is formed on a bottom insulation film 8. At opposite ends of the semiconductor layer 22, a floating n$^+$-type cathode region (a second semiconductor region) 287 and a p$^+$-type anode layer (a third semiconductor region) 293 are formed. A p-type base layer (a fourth semiconductor region) 23 is formed adjacent to the n- floating cathode region 287. A p$^+$-type base layer (a sixth semiconductor region) 289 is formed at an interface between the p base 23 and the n$^-$ semiconductor layer 22. An n$^+$-type cathode region (a fifth semiconductor region) 288 is formed in the p$^+$ base 289 adjacent to the floating cathode 287. The n$^+$ cathode 288, p$^+$ base 289, n$^-$ semiconductor layer 22, and p$^+$ anode 293 form a parasitic thyristor. The n$^+$ floating cathode region 287, p base 23, n$^-$ semiconductor layer 22, and p$^+$ anode 293 form a main thyristor. The n$^-$ semiconductor layer 22 between the p base 23 and p$^+$ anode 293 serves as an n$^-$-type drift layer of the main thyristor. Gate trenches are formed through the n$^+$ cathode 288 and p$^+$ base 289. The inner walls of each gate trench is covered with a gate insulation film 6, and a space defined by the film 6 in each gate trench is filled with a buried gate electrode 37. The n$^+$ floating cathode 287, buried gate electrodes 37, and n$^+$ cathode 288 form an nMOSFET. FIG. 46 shows an equivalent circuit of the EST. The n$^+$ cathode 288 is short-circuited to the p$^+$ base 289 through a metal cathode electrode 341. A metal anode electrode 342 is formed on top of the p$^+$ anode 293.

When a gate voltage applied to the buried gate electrodes 37 is below a predetermined threshold, each of the parasitic and main thyristors has high resistance between the cathode and the anode, so that the thyristors are in a blocking state. When the gate voltage is above the threshold, the nMOSFET is turned on to short-circuit the n$^+$ floating cathode 287 and p base 23 to each other, to thereby turn on the main thyristor. When the nMOSFET is turned off, a potential barrier height between the n$^+$ floating cathode 287 and the p base 23 rises to turn off the main thyristor.

As is apparent in FIG. 45B, the effective channel width $W_{eff}$ of the EST of the sixth embodiment is determined by the product of the thickness W of the semiconductor layer 22 and the number of channels, so that the channel width $W_{eff}$ is freely set in a depth direction vertical to the top surface of the substrate even if a chip area is limited. Accordingly, on-resistance per chip area is very small. Since electrons effectively travel through the bulk of the semiconductor layer 22 without the influence of surface scattering or surface defects, the mobility of electrons is high, on-resistance is low, and a switching speed is high.

(Seventh embodiment)

Figure 47A:
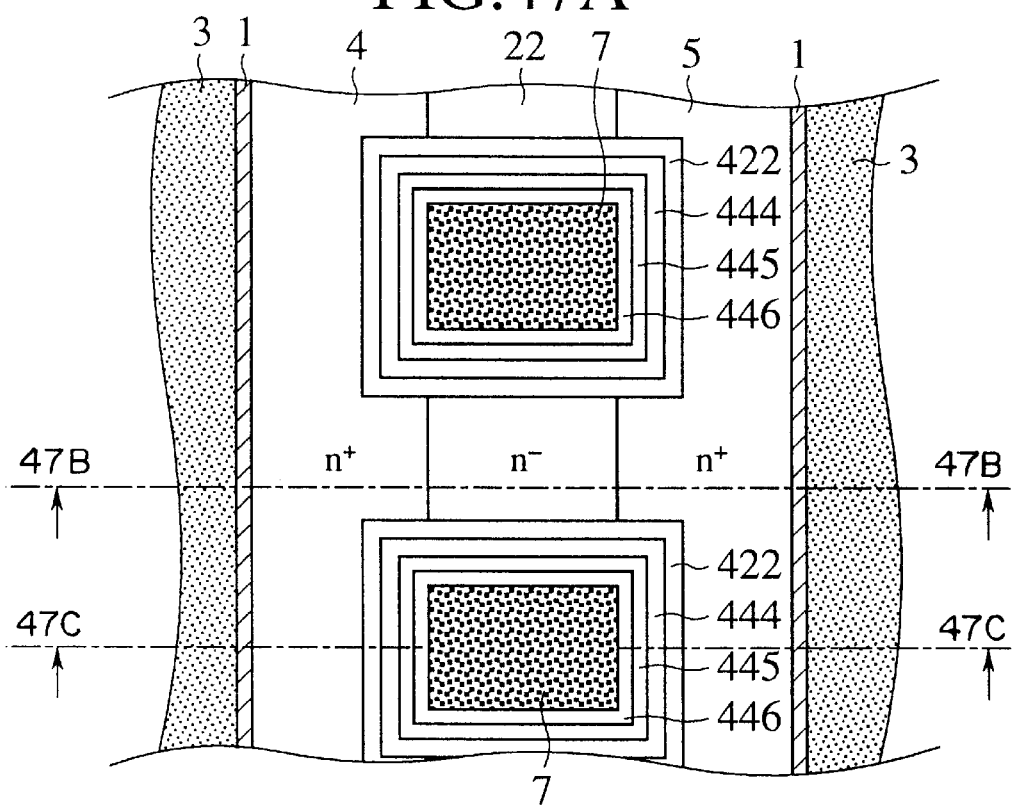
FIG. 47A is a plan view showing an HEMT according to a seventh embodiment of the present invention.
Figure 47B:
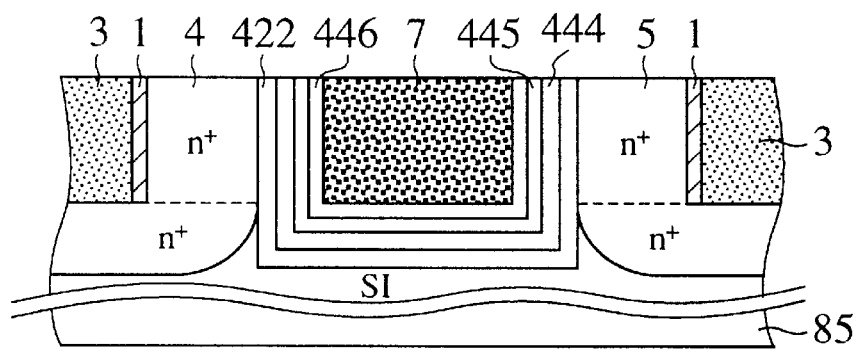
FIG. 47B is a sectional view taken along a line A—A of FIG. 47A.
Figure 47C:
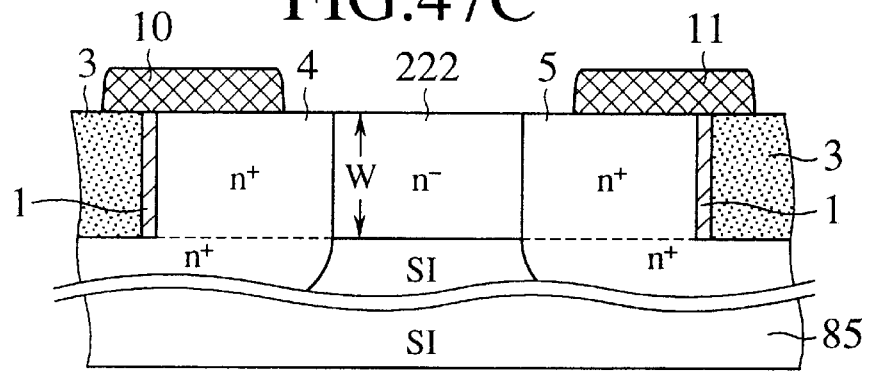
FIG. 47C is a sectional view taken along a line B—B of FIG. 47A.

The present invention is not limited to a silicon semiconductor device. A heterojunction of two compound semiconductor materials having different forbidden band gaps (Eg) provides the same operation as that of an insulated-gate structure. An example of this, FIGS. 47A, 47B, and 47C show an AlGaAs/InGaAs high-electron-mobility transistor (HEMT) using an n-type AlGaAs electron supply layer according to the seventh embodiment of the present invention. FIG. 47A is a plan view, FIG. 47B is a sectional view taken along a line A—A of FIG. 47A, and FIG. 47C is a sectional view taken along a line B—B of FIG. 47A.

On a semi-insulating GaAs substrate 85, an n$^-$-type GaAs epitaxial growth layer (a first semiconductor region) 222 is formed. Gate trenches are formed in the n$^-$ semiconductor layer 222. The side-walls of each gate trench is covered with a buffer layer 422 of GaAs or AlGaAs. On the buffer layer 422, a channel layer (a fifth semiconductor region) 444 is formed from InGaAs. On the channel layer 444, an AlGaAs spacer layer 445 and an n-type AlGaAs electron supply layer 446 are formed (The AlGaAs spacer and electron supply layers 445, 446 serve as a fourth semiconductor region). On top of the fourth semiconductor region, a buried gate electrode 7 is formed. On an n$^+$-type source layer (a second semiconductor region) 4, a metal source electrode 10 is formed. On an n$^+$-type drain layer (a third semiconductor region) 5, a metal drain electrode 11 is formed.

The effective channel width $W_{eff}$ of the HEMT of the seventh embodiment is determined by the product of the thickness W (FIG. 47C) of the semiconductor layer 222 and the number of channels, so that the channel width $W_{eff}$ is freely set in a depth direction vertical to the top surface of the substrate even if a chip area is limited. As a result, on-resistance per chip area is very small. The electron supply layer 446 may be made of n-type InGaP.

Figure 48A:
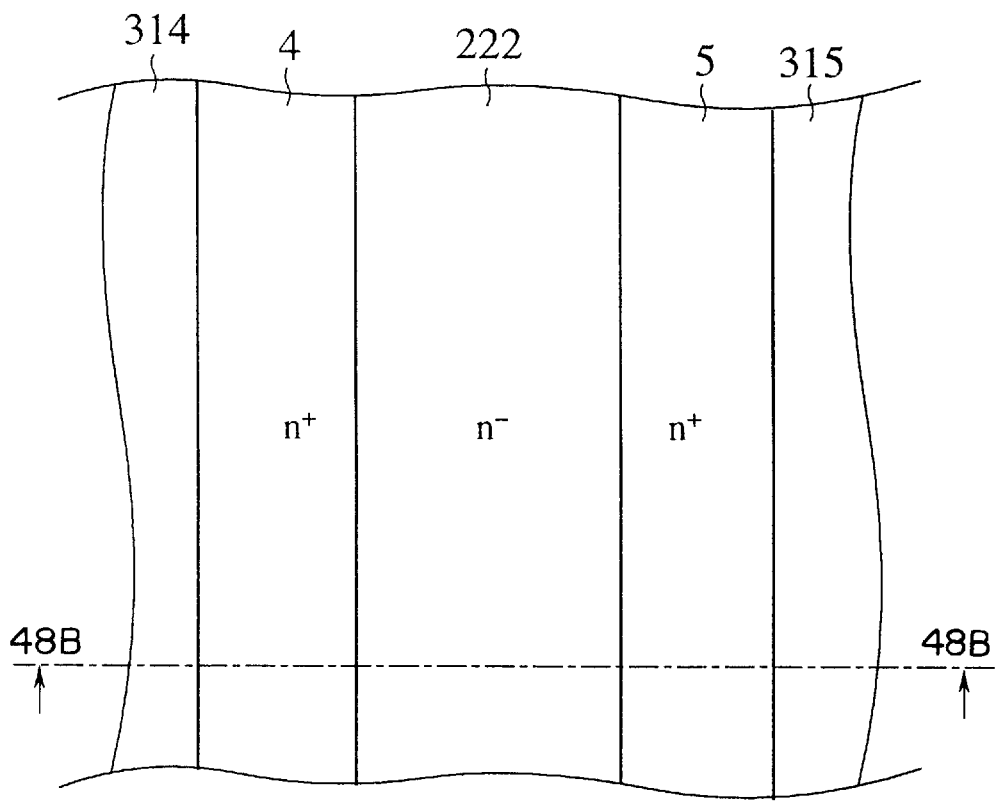
FIGS. 48A to 48D explain the processes of manufacturing the HEMT of the seventh embodiment.
Figure 48B:
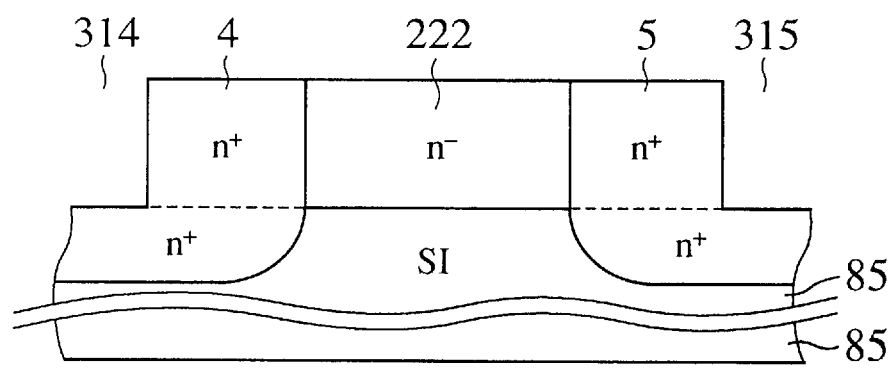
Figure 48C:
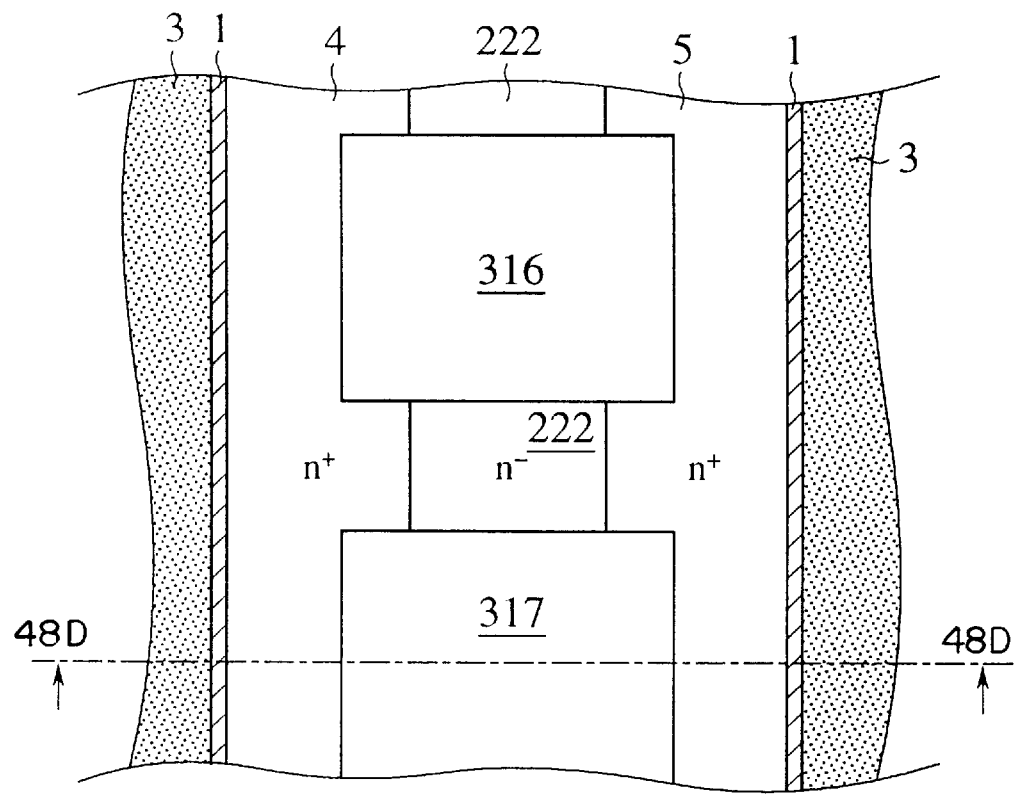
Figure 48D:
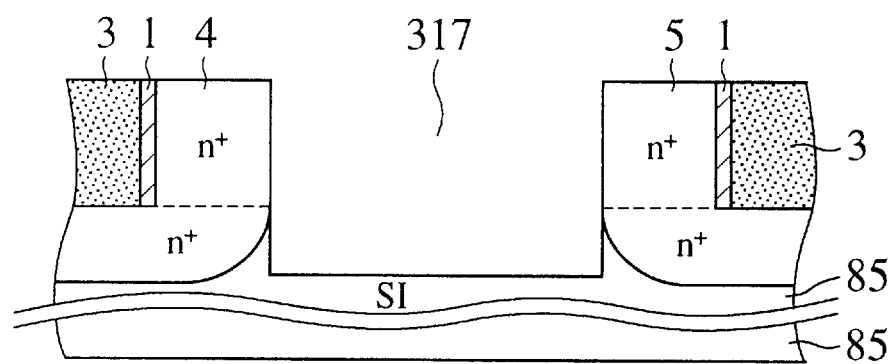

FIGS. 48A to 48D explain the processes of manufacturing the HEMT of the seventh embodiment.

a) An n$^-$-type GaAs layer 222 is epitaxially grown on a semi-insulating GaAs substrate 85, and trenches 314 and 315 are formed according to the photolithography and RIE techniques. The trenches 314 and 315 are used as diffusion windows to horizontally diffuse n-type impurities such as Si and Se as shown in FIGS. 48A and 48B. At this time, the n-type impurities diffuse also to the semi-insulating GaAs substrate 85.

b) The trenches 314 and 315 are each filled with a device isolating insulation film 1 and an isolation filler 3. The semiconductor layer 222 is etched beyond an interface between the layer 222 and the semi-insulating GaAs substrate 85 according to, for example, the RIE technique as shown in FIGS. 48C and 48D.

c) A reduced-pressure MOCVD technique is used to epitaxially grow a non-dope GaAs buffer layer 442, non-dope $In_zGa_{1-z}As$ channel layer 444, non-dope $Al_{0.15}Ga_{0.85}As$ spacer layer 445, and silicon-doped n-type $Al_{0.15}Ga_{0.85}As$ electron supply layer 446 one after another. The epitaxial growth is carried out, for example, at 650 degrees centigrade and a pressure of $1\times10^4$ Pa. GaAs may be grown with a source gas of TEG (triethylgallium) and $AsH_3$ (arsine), and AlGaAs may be grown with a source gas of TMA (trimethylaluminum), TMG (trimethylgallium), and $AsH_3$. Instead of the MOCVD technique, the CBE, MBE, or MLE technique is employable.

d) On the electron supply layer 446, a buried gate electrode 7 is formed from, for example, Ti/Pt/Au or TiW/Au. A metal source electrode 10 on a source layer 4 and a metal drain electrode 11 on a drain layer 5 are formed from AnGe/Ni/Au, to complete the HEMT of the seventh embodiment of FIGS. 47A to 47C.

The HEMT is not limited to that having the InGaAs/AlGaAs heterojunction mentioned above. For example, it may have a GaAs/AlGaAs structure, InGaAs/InAlAs structure, etc.

The first semiconductor region 222 may be made of InP, or InP epitaxially grown on a GaAs substrate.

And a part of the device isolation insulation film 1 and the isolation filler 3 may be replaced by a high-resistivity semiconductor region formed by proton ($H^+$) irradiation.

(Eighth embodiment)

Figure 49:
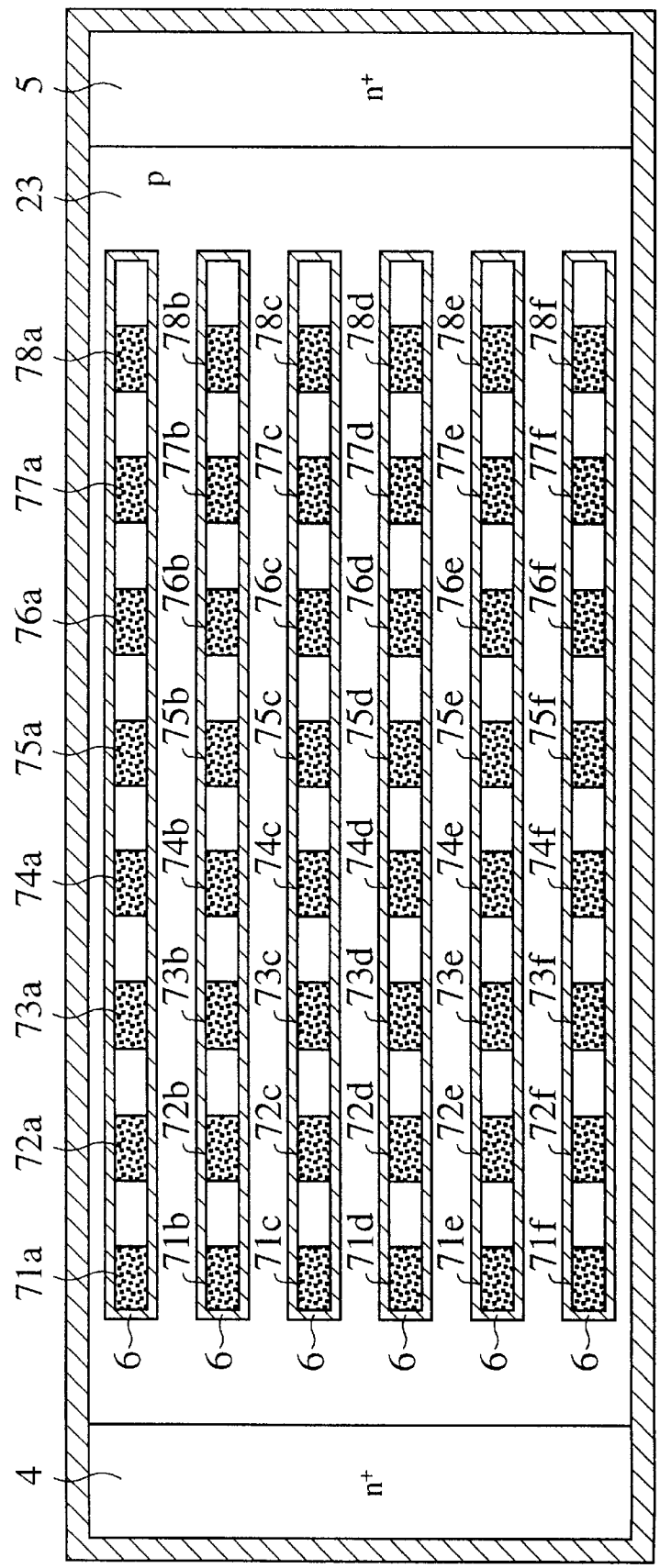
FIG. 49 a plan view showing a divided gate IGT according to an eighth embodiment of the present invention.

FIG. 49 is a plan view showing a divided-gate IGT according to the eighth embodiment of the present invention. A p-type semiconductor layer (a first semiconductor region) 23 is formed on a bottom insulation film. At opposite ends of the semiconductor layer 23, an $n^+$-type source layer (a second semiconductor region) 4 and a drain layer (a third semiconductor region) 5 are formed. Relatively long six gate trenches are formed between the source 4 and the drain 5. A gate insulation film 6 is formed on the side-walls of each gate trench. In each of the gate trenches, a buried gate electrode is divided into eight sections. Namely, the first gate trench has buried gate electrodes 71a to 78a, the second gate trench has buried gate electrodes 71b to 78b, and the sixth gate trench has buried gate electrodes 71f to 78f. The buried gate electrodes 71a, 71b, . . . , 71f are connected to one another. The buried gate electrodes 72a, 72b, . . . , 72f are connected to one another and to the buried gate electrodes 71a to 71f through a resistor r.

The buried gate electrodes 73a, 73b, . . . , 73f are connected to one another and to the buried gate electrodes 72a to 72f through a resistor r. The buried gate electrodes 78a to 78f are connected to the buried gate electrodes 77a to 77f through a resistor r. In each gate trench, intervals between the buried gate electrodes are filled with insulators such as NDPOS or oxide films, or hollows.

With the above structure, a voltage applied to the buried gate electrodes is divided to equalize the gradient of potential in each channel formed in the semiconductor layer 23. In the case of the uniform buried gate electrode of FIG. 18, a high electric field is generated between proximal ends of the buried gate electrodes and the drain layer 5 to break insulation. The divided buried gate electrodes of FIG. 49 equalize the strength of an electric field, to suppress a high electric field at the ends. This results in providing a high breakdown voltage and low on-resistance. Namely, an accumulation layer is produced around each buried gate electrode, to decrease resistance and provide a high gate-drain breakdown voltage. The trade-offs of a drain breakdown voltage and on-resistance are canceled to increase the breakdown voltage and decrease on-resistance.

Figure 50A:
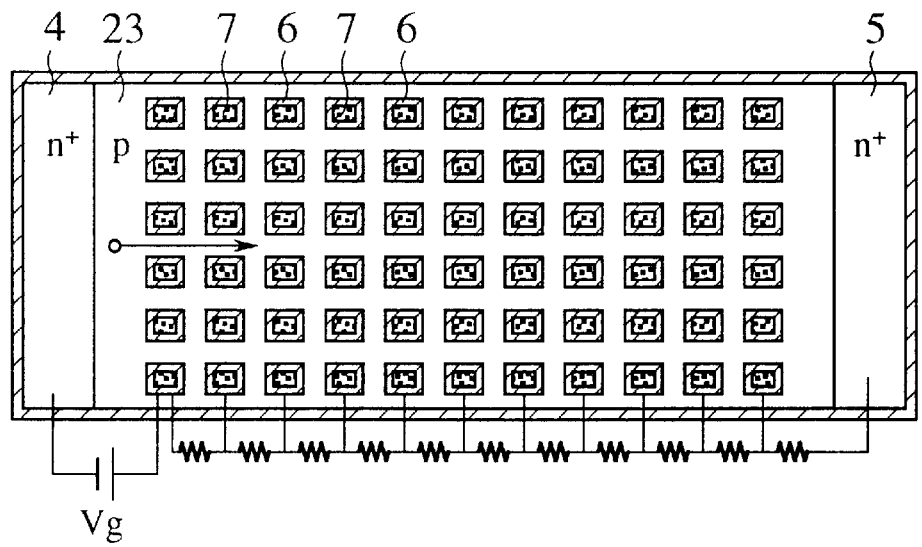
FIGS. 50A to 50C are Ian views showing divided gate IGTs according to modifications of the eighth embodiment.
Figure 50B:
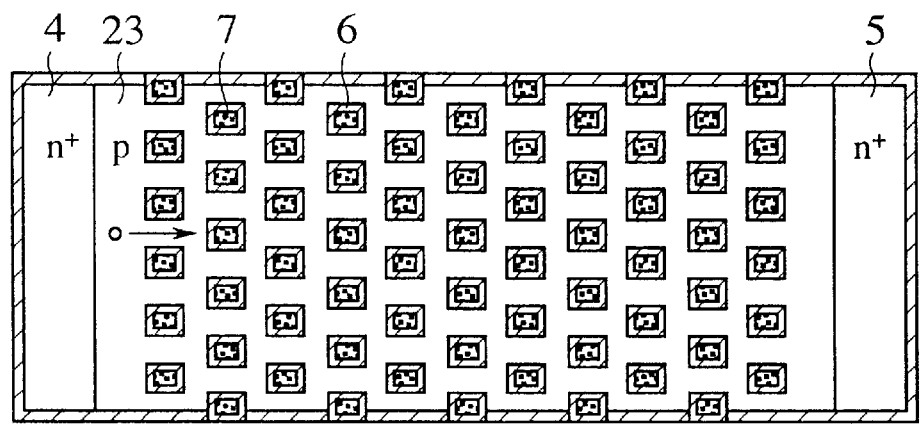
Figure 50C:
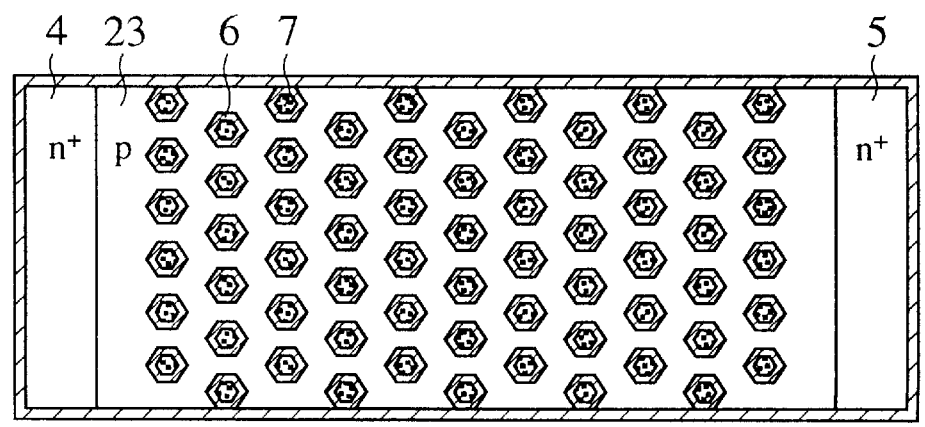

FIGS. 50A to 50C show modifications of the eighth embodiment. In FIG. 50A, 66 gate trenches are regularly arranged in an X-Y matrix. In FIG. 50B, 66 gate trenches are zigzagged. The regular arrangement of FIG. 50A provides straight channels whose effective channel lengths are shorter than those of zigzagged arrangement of FIG. 50B to realize low on-resistance.

In FIG. 50C, hexagonal gate trenches are zigzagged. The number of the gate trenches is 72 that is 6 pieces larger than that of quadrangle gate trenches to be arranged on the same surface area. The number of accumulation layers formed around the gate trenches is 1595 units in FIG. 50B and 1672 units in FIG. 50C. Accordingly, the total area of the accumulation layers of FIG. 50C is larger than that of FIG. 50B, to realize lower on-resistance.

(Ninth embodiment)

Figure 51:
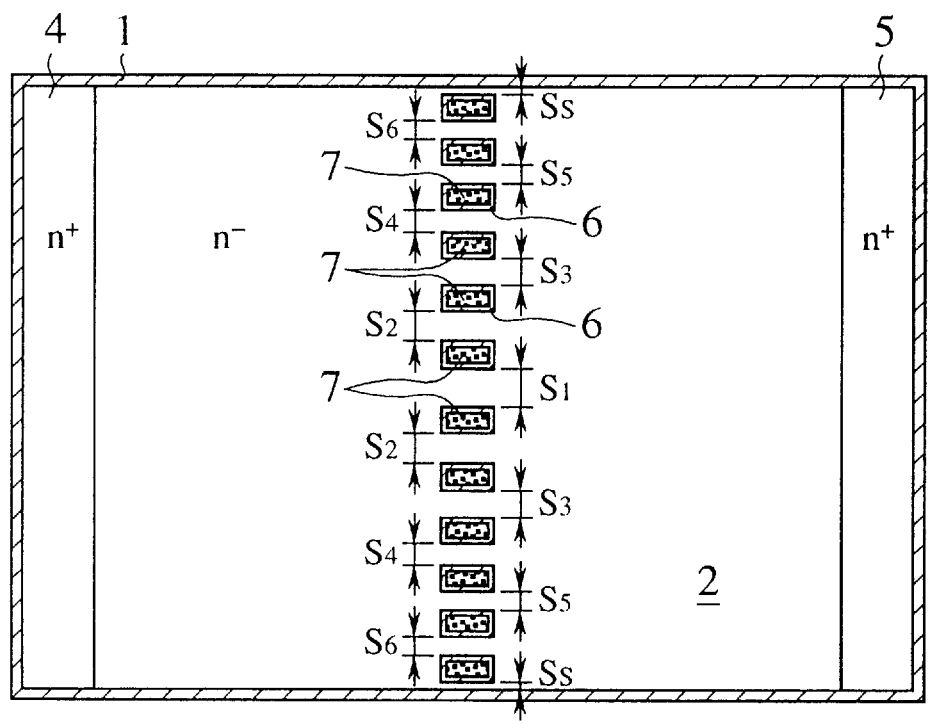
FIG. 51 is a plan view showing a semiconductor device according to a ninth embodiment of the present invention.
Figure 52:
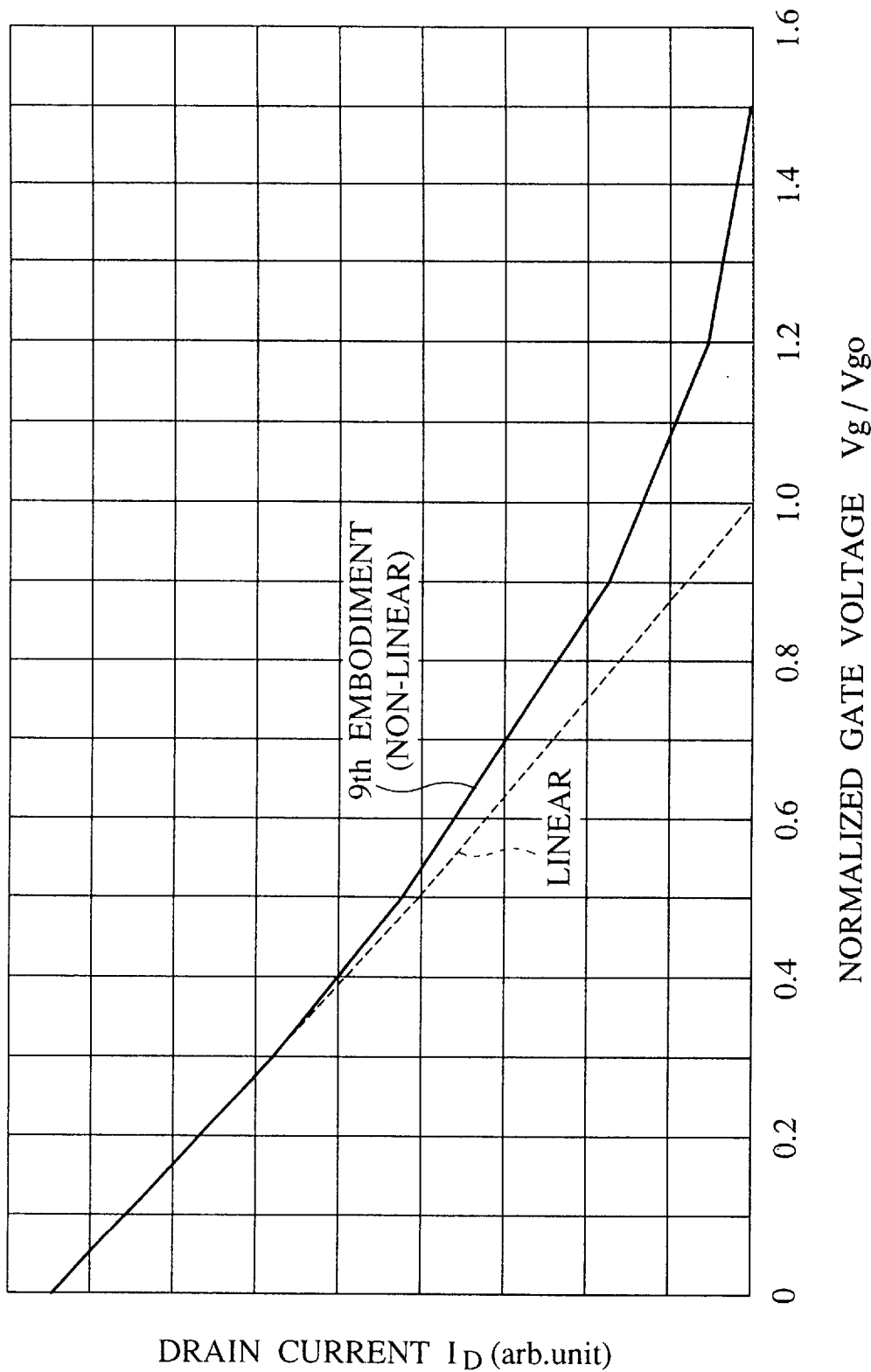
FIG. 52 shows the $I_d$-$V_g$ characteristics of the semiconductor device of the ninth embodiment.

The present invention is applicable not only to active devices such as IGTs and IGBTs but also to passive devices such as load resistors. FIG. 51 is a plan view showing a nonlinear load resistor according to the ninth embodiment of the present invention. This structure is basically the same as that of FIG. 8A of the first embodiment except that spacings between gate trenches are irregular. Namely, the gate spacings of FIG. 51 are S1>S2>S5 . . . S6>Ss. As a gate voltage Vg is increased, channels are sequentially pinched off from those having narrower gate spacings. FIG. 52 shows the $I_d$-$V_g$ characteristics of the device of FIG. 51. The device of FIG. 51 is advantageous when nonlinear load resistance is required.

(EXAMPLE 9-1)

Figure 53A:
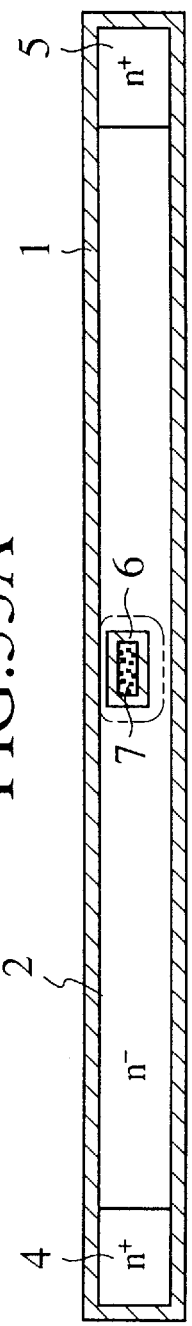
FIGS. 53A and 53B are plan views showing semiconductor devices according to the ninth embodiment.
Figure 53B:
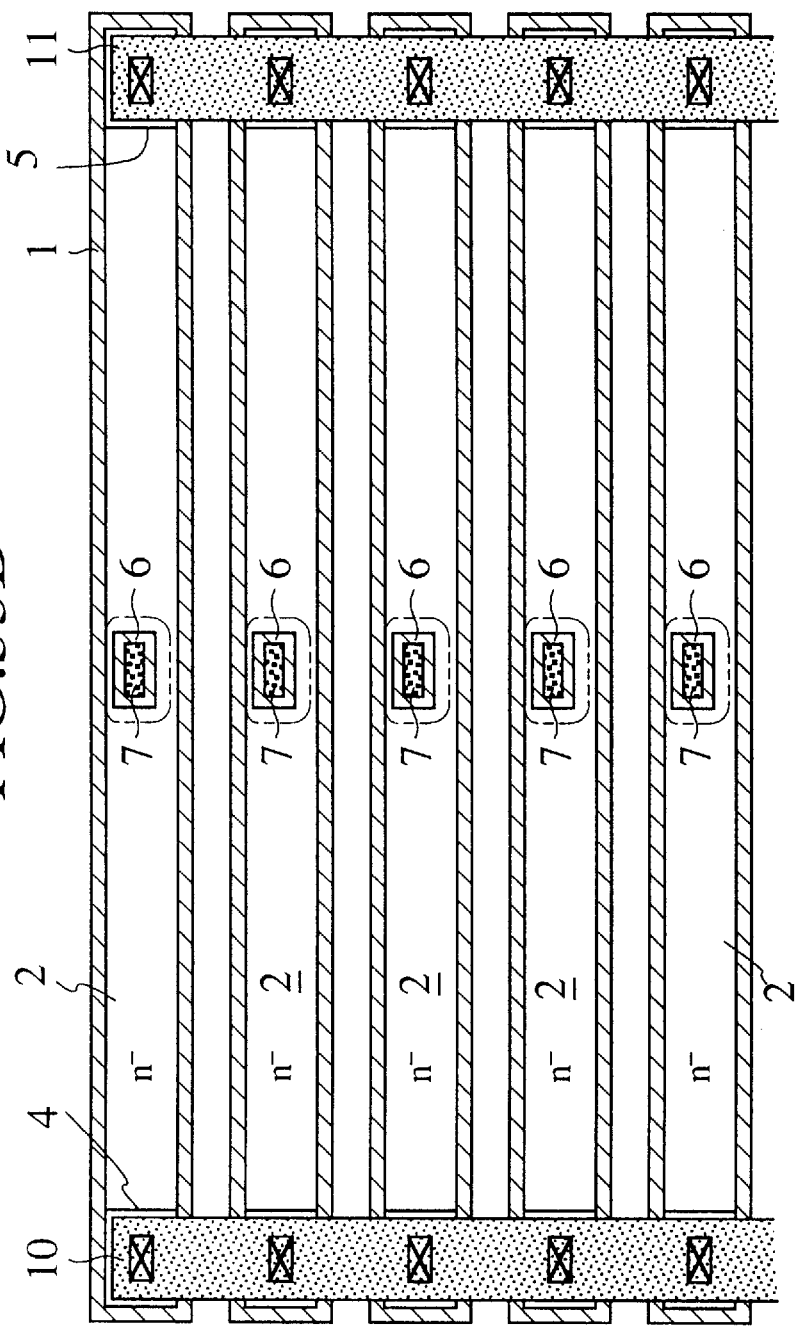

FIG. 53A is a plan view showing a passive device according to the first modification of the ninth embodiment. A gate trench is eccentric in an $n^-$-type semiconductor layer 2. The asymmetrical position of the gate trench provides nonlinear load characteristics. FIG. 53B employs a metal source electrode 10 and metal drain electrode 11 to connect many unit cells each being the one shown in FIG. 53A together, to handle a large current.

Figure 54:
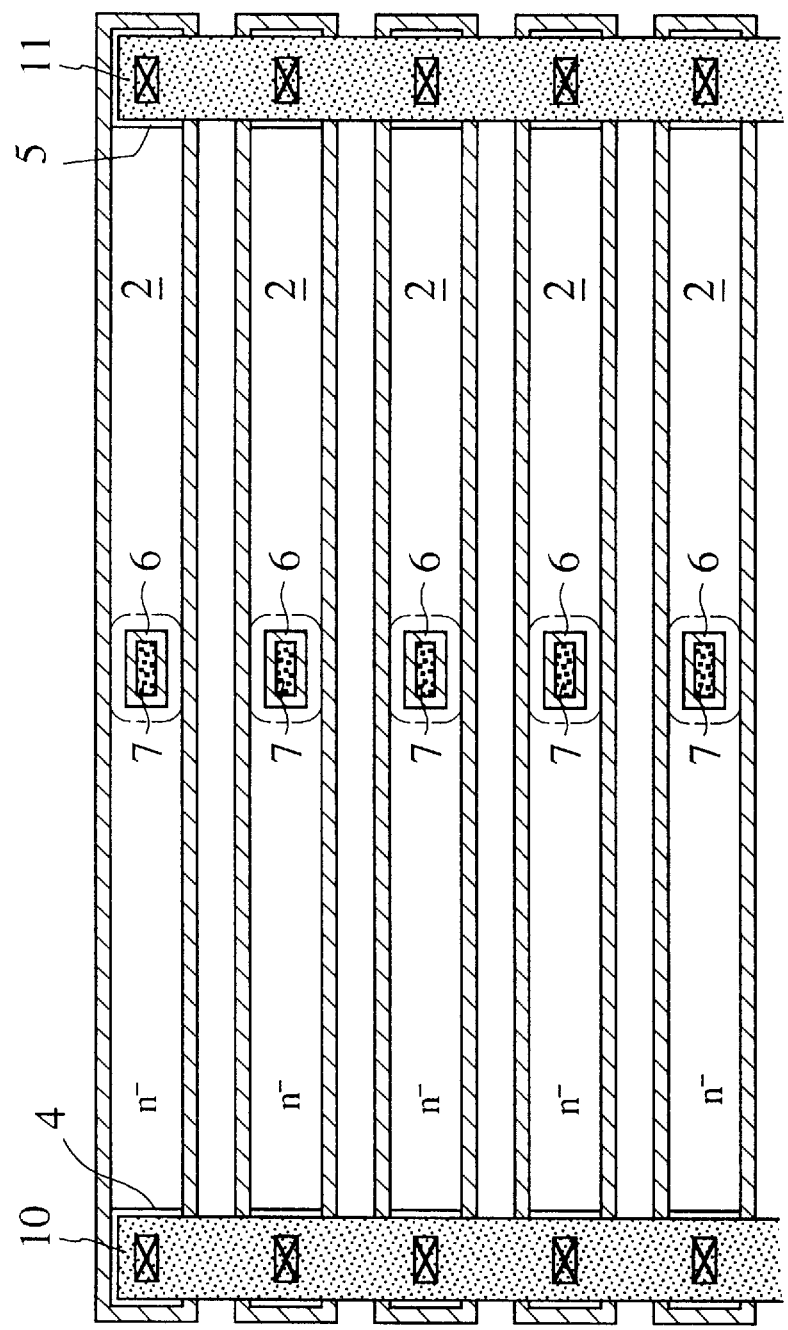
FIG. 54 is a plan view showing a semiconductor device according to a modification of the present invention.

Various modifications will become possible for those skilled in the art after receiving the teachings of the present disclosure without departing from the scope thereof. For example, FIG. 54 arranges a gate trench at the center of each IGT. Namely, the gate trench is arranged in each $n^-$-type semiconductor layer 2, to prevent a current concentration and achieve a stable operation without regard to a temperature distribution or potential distribution.

Figure 55:
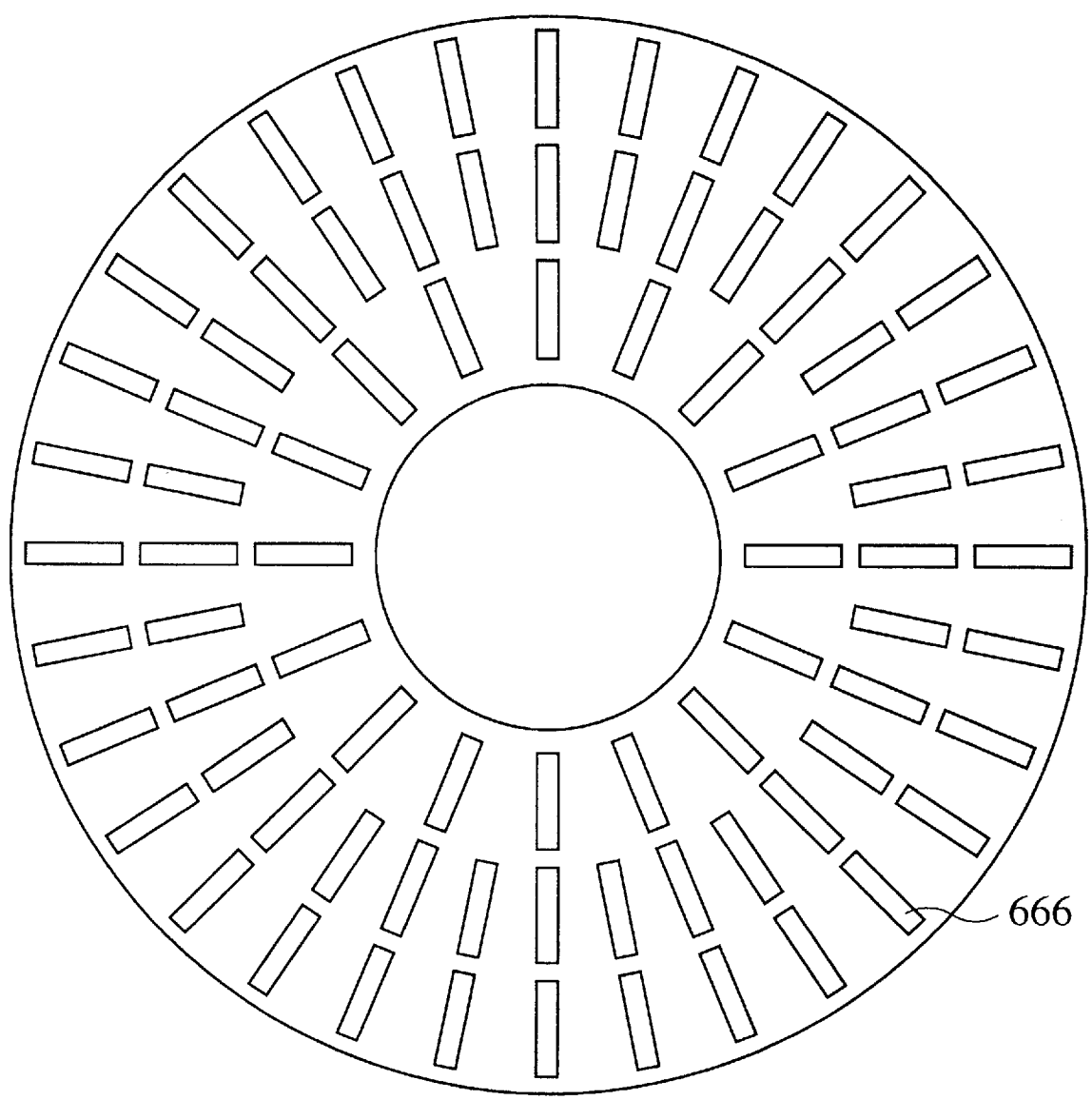
FIG. 55 is a plan view showing an array of unit cells according to another modification of the present invention.

FIG. 55 shows a 4- to 6-inch semiconductor pellet having unit cells 666 each being the one shown in FIG. 30A, to realize a large current operation.

Figure 56A:
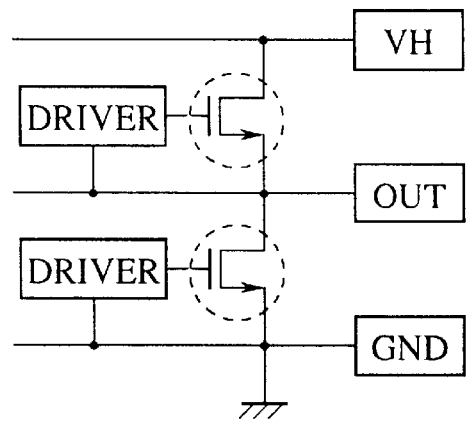
FIGS. 56A and 56B are a circuit diagram and a plan view showing an arrangement of semiconductor devices according to still another modification of the present invention.
Figure 56B:
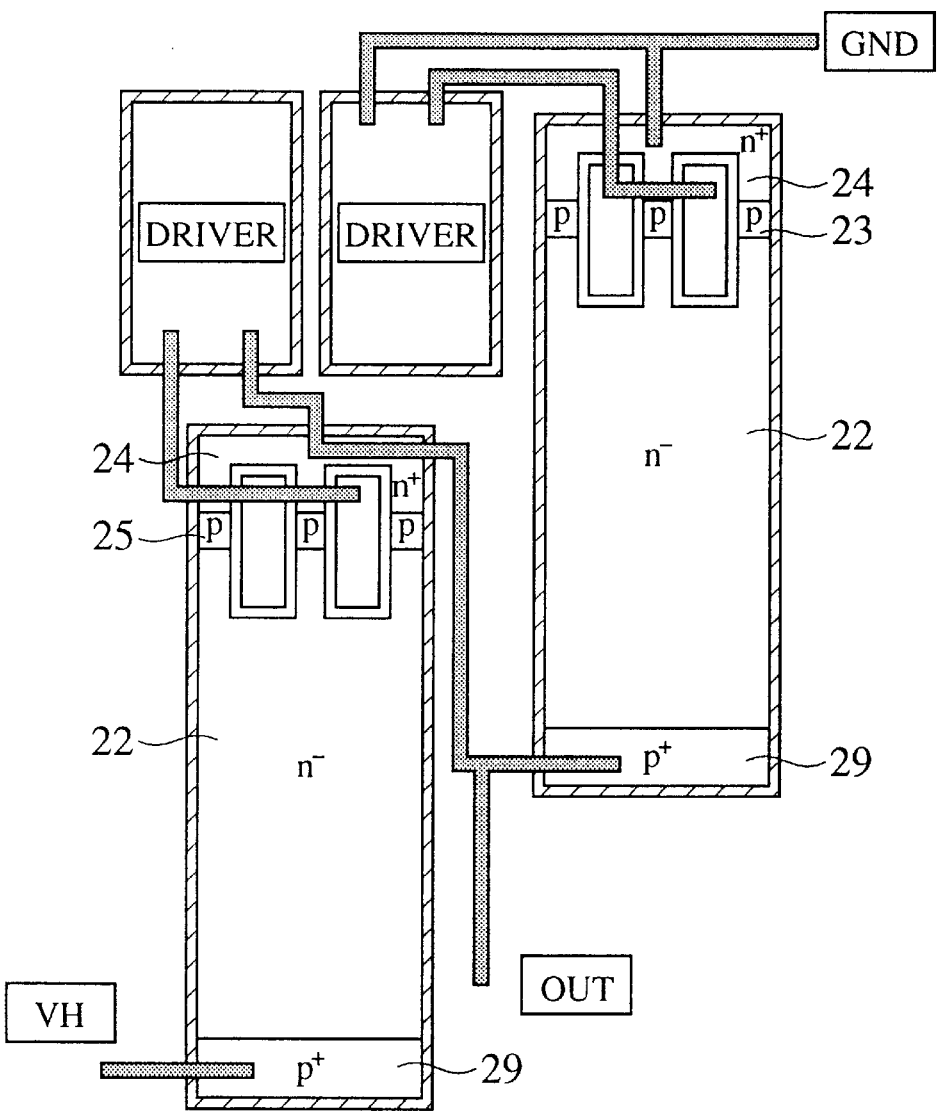

According to the present invention, the metal electrodes of first and second main electrodes of a device are on the same plane, and therefore, the present invention is advantageous in realizing an integrated structure or a monolithic IC. For example, the present invention fabricates a circuit of FIG. 56A on a single semiconductor chip as shown in FIG. 56B, to provide an inverter employing the IGBTs of FIGS. 33A and 33B. The metal emitter electrode 34 and metal collector electrode 39 are on the same plane as shown in FIG. 33B, so that surface wiring and device isolation among the integrated devices of FIG. 56B are easy. In this way, the present invention easily integrates various devices into a chip to form, for example, a smart power IC.

Figure 57:
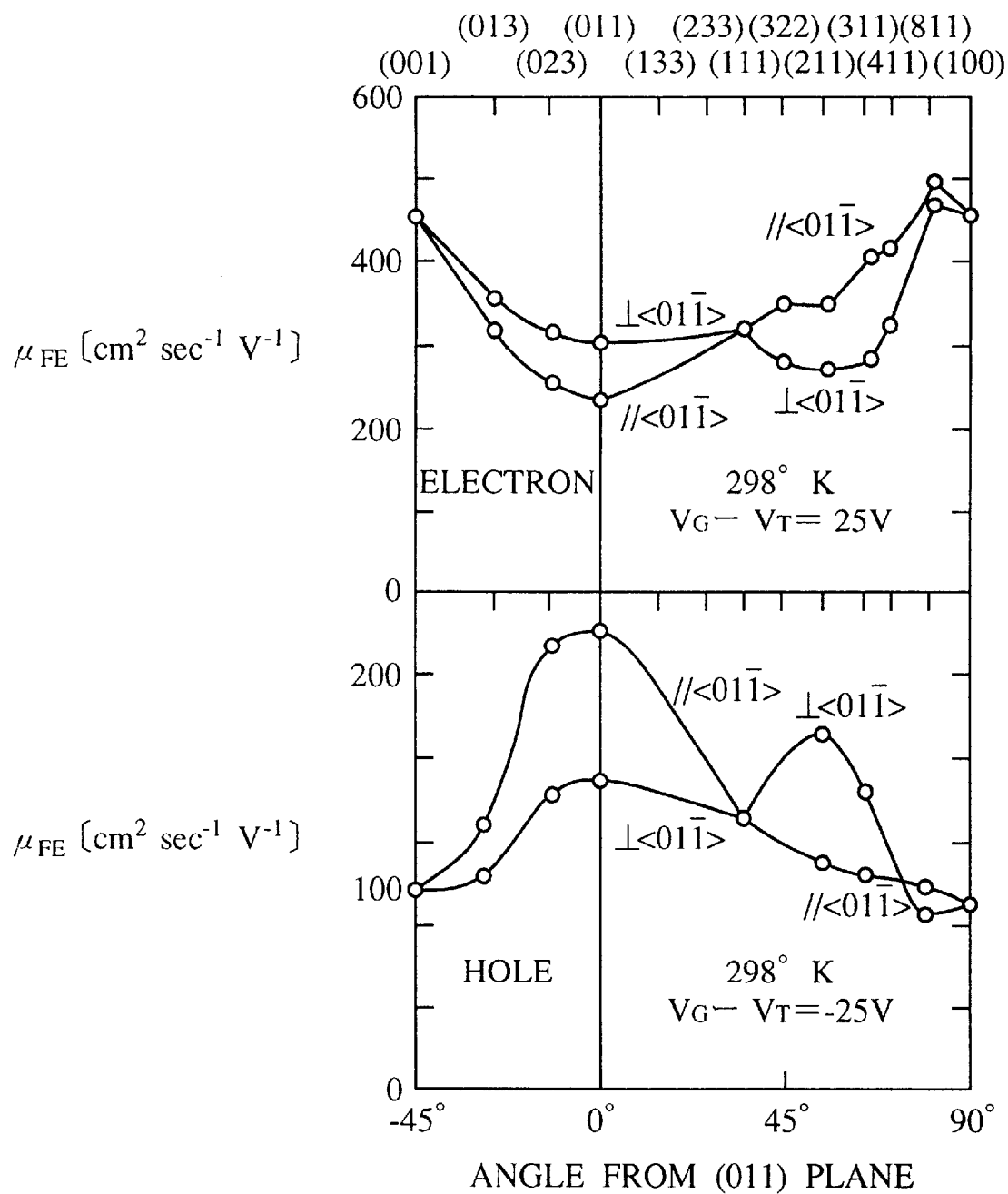
FIG. 57 shows the crystal-plane orientation dependency of the mobility of carriers.

A device according to the present invention employs a planar arrangement of electrodes while it passes carriers mainly through the bulk of a substrate away from the surface thereof, to increase a transconductance ($g_m$) and realize a high-speed high-frequency operation. The mobility and carrier velocities are dependent on the anisotropy of the effective mass of carriers. Namely, the mobility and carrier velocities are determined by crystal orientation in the device. According to the present invention, carriers travel in parallel with the main surface of a substrate, so that, compared with the conventional vertical devices, it is easy for the present invention to choose a crystal orientation to realize a direction for a high-speed operation. As shown in FIG. 57, the mobility of electrons is maximum in the direction of a (811) plane. It is easy for the present invention to select such a direction. On the other hand, it is impossible for the conventional vertical devices to select a crystal orientation because, once the plane orientation of a main surface is determined, a plane orthogonal to the main surface is automatically determined according to the symmetry of crystals.

As explained above in detail, the present invention greatly increases an effective channel width $W_{eff}$ compared with conventional semiconductor devices, to realize very low on-resistance per chip area. The present invention applicable not only to silicon devices but also to SiC, GaAs, and InP devices and other devices. In the case of the GaAs devices, a gate insulation film may be made of AlGaAs or ZnSe. In the case of the SiC or InP devices, a gate insulation film may be made of $SiO_2$.

The present invention is applicable not only to the insulated-gate structure but also to any other structure that controls a main current by capacitive coupling. The gate insulation films 6 of FIGS. 8A to 20C may be omitted to form a Schottky gate structure or pn junction structure. The channel can be pinched off by depletion layers extended from the reverse-biased pn junctions or the reverse-biased Schottky junctions.

Figure 58:
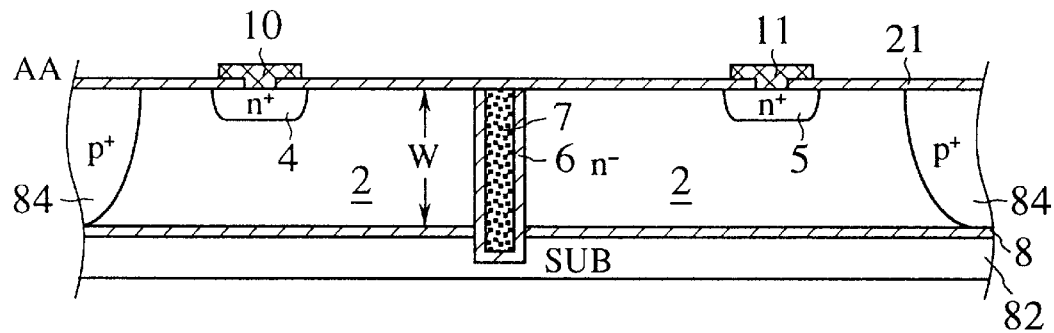
FIG. 58 is another modification of the first embodiment.

In the above embodiments, we have mainly explained the semiconductor device having DI structure. However, the choice of DI or JI structure depends on the desired characteristics or the application fields of the semiconductor device, and we can freely choose DI or SI structure. For example, the n⁻ semiconductor layer 2 may be surrounded by p⁺ isolation region 84 as shown in FIG. 58. FIG. 58 shows IGT according to a modification of the first embodiment. In FIG. 58, the n⁻ semiconductor layer 2 is formed on the bottom insulation film (SOI oxide) 8 to constitute a SOI substrate. And we can freely choose the SOI structure or the epitaxial layer structure, in which the first semiconductor region of the first conductivity type is formed on the substrate of the second conductivity type.

Figure 59:
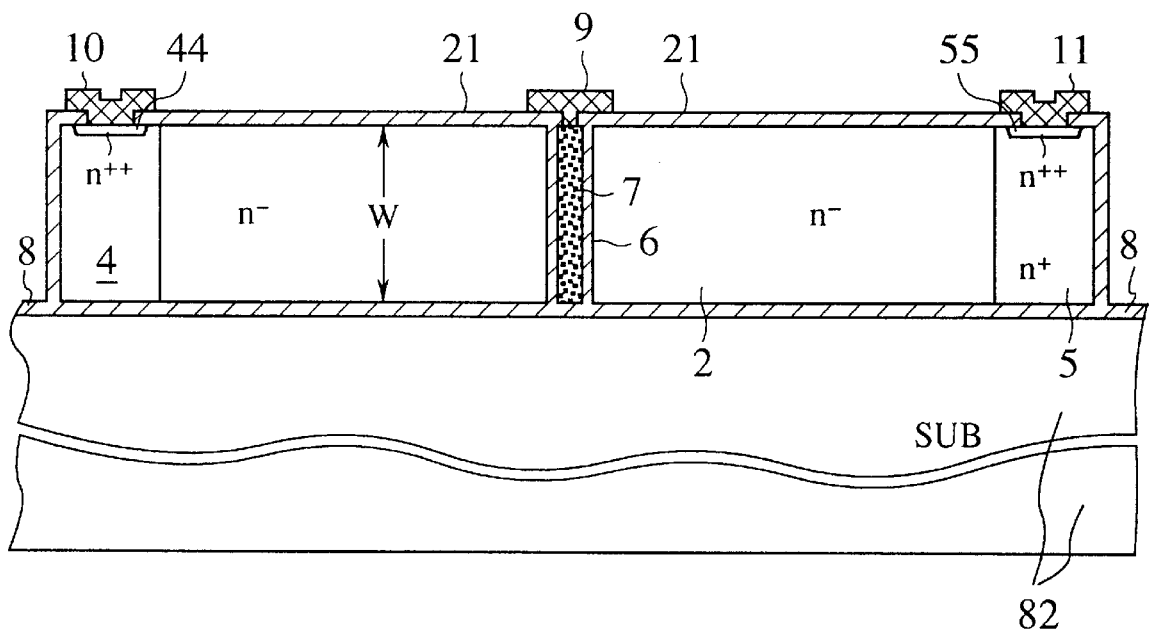
FIG. 59 is still another modification of the first embodiment.

As a device isolation region, we can employ the device isolation region having a U shape as shown in FIG. 59. FIG. 59 still another modification of IGT of the first embodiment. In FIG. 59, there is no isolation filler on the device isolating insulation film 1, and the device isolation trench forms a kind of hollow or air gap. As a final structure, the hollow in the device isolation trench may be filled with a final passivation material such as a polyimide film.

Figure 60:
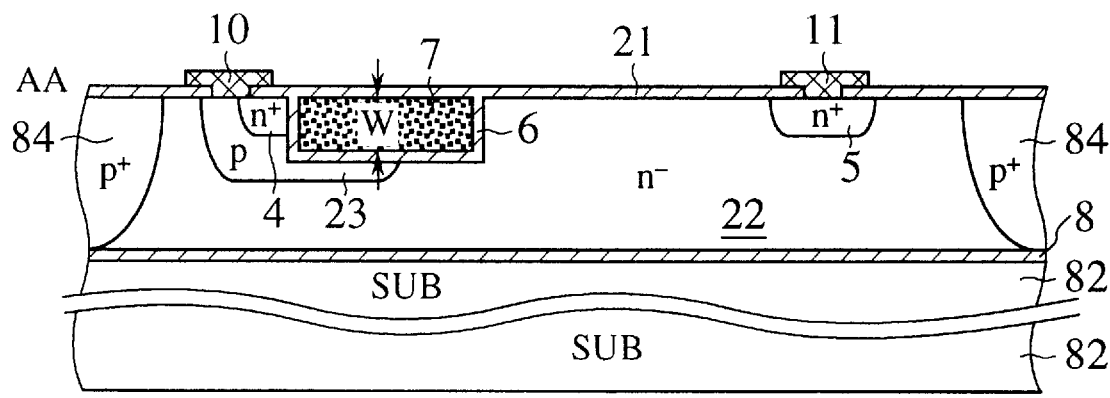
FIG. 60 is another modification of the second embodiment.
Figure 61:
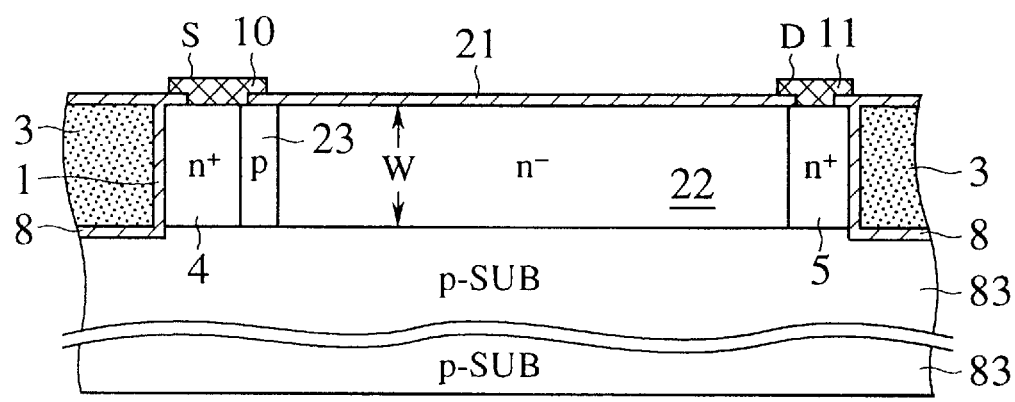
FIG. 61 is still another modification of the second embodiment.

As still another modification of the second embodiment, the structure shown in FIG. 26B may be changed to the structure shown in FIG. 60, in which n⁻ semiconductor layer 22 is formed on the bottom insulation film (SOI oxide) 8. FIG. 61 shows still another modification of the second embodiment. In FIG. 61, the n⁻ semiconductor layer 22 is formed on p-type semiconductor substrate 83. The p base region (the fourth semiconductor region) is formed from top to bottom surface of the n⁻ semiconductor layer 22. As mentioned above, the DI structure comprising the device isolating insulation film 1 and the isolation filler 3 in FIG. 61 may be changed to a JI structure.

Figure 62:
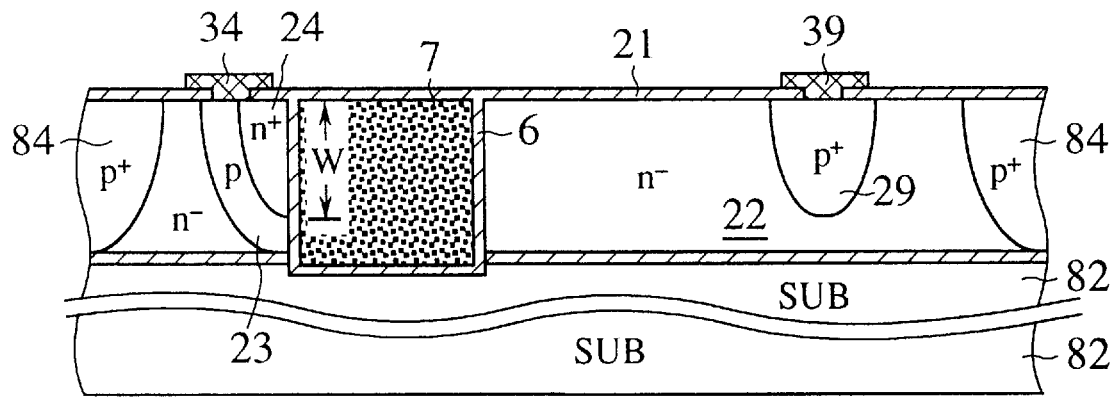
FIG. 62 is another modification of the third embodiment.
Figure 63:
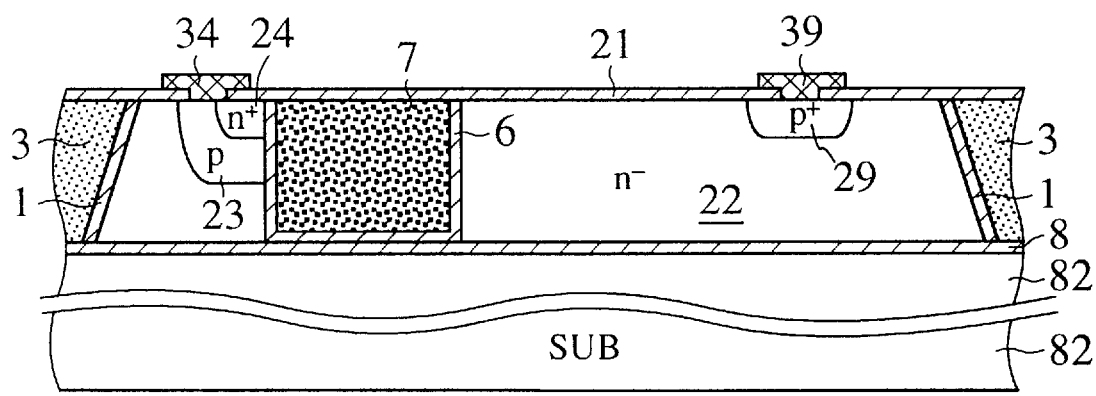
FIG. 63 is still another modification of the third embodiment.
Figure 64:
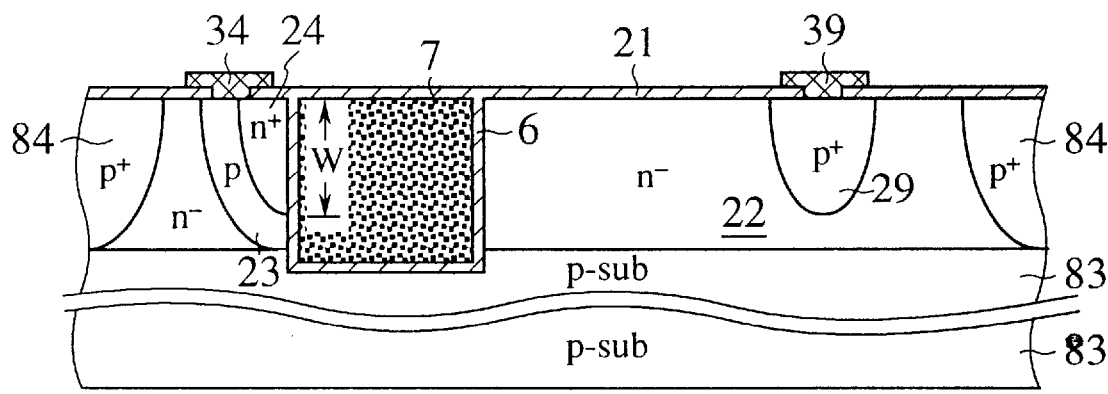
FIG. 64 is still another modification of the third embodiment.

FIG. 62 shows still another modification of the third embodiment. On a bottom insulation film (SOI oxide) 8, an n⁻ semiconductor layer 22 is formed, and the n⁻ semiconductor layer is surrounded by a p⁺ isolation region 84 to form a JI structure. An n⁺ emitter layer and p⁺ collector layer are formed at the top surface of and in the n⁻ semiconductor layer 22. Although the p⁺ collector layer does not reach the bottom insulation film 8 in FIG. 62, the p⁺ collector layer can reach the bottom insulation film 8 if required. And a p base region (a fourth semiconductor region) is formed in the n⁻ semiconductor region 22 to enclose the n⁺ emitter layer 24. The gate trench is formed deep to penetrate the bottom insulation film 8. In the gate trench, the buried gate electrode 7 of an IGBT is formed, whereby the channel width W is measured vertical to the top surface of the n⁻ semiconductor layer 22. FIG. 63 shows still another modification of the third embodiment (IGBT), in which n⁻ semiconductor layer 22 is surrounded by a V-grooved device isolation region to form a DI structure. The n⁺ emitter layer 24 is enclosed by p base region (a fourth semiconductor region) 23. The p⁺ collector layer 29 may reach the bottom insulation film 8. FIG. 64 shows still another modification of the third embodiment (IGBT), in which the n⁻ semiconductor layer 22 is formed on p-type semiconductor substrate 83 and surrounded by p⁺ isolation region 84 to form a JI structure. The p base region 23 enclosing the no emitter layer 24 is deep to reach the p-type semiconductor substrate 83, and the gate trench is formed to penetrate into p-type semiconductor substrate, thereby forming a wide channel width W. As shown above, we can freely choose DI or JI structure. And we can choose SOI structure or epitaxial structure depending on the desired device characteristics.

Anyhow, the effective channel width $W_{eff}$ of the present invention is determined by the product of the thickness W (or channel width W) of the first semiconductor region and the depth and the number of channels and are freely chosen in a depth direction vertical to the top surface of the first semiconductor region even if a chip area is limited. Hence, the on-resistance of the semiconductor device per unit chip area by the present invention is very small. Electrons effectively travel in the bulk of the first semiconductor region without the influence of surface scattering or surface defects. In this way, the present invention improves the mobility of electrons, decreases on-resistance, and hastens a switching speed.

What is claimed is:

1. A semiconductor device comprising:
   a) a substrate having at least one main surface;
   b) a first semiconductor region formed on or in at least a part of the main surface of the substrate;
   c) a second semiconductor region serving as a first main electrode region formed in a part of the first semiconductor region;

d) a third semiconductor region serving as a second main electrode region formed apart from the second semiconductor region in a part of the first semiconductor region;

e) at least one gate trench formed in a part of the first semiconductor region between the second and third semiconductor regions from a main surface of first semiconductor region along a direction toward the substrate;

f) a gate insulating film formed on a side-wall of the gate trench; and g) a buried gate electrode buried in at least a part of a space defined by the gate insulating film in the gate trench, so as to form a channel between the second and third semiconductor regions and to directly control main currents conducting between the first and second main electrode regions a direction of the main currents flowing in the channel being substantially in parallel with the main surface of the first semiconductor region, the main currents being distributed vertically to the main surface of the first semiconductor region so as to allow a part of the main currents to move in a deep position of the channel.

2. A device of claim 1, further comprising a bottom insulation film formed between the bottom of the first semiconductor region and the main surface of the substrate.

3. A device of claim 1, wherein the substrate is an SOI substrate having an SOI insulation film and a semiconductor layer formed on the SOI insulation film, and the first semiconductor region is formed so that the bottom thereof is in contact with the SOI insulation film.

4. A device of claim 3, further comprising a device isolation region formed around the first semiconductor region up to the SOI insulation film.

5. A device of claim 4, wherein the device isolation region is a dielectric isolation region.

6. A device of claim 4, wherein the device isolation region is a pn junction isolation region.

7. A device of claim 4, wherein the device isolation region has a U shape having substantially vertical side-walls.

8. A device of claim 1, wherein the first semiconductor region is of a first conductivity type, and the substrate is of a second conductivity type.

9. A device of claim 8, further comprising a device isolation region formed around the first semiconductor region up to the bottom thereof.

10. A device of claim 9, wherein the device isolation region is a dielectric isolation region.

11. A device of claim 9, wherein the device isolation region is a pn junction isolation region.

12. A device of claim 9, wherein the device isolation region has a U shape having substantially vertical side-walls.

13. A device of claim 3, wherein the gate trench is in contact with the SOI insulation film.

14. A device of claim 8, wherein the gate trench passes through the first semiconductor region and reaches the substrate.

15. A device of claim 13, wherein the first semiconductor region is of a first conductivity type, and the second and third semiconductor regions are of the first conductivity type with a higher impurity concentration than that of the first semiconductor region.

16. A device of claim 13, wherein the first semiconductor region is of a first conductivity type, and the second and third semiconductor regions are of a second conductivity type.

17. A device of claim 13, wherein the first semiconductor region is of a first conductivity type, the second semiconductor region is of the first conductivity type with a higher impurity concentration than that of the first semiconductor region, and the third semiconductor region is of a second conductivity type.

18. A device of claim 15, further comprising a fourth semiconductor region of a second conductivity type formed between the second and third semiconductor regions up to the SOI insulation film.

19. A device of claim 15, further comprising a fourth semiconductor region of a second conductivity type at the top surface of and in said first semiconductor region, formed to contain the second semiconductor region.

20. A device of claim 17, further comprising a fourth semiconductor region of the second conductivity type formed between the second and third semiconductor regions up to the SOI insulation film.

21. A device of claim 17, further comprising a fourth semiconductor region of the second conductivity type at the main surface of and in said first semiconductor region, formed to contain the second semiconductor region.

22. A device of claim 20, further comprising a fifth semiconductor region of the first conductivity type formed between the fourth and third semiconductor regions.

23. A device of claim 21, further comprising a fifth semiconductor region of the first conductivity type formed between the fourth and third semiconductor regions.

24. A device of claim 15, wherein the second and third semiconductor regions are formed from the main surface of the first semiconductor region up to the SOI insulation film.

25. A device of claim 16, wherein the second and third semiconductor regions are formed from the main surface of the first semiconductor region up to the SOI insulation film.

26. A device of claim 17, wherein the second and third semiconductor regions are formed from the main surface of the first semiconductor region up to the SOI insulation film.

27. A device of claim 18, wherein the second and third semiconductor regions are formed from the main surface of the first semiconductor region up to the SOI insulation film.

28. A device of claim 19, wherein the third semiconductor region is formed from the main surface of the first semiconductor region up to the SOI insulation film.

29. A device of claim 20, wherein the second and third semiconductor regions are formed from the main surface of the first semiconductor region up to the SOI insulation film.

30. A device of claim 21, wherein the third semiconductor region is formed from the main surface of the first semiconductor region up to the SOI insulation film.

31. A device of claim 18, wherein the gate trench is in contact with the fourth semiconductor region, and the buried gate electrode is disposed in vicinity of the fourth semiconductor region, to control a current passing through the fourth semiconductor region.

32. A device of claim 19, wherein the gate trench is in contact with the fourth semiconductor region, and the buried gate electrode is disposed in vicinity of the fourth semiconductor region, to control a current passing through the fourth semiconductor region.

33. A device of claim 20, wherein the gate trench is in contact with the fourth semiconductor region, and the buried gate electrode is disposed in vicinity of the fourth semiconductor region, to control a current passing through the fourth semiconductor region.

34. A device of claim 21, wherein the gate trench is in contact with the fourth semiconductor region, and the buried gate electrode is disposed in vicinity of the fourth semiconductor region, to control a current passing through the fourth semiconductor region.

35. A device of claim 22, wherein the gate trench is in contact with the fourth semiconductor region, and the buried gate electrode is disposed in vicinity of the fourth semiconductor region, to control a current passing through the fourth semiconductor region.

36. A device of claim 23, wherein the gate trench is in contact with the fourth semiconductor region, and the buried gate electrode is disposed in vicinity of the fourth semiconductor region, to control a current passing through the fourth semiconductor region.

37. A device of claim 3, further comprising a fourth semiconductor region at the main surface of and in said first semiconductor region, containing the second semiconductor region, wherein the gate trench is in contact with the fourth semiconductor region, and the buried gate electrode is in vicinity of the fourth semiconductor region, to control a current passing through the fourth semiconductor region.

38. A device of claim 37, wherein the gate trench is deeper than the fourth semiconductor region.

39. A device of claim 14, wherein the first semiconductor region is of the first conductivity type, and the second and third semiconductor regions are of the first conductivity type with a higher impurity concentration than that of the first semiconductor region.

40. A device of claim 14, wherein the first semiconductor region is of the first conductivity type, and the second and third semiconductor regions are of the second conductivity type.

41. A device of claim 14, wherein the first semiconductor region is of the first conductivity type, the second semiconductor region is of the first conductivity type with a higher impurity concentration than that of the first semiconductor region, and the third semiconductor region is of the second conductivity type.

42. A device of claim 39, further comprising a fourth semiconductor region of the second conductivity type, formed between the second and third semiconductor regions up to the substrate.

43. A device of claim 39, further comprising a fourth semiconductor region of the second conductivity type at the main surface of and in said first semiconductor region, formed to contain the second semiconductor region.

44. A device of claim 41, further comprising a fourth semiconductor region of the second conductivity type, formed between the second and third semiconductor regions up to the substrate.

45. A device of claim 41, further comprising a fourth semiconductor region of the second conductivity type at the main surface of and in said first semiconductor region, formed to contain the second semiconductor region.

46. A device of claim 44, further comprising a fifth semiconductor region of the first conductivity type formed between the fourth and third semiconductor regions.

47. A device of claim 45, further comprising a fifth semiconductor region of the first conductivity type formed between the fourth and third semiconductor regions.

48. A device of claim 42, wherein the gate trench is in contact with the fourth semiconductor region, and the buried gate electrode is disposed in vicinity of the fourth semiconductor region, to control a current passing through the fourth semiconductor region.

49. A device of claim 43, wherein the gate trench is in contact with the fourth semiconductor region, and the buried gate electrode is disposed in vicinity of the fourth semiconductor region, to control a current passing through the fourth semiconductor region.

50. A device of claim 44, wherein the gate trench is in contact with the fourth semiconductor region, and the buried gate electrode is disposed in vicinity of the fourth semiconductor region, to control a current passing through the fourth semiconductor region.

51. A device of claim 45, wherein the gate trench is in contact with the fourth semiconductor region, and the buried gate electrode is disposed in vicinity of the fourth semiconductor region, to control a current passing through the fourth semiconductor region.

52. A device of claim 46, wherein the gate trench is in contact with the fourth semiconductor region, and the buried gate electrode is disposed in vicinity of the fourth semiconductor region, to control a current passing through the fourth semiconductor region.

53. A device of claim 47, wherein the gate trench is in contact with the fourth semiconductor region, and the buried gate electrode is disposed in vicinity of the fourth semiconductor region, to control a current passing through the fourth semiconductor region.

54. A device of claim 8, further comprising a fourth semiconductor region at the main surface of and in said first semiconductor region, containing the second semiconductor region, wherein the gate trench is in contact with the fourth semiconductor region, and the buried gate electrode is in the vicinity of the fourth semiconductor region, to control a current passing through the fourth semiconductor region.

55. A device of claim 54, wherein the gate trench is deeper than the fourth semiconductor region.

56. A device of claim 4, wherein the gate trench is at about a center of the first semiconductor region, a spacing $S_s$ between the gate trench and the device isolation region and an impurity concentration of the first semiconductor region are set such that a predetermined gate bias voltage applied to the buried gate electrode extends a depletion layer from the gate insulation film, to pinch off a channel formed in the first semiconductor region.

57. A device of claim 56, wherein the first, second, and third semiconductor regions, gate trench, gate insulation film, and buried gate electrode form a unit cell, and a plurality of the unit cells are arranged on the substrate.

58. A device of claim 57, wherein the unit cells have a same size respectively, and the second and third semiconductor regions and the buried gate electrode of a given unit cell are electrically connected to those of another unit cell, respectively.

59. A device of claim 9, wherein the gate trench is at about a center of the first semiconductor region, a spacing $S_s$ between the gate trench and the device isolation region and an impurity concentration of the first semiconductor region are set such that a predetermined gate bias voltage applied to the buried gate electrode extends a depletion layer from the gate insulation film, to pinch off a channel formed in the first semiconductor region.

60. A device of claim 59, wherein the first, second, and third semiconductor regions, gate trench, gate insulation film, and buried gate electrode form a unit cell, and a plurality of the unit cells are arranged on the substrate.

61. A device of claim 60, wherein the unit cells have a same size respectively, and the second and third semiconductor regions and the buried gate electrode of a given unit cell are electrically connected to those of another unit cell, respectively.

62. A device of claim 4, wherein a plurality of the gate trenches are formed in the first semiconductor region, a spacing S between adjacent ones of the gate trenches and an impurity concentration of the first semiconductor region are set such that a predetermined gate bias voltage applied to the buried gate electrodes extends depletion layers from the gate insulation films toward each other to pinch off a channel formed in the first semiconductor region.

63. A device of claim 9, wherein the first, second, and third semiconductor regions, gate trench, gate insulation film, and buried gate electrode form a unit cell, and a plurality of the unit cells are arranged on the substrate.

64. A device of claim 62, wherein a spacing Ss between the device isolation region and one of the gate trenches closest thereto is ½ of or narrower than the spacing S.

65. A device of claim 63, wherein a spacing Ss between the device isolation region and one of the gate trenches closest thereto is ½ of or narrower than a spacing S between adjacent ones of the gate trenches.

66. A device of claim 64, wherein the gate trench closest to the device isolation region is in contact with the device isolation region to satisfy a relation of Ss=0.

67. A device of claim 65, wherein the gate trench closest to the device isolation region is in contact with the device isolation region to satisfy a relation of Ss=0.

68. A device of claim 62, wherein a number of the gate trenches is at least three and they are arranged at regular spacings S.

69. A device of claim 63, wherein a number of the gate trenches is at least three and they are arranged at regular spacings S.

70. A device of claim 4, wherein a plurality of the gate trenches are formed in the first semiconductor regions at first and second spacings S1 and S2, the first spacing S1 and an impurity concentration of the first semiconductor region are set such that a predetermined gate bias voltage applied to the buried gate electrodes extends depletion layers from the gate insulation films toward each other, to pinch off a channel formed in the first semiconductor region, and S2>S1.

71. A device of claim 9, wherein a plurality of the gate trenches are formed in the first semiconductor regions at first and second spacings S1 and S2, the first spacing S1 and an impurity concentration of the first semiconductor region are set such that a predetermined gate bias voltage applied to the buried gate electrodes extends depletion layers from the gate insulation films toward each other, to pinch off a channel formed in the first semiconductor region, and S2>S1.

72. A device of claim 62, wherein the spacing S is chosen to pinch off a channel formed in the first semiconductor region in response to a zero bias voltage applied to the buried gate electrodes.

73. A device of claim 62, wherein the device isolation region is a pn junction isolation region whose conductivity type is opposite to that of the first semiconductor region, and a channel between the pn junction isolation region and one of the gate trenches closest thereto is pinched off in response to a zero bias voltage applied to the buried gate electrodes.

74. A device of claim 63, wherein the device isolation region is a pn junction isolation region whose conductivity type is opposite to that of the first semiconductor region, and a channel between the pn junction isolation region and one of the gate trenches closest thereto is pinched off in response to a zero bias voltage applied to the buried gate electrodes.

75. A device of claim 4, wherein at least one of the second and third semiconductor regions is in contact with the device isolation region.

76. A device of claim 9, wherein the second and third semiconductor regions are spaced from the device isolation region.

77. A device of claim 75, wherein at least one of the second and third semiconductor regions that is in contact with the device isolation region is formed from the main surface of the first semiconductor region up to the SOI insulation film.

78. A device of claim 77, wherein the semiconductor region formed up to the SOI insulation film is formed in the first semiconductor region by horizontally diffusing impurities from the side-walls of a trench used to form the device isolation region.

79. A device of claim 13, wherein the gate trench is in contact with the second semiconductor region.

80. A device of claim 14, wherein the gate trench is in contact with the second semiconductor region.

81. A device of claim 13, wherein the gate trench is in contact with both the second and third semiconductor regions.

82. A device of claim 14, wherein the gate trench is in contact with both the second and third semiconductor regions.

83. A device of claim 13, wherein the gate trench is asymmetrically arranged in the first semiconductor region and biased to the second semiconductor region.

84. A device of claim 14, wherein the gate trench is asymmetrically arranged in the first semiconductor region and biased to the second semiconductor region.

85. A device of claim 13, wherein a plurality of the gate trenches are arranged in a zigzag pattern in the first semiconductor region.

86. A device of claim 14, wherein a plurality of the gate trenches are arranged in a zigzag pattern in the first semiconductor region.

87. A device of claim 13, wherein the buried gate electrode completely fills the gate trench.

88. A device of claim 14, wherein the buried gate electrode completely fills the gate trench.

89. A device of claim 13, wherein the buried gate electrode is divided into sections in the gate trench.

90. A device of claim 14, wherein the buried gate electrode is divided into sections in the gate trench.

91. A device of claim 89, further comprising insulation material filled in gaps among the sections of the buried gate electrode.

92. A device of claim 90, further comprising insulation material filled in gaps among the sections of the buried gate electrode.

93. A device of claim 91, further comprising gate resistors for connecting the sections of the buried gate electrode to one another.

94. A device of claim 92, further comprising gate resistors for connecting the sections of the buried gate electrode to one another.

95. A device of claim 85, further comprising gate resistors for connecting the buried gate electrodes to one another.

96. A device of claim 86, further comprising gate resistors for connecting the buried gate electrodes to one another.

97. A device of claim 19, wherein the device isolation region formed around the first semiconductor region has a V shape.

98. A device of claim 21, wherein the device isolation region formed around the first semiconductor region has a V shape.

99. A device of claim 23, wherein the device isolation region formed around the first semiconductor region has a V shape.

100. A device of claim 43, wherein the device isolation region formed around the first semiconductor region has a V shape.

101. A device of claim 45, wherein the device isolation region formed around the first semiconductor region has a V shape.

102. A device of claim 47, wherein the device isolation region formed around the first semiconductor region has a V shape.

103. A device of claim 20, further comprising a fifth semiconductor region of the first conductivity type formed adjacent to the third semiconductor region.

104. A device of claim 44, further comprising a fifth semiconductor region of the first conductivity type formed adjacent to the third semiconductor region.

105. A device of claim 103, further comprising:
a second gate trench formed in contact with the third and fifth semiconductor regions;
a second gate insulation film formed on side-walls of the second gate trench; and
a buried gate electrode burying at least a part of a space defined by the second gate insulation film in the second gate trench.

106. A device of claim 104, further comprising:
a second gate trench formed in contact with the third and fifth semiconductor regions;
a second gate insulation film formed on side-walls of the second gate trench; and
a buried gate electrode burying at least a part of a space defined by the second gate insulation film in the second gate trench.

107. A device of claim 105, wherein the second gate trench reaches the SOI insulation film.

108. A device of claim 106, wherein the second gate trench reaches the SOI insulation film.

109. A device of claim 17, wherein a spacing $S_E$ between adjacent gate trenches in vicinity of the second semiconductor region differs from a spacing $S_C$ between the same trenches in vicinity of the third semiconductor region.

110. A device of claim 20, wherein a spacing $S_E$ between adjacent gate trenches in vicinity of the second semiconductor region differs from a spacing $S_C$ between the same trenches in vicinity of the third semiconductor region.

111. A device of claim 22, wherein a spacing $S_E$ between adjacent gate trenches in vicinity of the second semiconductor region differs from a spacing $S_C$ between the same trenches in the vicinity of the third semiconductor region.

112. A device of claim 23, wherein a spacing $S_E$ between adjacent gate trenches in vicinity of the second semiconductor region differs from a spacing $S_C$ between the same trenches in vicinity of the third semiconductor region.

113. A device of claim 41, wherein a spacing $S_E$ between adjacent gate trenches in vicinity of the second semiconductor region differs from a spacing $S_C$ between the same trenches in vicinity of the third semiconductor region.

114. A device of claim 44, wherein a spacing $S_E$ between adjacent gate trenches in vicinity of the second semiconductor region differs from a spacing $S_C$ between the same trenches in vicinity of the third semiconductor region.

115. A device of claim 46, wherein a spacing $S_E$ between adjacent gate trenches in vicinity of the second semiconductor region differs from a spacing $S_C$ between the same trenches in vicinity of the third semiconductor region.

116. A device of claim 47, wherein a spacing $S_E$ between adjacent gate trenches in vicinity of the second semiconductor region differs from a spacing $S_C$ between the same trenches in vicinity of the third semiconductor region.

117. A device of one of claims 109 to 116, wherein $S_E > S_C$.

118. A device of one of claims 109 to 116, wherein the spacing $S_C$ is smaller than 5 $\mu$m.

119. A device of one of claims 20, 22, 23, 44, 46, and 47, further comprising a surface electrode for connecting the second and fourth semiconductor regions to each other.

120. A device of one of claims 22, 23, 46, 47, and 103 to 107, further comprising a surface electrode for connecting the third and fifth semiconductor regions to each other.

121. A device of claim 20, further comprising:
a fifth semiconductor region of the second conductivity type formed in contact with the second semiconductor region; and
a surface electrode for connecting the second and fifth semiconductor regions to each other,
the gate trenches being in contact with the first, fourth, and fifth semiconductor regions, the fourth semiconductor region consisting of a pair of areas sandwiching a part of the first semiconductor region to form a channel for passing the main current.

122. A device of claim 44, further comprising:
a fifth semiconductor region of the second conductivity type formed in contact with the second semiconductor region; and
a surface electrode for connecting the second and fifth semiconductor regions to each other,
the gate trenches being in contact with the first, fourth, and fifth semiconductor regions, the fourth semiconductor region consisting of a pair of areas sandwiching a part of the first semiconductor region to form a channel for passing the main current.

123. A device of claim 121 or 122, wherein a spacing between the pair of areas of the fourth semiconductor region and an impurity concentration of the first semiconductor region are set such that a zero bias voltage applied to the buried gate electrodes extends depletion layers from the pair of areas of the fourth semiconductor region, to pinch off a channel formed in the first semiconductor region.

124. A device of claim 121 or 122, further comprising a sixth semiconductor region of the first conductivity type formed between the fourth and fifth semiconductor regions, having higher impurity concentration than that of the first semiconductor region.

125. A device of claim 124, further comprising:
a second gate insulation film formed on the sixth semiconductor region; and
a surface gate electrode formed on the second gate insulation film and electrically connected to the buried gate electrodes.

126. A device of claim 20, further comprising:
a fifth semiconductor region of the second conductivity type formed in vicinity of the main surface of the first semiconductor region in contact with the second semiconductor region;
a sixth semiconductor region of the first conductivity type formed between the second and fourth semiconductor regions in contact with the fifth semiconductor region; and
a surface metal electrode for connecting the second and fifth semiconductor regions to each other,
the gate trenches being in contact with the fourth and sixth semiconductor regions.

127. A device of claim 44, further comprising:
a fifth semiconductor region of the second conductivity type formed in vicinity of the main surface of the first semiconductor region in contact with the second semiconductor region;
a sixth semiconductor region of the first conductivity type formed between the second and fourth semiconductor regions in contact with the fifth semiconductor region; and
a surface metal electrode for connecting the second and fifth semiconductor regions to each other, the gate trenches being in contact with the fourth and sixth semiconductor regions.

128. A device of claim 20, further comprising:

a fifth semiconductor region of the first conductivity type formed in vicinity of the fourth semiconductor region away from the second semiconductor region;

a sixth semiconductor region of the second conductivity type having a higher impurity concentration than that of the fourth semiconductor region, formed in contact with the fifth semiconductor region in vicinity of an interface between the first and fourth semiconductor regions; and a surface metal electrode for connecting the fifth and sixth semiconductor regions to each other, the gate trenches being in contact with the fourth semiconductor region between the second and fifth semiconductor regions.

129. A device of claim 44, further comprising:

a fifth semiconductor region of the first conductivity type formed in vicinity of the fourth semiconductor region away from the second semiconductor region;

a sixth semiconductor region of the second conductivity type having a higher impurity concentration than that of the fourth semiconductor region, formed in contact with the fifth semiconductor region in vicinity of an interface between the first and fourth semiconductor regions; and a surface metal electrode for connecting the fifth and sixth semiconductor regions to each other, the gate trenches being in contact with the fourth semiconductor region between the second and fifth semiconductor regions.

130. A device of one of claims 20 to 23 and 44 to 47, wherein the gate trench has a comb-like shape so that teeth of the comb-like shape divide the second and fourth semiconductor regions into sections, and each section of the fourth semiconductor region forms a channel for passing the main current.

131. A device of claim 130, wherein a plurality of unit cells each consisting of at least the gate trench and first to fourth semiconductor regions are arranged on the substrate.

132. A device of claim 131, wherein the unit cells are connected in parallel with one another through surface wiring.

133. A device of claim 131, wherein the unit cells are connected in series with one another through surface wiring.

134. A device of one of claims 20 to 23 and 44 to 47, wherein the gate trenches are in contact with the fourth semiconductor region, to form channels for passing the main current in the fourth semiconductor region, and a width (Wg) of each gate trench is greater than a spacing S between the adjacent ones of the gate trenches.

135. A device of one of claims 20 to 23 and 44 to 47, wherein the gate trench has a winding shape regularly involving right-angled parts, to divide the fourth semiconductor region into sections that form channels for passing the main current.

136. A device of claim 135, wherein the winding gate trench partly divides the second and fourth semiconductor regions into inactive sections that are electrically floating, and remaining parts of the second and fourth semiconductor regions are used as active regions by connecting them together through a surface metal electrode.

137. A device of one of claims 20 to 23 and 44 to 47, wherein a plurality of the gate trenches are formed adjacent to the fourth semiconductor region, to divide the fourth semiconductor region into sections to form channels for passing the main current, and a plurality of unit cells each consisting of the first to fourth semiconductor regions and the gate trenches are arranged on the substrate.

138. A device of claim 137, wherein the unit cells are connected in series with one another through surface wiring.

139. A device of claim 137, wherein the unit cells are connected in parallel with one another through surface wiring.

140. A semiconductor device comprising;

a) a substrate having at least one main surface;

b) a first semiconductor region formed on or in at least a part of the main surface of the substrate and having a main surface that is substantially in parallel with the main surface of the substrate;

c) a second semiconductor region serving as a first main electrode region formed in a part of the first semiconductor region;

d) a third semiconductor region serving as a second main electrode region formed apart from the second semiconductor region in a part of the first semiconductor region;

e) at least one gate trench formed in a part of the first semiconductor regions and having side-walls substantially vertical to the main surface of the first semiconductor region;

f) a fourth semiconductor region formed on the side-walls of the gate trench and having a larger forbidden band gap than that of the first semiconductor region; and g) a buried gate electrode buried in at least a part of a space defined by the fourth semiconductor region in the gate trench, wherein when the first and second main electrode regions passing a main current between them, a direction of the main current is substantially in parallel with the main surface of the first semiconductor region in vicinity of the buried gate electrode that controls the main current, the main current being distributed vertically with respect to the main surface of the first semiconductor region.

141. A device of claim 140, wherein the substrate is a semi-insulating semiconductor substrate.

142. A device of claim 141, wherein the first semiconductor region is surrounded by a device isolation region.

143. A device of claim 142, wherein the device isolation region is a high-resistivity semiconductor region.

144. A device of claim 142, wherein the device isolation region is a dielectric isolation region made of insulating dielectric material.

145. A device of claim 140, wherein the first to fourth semiconductor regions are each a compound semiconductor region.

146. A device of claim 145, wherein the first semiconductor region is made of GaAs, and the fourth semiconductor region is made of AlGaAs.

147. A device of claim 145, further comprising a fifth semiconductor region formed between the first and fourth semiconductor regions and having a smaller forbidden band gap than that of the fourth semiconductor region.

148. A device of claim 147, wherein the first semiconductor region is made of GaAs, the fourth semiconductor region of AlGaAs, and the fifth semiconductor region of InGaAs.

149. A device of claim 147, wherein the first semiconductor region is made of InP, the fourth semiconductor region of InAlAs, and the fifth semiconductor region of InGaAs.

150. A semiconductor device having first and a second main electrode regions formed in a semiconductor region, a control electrode for controlling main currents flowing between the first and second main electrode regions, and a trench formed in the semiconductor region so that a space defined by the trench forms a channel directed along a horizontal direction for passing the main currents so that the main currents in the channel flow in parallel with a main surface of the semiconductor region and are distributed vertically with respect to the main surface of the semiconductor region so as to allow a part of the main currents to move in a deep position of the channel.

151. A device of claim 150, wherein the semiconductor device is an insulated-gate semiconductor device.

152. A device of claim 151, wherein the semiconductor device is a MOSFET.

153. A device of claim 151, wherein the semiconductor device is a MOSSIT.

154. A device of claim 151, wherein the semiconductor device is an IGBT.

155. A device of claim 151, wherein the semiconductor device is a composite MOS device.

156. A device of claim 155, wherein the composite MOS device is an MCSITH.

157. A device of claim 155, wherein the composite MOS device is an MCT.

158. A device of claim 155, wherein the composite MOS device is an EST.

159. A device of claim 150, wherein the semiconductor device is an HEMT.

160. A semiconductor device having a channel region directed along a horizontal direction for passing a main currents conducting between first and second main electrode regions, wherein a geometrical configuration of the channel region is defined by a couple of depletion layers so that the main currents in the channel region flow horizontally in parallel with a main surface of a first semiconductor region of a first conductivity type in which the depletion layers are formed and are distributed vertically to the main surface of the first semiconductor region so as to allow a part of the main currents to move in a deep position of the channel.

161. A device of claim 160, wherein the depletion layers are each formed by a gate insulation film formed on sidewalls of a trench formed in a part of the main surface of the first semiconductor region and by a gate electrode formed on a surface of the gate insulation film.

162. A device of claim 160, wherein the depletion layers are each formed by a pn junction between the first semiconductor region and a second semiconductor region that has a second conductivity type and a metallurgical interface of the pn junction is vertically formed relative to the main surface of the first semiconductor region.

163. A device of claim 160, wherein the depletion layers are each formed by a Schottky junction between the first semiconductor region and a Schottky metal that is buried in a trench formed in a part of the main surface of the first semiconductor region.

164. A device of claim 1, wherein said side-wall of the gate trench is substantially vertical to the main surface of first semiconductor region.

165. A device of claim 1, wherein said channel is arranged along a direction of parallel with a substantially shortest direction between the second and third semiconductor regions.

166. A device of claim 150, wherein parts of said first and second main electrode regions which define the direction of said channel are disposed laterally in the semiconductor region.

167. A device of claim 166, wherein said first and second main electrode regions are disposed at a substantially same horizontal level.

168. A device of claim 160, wherein parts of said first and second main electrode regions which define the direction of said channel are disposed laterally in the first semiconductor region.

169. A device of claim 168, wherein said first and second main electrode regions are disposed at a substantially same horizontal level.

* * * * *